United States Patent
Ishimaru et al.

(10) Patent No.: US 11,349,033 B2
(45) Date of Patent: May 31, 2022

(54) SEMICONDUCTOR DEVICE AND SEMICONDUCTOR MEMORY DEVICE

(71) Applicant: Kioxia Corporation, Tokyo (JP)

(72) Inventors: Tomoki Ishimaru, Yokkaichi (JP); Shinji Mori, Nagoya (JP); Kazuhiro Matsuo, Kuwana (JP); Keiichi Sawa, Yokkaichi (JP); Akifumi Gawase, Kuwana (JP)

(73) Assignee: Kioxia Corporation, Tokyo (JP)

( * ) Notice: Subject to any disclaimer, the term of this patent is extended or adjusted under 35 U.S.C. 154(b) by 79 days.

(21) Appl. No.: 17/022,328

(22) Filed: Sep. 16, 2020

(65) Prior Publication Data

US 2021/0305431 A1    Sep. 30, 2021

(30) Foreign Application Priority Data

Mar. 24, 2020    (JP) .............................. JP2020-052249

(51) Int. Cl.
  *H01L 29/786*    (2006.01)
  *H01L 27/108*    (2006.01)
  (Continued)

(52) U.S. Cl.
  CPC ...... *H01L 29/7869* (2013.01); *H01L 27/1082* (2013.01); *H01L 27/10814* (2013.01);
  (Continued)

(58) Field of Classification Search
  None
  See application file for complete search history.

(56) References Cited

U.S. PATENT DOCUMENTS 6,377,070 B1 *    4/2002    Forbes .................. H01L 27/115
                                                  326/41
7,919,365 B2    4/2011    Kim et al.
(Continued)

FOREIGN PATENT DOCUMENTS

JP    2013-138189 A    7/2013
JP    5325446 B2    10/2013
(Continued)

*Primary Examiner* — Anthony Ho
*Assistant Examiner* — Kevin Quinto
(74) *Attorney, Agent, or Firm* — Oblon, McClelland, Maier & Neustadt, L.L.P.

(57) ABSTRACT

A semiconductor device of an embodiment includes a first electrode, a second electrode, a first metallic region provided between the first electrode and the second electrode and includes at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn), a second metallic region provided between the first metallic region and the second electrode and includes the at least one metallic element, a semiconductor region provided between the first metallic region and the second metallic region and includes the at least one metallic element and oxygen (O), an insulating region provided between the first metallic region and the second metallic region and is surrounded by the semiconductor region, a gate electrode surrounding the semiconductor region, and a gate insulating layer provided between the semiconductor region and the gate electrode.

20 Claims, 68 Drawing Sheets

(51) Int. Cl.
  *H01L 29/267* (2006.01)
  *H01L 29/08* (2006.01)
  *H01L 29/417* (2006.01)
  *H01L 29/40* (2006.01)
(52) U.S. Cl.
  CPC .. *H01L 27/10855* (2013.01); *H01L 27/10858* (2013.01); *H01L 27/10873* (2013.01); *H01L 29/0847* (2013.01); *H01L 29/267* (2013.01); *H01L 29/401* (2013.01); *H01L 29/41775* (2013.01)

(56) References Cited

U.S. PATENT DOCUMENTS

| | | | |
|---|---|---|---|
| 7,977,675 | B2 | 7/2011 | Kawamura et al. |
| 8,816,425 | B2 | 8/2014 | Yamazaki |
| 8,969,867 | B2 | 3/2015 | Yamazaki et al. |
| 9,577,110 | B2 | 2/2017 | Koezuka et al. |
| 9,698,272 | B1 | 7/2017 | Ikeda et al. |
| 9,768,317 | B2 | 9/2017 | Ito et al. |
| 2007/0241327 | A1 | 10/2007 | Kim et al. |
| 2013/0137232 | A1 | 5/2013 | Ito et al. |
| 2016/0093745 | A1 | 3/2016 | Diaz et al. |
| 2018/0026921 | A1 | 1/2018 | Tezuka et al. |
| 2019/0273125 | A1 | 9/2019 | Takechi |
| 2019/0296155 | A1 | 9/2019 | Sawabe et al. |
| 2019/0371911 | A1 | 12/2019 | Miao et al. |
| 2020/0013892 | A1 | 1/2020 | Kataoka et al. |
| 2021/0202485 | A1 | 7/2021 | Inaba |

FOREIGN PATENT DOCUMENTS

| | | |
|---|---|---|
| JP | 2014-150481 A | 8/2014 |
| JP | 2016-111369 A | 6/2016 |
| JP | 2017-022423 A | 1/2017 |
| JP | 6267281 B2 | 1/2018 |
| JP | 2018-157205 A | 10/2018 |
| JP | 2019-096856 A | 6/2019 |
| JP | 6529759 B2 | 6/2019 |
| JP | 6538598 B2 | 7/2019 |
| JP | 6542335 B2 | 7/2019 |
| JP | 2019-153569 A | 9/2019 |
| JP | 6584157 B2 | 10/2019 |
| JP | 2020-009911 A | 1/2020 |
| JP | 2021-108331 A | 7/2021 |
| TW | 201613090 A | 4/2016 |

* cited by examiner

SEMICONDUCTOR DEVICE AND SEMICONDUCTOR MEMORY DEVICE

CROSS-REFERENCE TO RELATED APPLICATION

This application is based upon and claims the benefit of priority from Japanese Patent Application No. 2020-052249, filed on Mar. 24, 2020, the entire contents of which are incorporated herein by reference.

FIELD

Embodiments described herein relate generally to a semiconductor device and a semiconductor memory device.

BACKGROUND

An oxide semiconductor transistor in which a channel is formed in an oxide semiconductor layer has an excellent property of having an extremely small channel leakage current, in other words, an extremely small off-leakage current, during off-operation. To apply such an oxide semiconductor transistor to a transistor of a memory device, further reduction of off-leakage current and reduction of on-resistance are desired.

DETAILED DESCRIPTION

Figure 1:
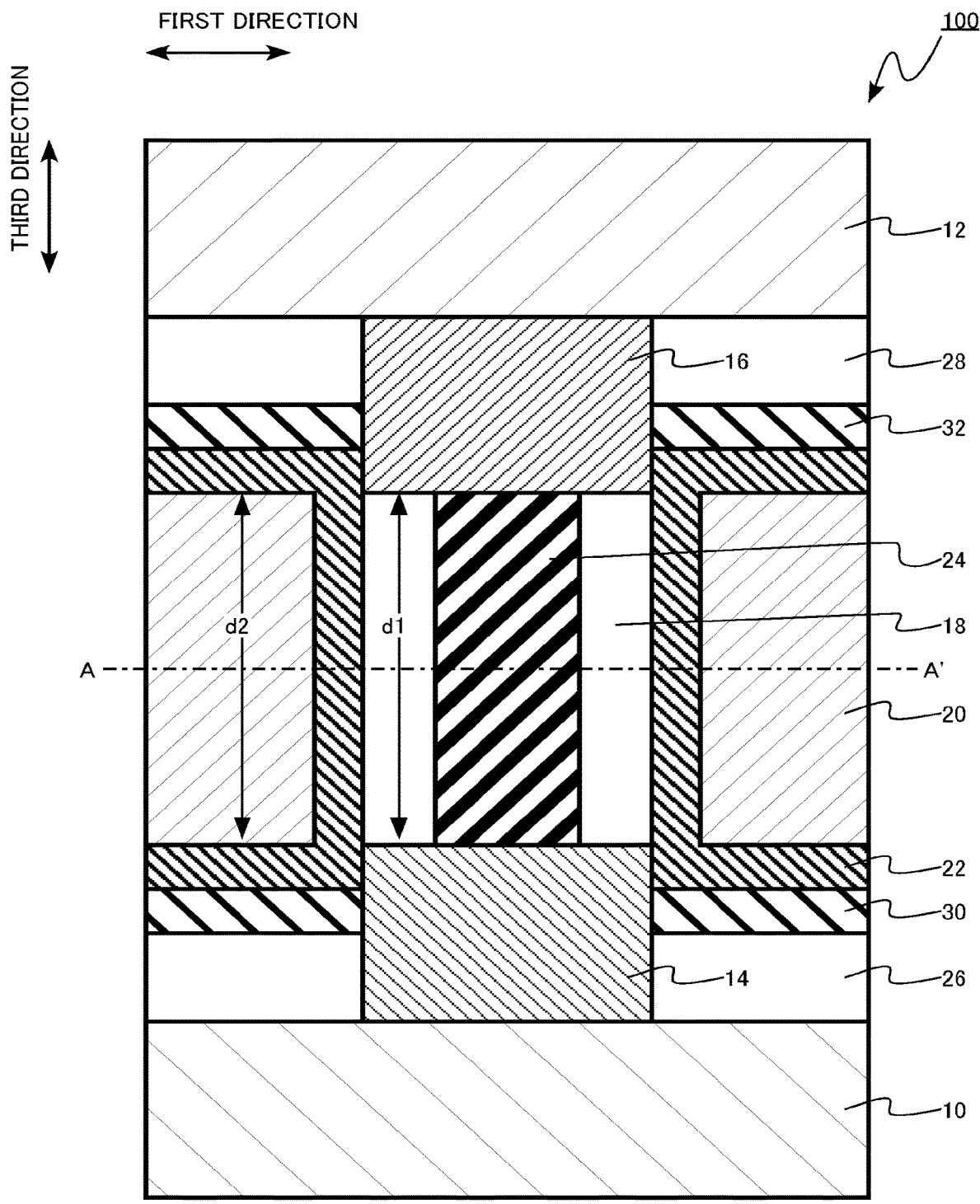
FIG. 1 is a schematic sectional view of a semiconductor device of a first embodiment.

A semiconductor device of an embodiment includes a first electrode, a second electrode, a first metallic region provided between the first electrode and the second electrode, the first metallic region including at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn), a second metallic region provided between the first metallic region and the second electrode, the second metallic region including the at least one metallic element, a semiconductor region provided between the first metallic region and the second metallic region, the semiconductor region including the at least one metallic element and oxygen (O), an insulating region provided between the first metallic region and the second metallic region, the insulating region being surrounded by the semiconductor region, a gate electrode surrounding the semiconductor region, and a gate insulating layer provided between the semiconductor region and the gate electrode.

Hereinafter, embodiments of the present disclosure will be described with reference to the drawings. Note that the same or similar components or the like are denoted by the same reference signs, and explanation of components or the like that have been explained once is omitted if appropriate, in the following description.

Further, the present specification uses the term "upper (or above)" or "lower (or below)" in some portions for convenience's sake. The term "upper (or above)" or "lower (or below)" indicates a positional relationship relative to components in the drawings merely, and does not define a positional relationship according to gravity.

Qualitative analysis or quantitative analysis of a chemical composition of each component forming a semiconductor device and a semiconductor memory device in the present specification can be achieved by secondary ion mass spectrometry (SIMS), energy dispersive X-ray spectroscopy (EDX), or Rutherford back-scattering spectroscopy (RBS), for example. Further, the thickness of each component forming the semiconductor device and the semiconductor memory device, a distance between the components, and the like can be measured with a transmission electron microscope (TEM), for example. Moreover, the electrical resistance of each component forming the semiconductor device and the semiconductor memory device can be measured by scanning spreading resistance microscopy (SSRM), for example.

First Embodiment

A semiconductor device of a first embodiment includes a first electrode, a second electrode, a first metallic region provided between the first electrode and the second electrode, the first metallic region including at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn), a second metallic region provided between the first metallic region and the second electrode, the second metallic region including the at least one metallic element, a semiconductor region provided between the first metallic region and the second metallic region, the semiconductor region including the at least one metallic element and oxygen (O), an insulating region provided between the first metallic region and the second metallic region, the insulating region being surrounded by the semiconductor region, a gate electrode surrounding the semiconductor region, and a gate insulating layer provided between the semiconductor region and the gate electrode.

Figure 2:
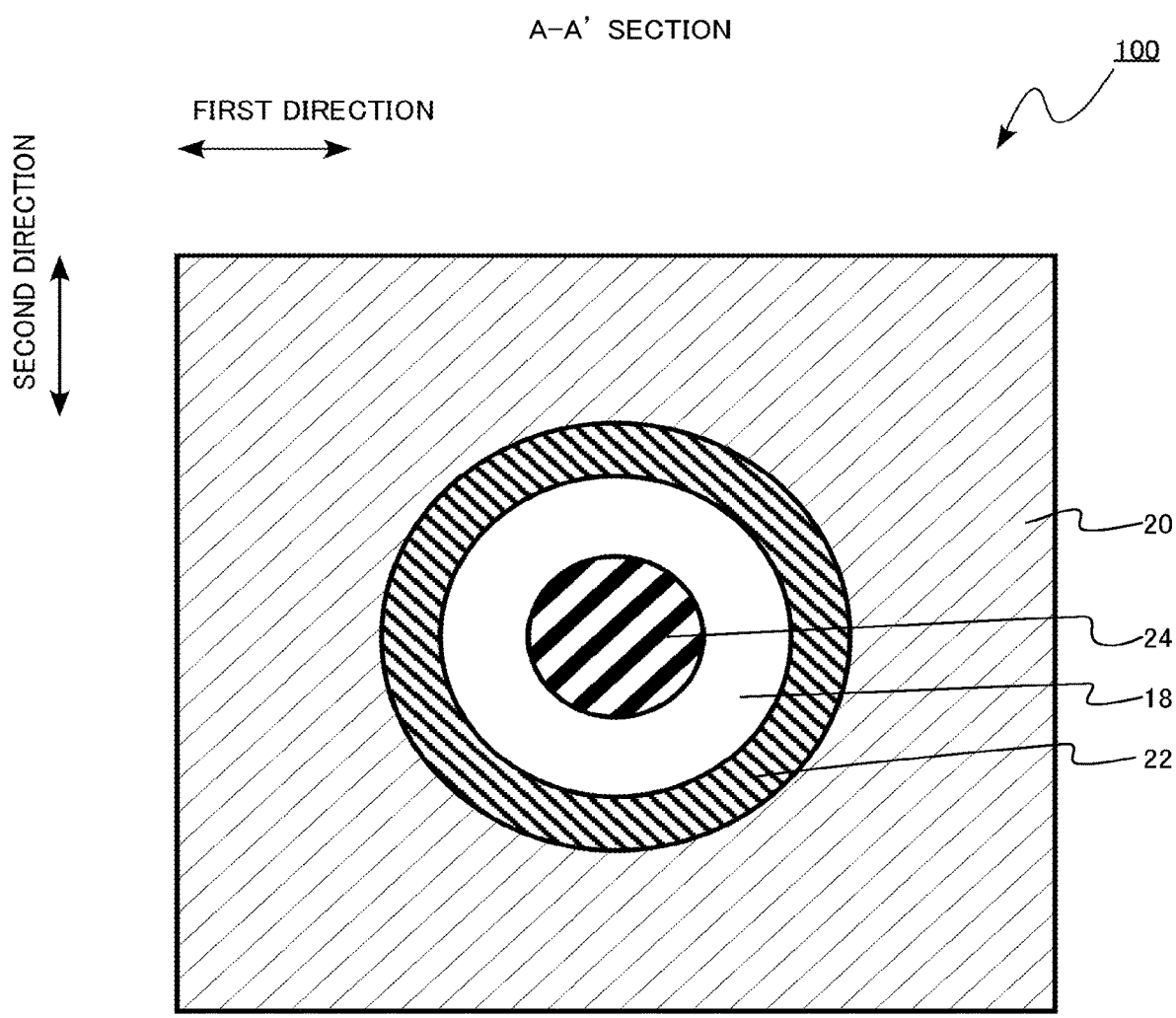
FIG. 2 is a schematic sectional view of the semiconductor device of the first embodiment.

FIGS. 1 and 2 are schematic sectional views of the semiconductor device of the first embodiment. FIG. 2 is a sectional view taken along A-A' in FIG. 1. In FIG. 2, a horizontal direction is referred to as a first direction, a depth direction is referred to as a second direction, and a vertical direction is referred to as a third direction.

The semiconductor device of the first embodiment is a transistor 100. The transistor 100 is an oxide semiconductor transistor in which a channel is formed in an oxide semiconductor. In the transistor 100, a gate electrode is provided so as to surround an oxide semiconductor in which a channel is formed. The transistor 100 is a so-called surrounding gate transistor (SGT). The transistor 100 is a so-called vertical transistor.

The transistor 100 includes a source electrode 10, a drain electrode 12, a source region 14, a drain region 16, a channel region 18, agate electrode 20, a gate insulating layer 22, a core insulating region 24, a first interlayer insulating layer 26, a second interlayer insulating layer 28, a first protective insulating layer 30, and a second protective insulating layer 32.

The source electrode 10 is one example of the first electrode. The drain electrode 12 is one example of the second electrode. The source region 14 is one example of the first metallic region. The drain region 16 is one example of the second metallic region. The channel region 18 is one example of the semiconductor region. The core insulating region 24 is one example of the insulating region.

The source electrode 10 is a metal or a metallic compound, for example. The source electrode 10 is tungsten (W), for example.

The drain electrode 12 is a metal or a metallic compound, for example. The drain electrode 12 is tungsten (W), for example.

The source region 14 is provided between the source electrode 10 and the drain electrode 12. The source region 14 and the source electrode 10 are in contact with each other. The source region 14 and the source electrode 10 are electrically connected.

The source region 14 is a metal. The source region 14 is a metal of which oxide acts as a semiconductor. The source region 14 includes at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn).

The drain region 16 is provided between the source region 14 and the drain electrode 12. The drain region 16 is in contact with the drain electrode 12. The drain region 16 is electrically connected to the drain electrode 12.

The drain region 16 is a metal. The drain region 16 is a metal of which oxide acts as a semiconductor. The drain region 16 includes at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn).

The drain region 16 is formed of the same metal as that forming the source region 14. The drain region 16 includes the same metallic element as that included in the source region 14.

The channel region 18 is provided between the source region 14 and the drain region 16. The channel region 18 is in contact with the source region 14 and the drain region 16.

In the channel region 18, a channel serving as a current path during on-operation of the transistor 100 is formed. The channel region 18 extends along a direction toward the drain electrode 12 from the source electrode 10, that is, along the third direction. During on-operation of the transistor 100, a current flows along the third direction in the channel region 18.

The channel region 18 is tube-shaped, for example.

A length of the channel region 18 along a direction toward the drain electrode 12 from the source electrode 10, in other words, a length of the channel region 18 along the third direction, is equal to a distance (d1 in FIG. 1) between the source region 14 and the drain region 16 along the third direction. The distance d1 is equal to or larger than 20 nm and is equal to or smaller than 100 nm, for example.

The channel region 18 is an oxide semiconductor. The channel region 18 includes at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn), and oxygen (O).

The channel region 18 is an oxide of a metal forming the source region 14 and the drain region 16. The channel region 18 includes the same metallic element as that included in the source region 14 and the drain region 16. The channel region 18 is amorphous, for example.

The source region 14 and the drain region 16 include indium (In), gallium (Ga), and zinc (Zn), for example. The channel region 18 includes indium (In), gallium (Ga), zinc (Zn), and oxygen (O), for example.

The atomic ratio of a sum of indium, gallium, and zinc in metallic elements included in the source region 14 and the drain region 16 is, for example, 90% or higher. For example, the source region 14 and the drain region 16 do not include any element that has a higher atomic ratio than any of indium, gallium, and zinc.

The atomic ratio of a sum of indium, gallium, and zinc in metallic elements included in the channel region 18 is, for example, 90% or higher. The atomic ratio of a sum of indium, gallium, and zinc in elements included in the channel region 18 except oxygen, is, for example, 90% or higher. For example, the channel region 18 does not include any element that has a higher atomic ratio than any of indium, gallium, and zinc, except oxygen.

The gate electrode 20 is provided so as to surround the channel region 18. The gate electrode 20 is provided around the channel region 18.

The gate electrode 20 is a metal, a metallic compound, or a semiconductor, for example. The gate electrode 20 is tungsten (W), for example. A length (d2 in FIG. 1) of the gate electrode 20 along the third direction is equal to or larger than 20 nm and is equal to or smaller than 100 nm, for example. The length d2 of the gate electrode 20 along the third direction is the gate length of the transistor 100.

The distance d1 between the source region 14 and the drain region 16 along the third direction is equal to the length d2 of the gate electrode 20 along the third direction, for example.

The gate electrode 20 is a metal, a metallic compound, or a semiconductor, for example. The gate electrode 20 is tungsten (W), for example.

The gate insulating layer 22 is provided between the channel region 18 and the gate electrode 20. The gate insulating layer 22 is provided so as to surround the channel region 18.

The gate insulating layer 22 is an oxide or an oxynitride, for example. The gate insulating layer 22 is silicon oxide or aluminum oxide, for example. The gate insulating layer 22 has a thickness equal to or larger than 2 nm and is equal to or smaller than 10 nm, for example.

The core insulating region 24 is provided between the source region 14 and the drain region 16. The core insulating region 24 is surrounded by the channel region 18. The core insulating region 24 is cylindrical, for example. The core insulating region 24 and the source electrode 10 are spaced apart from each other. The core insulating region 24 and the drain electrode 12 are spaced apart from each other.

The core insulating region 24 is an oxide, a nitride, or an oxynitride, for example. The core insulating region 24 is silicon oxide, silicon nitride, or silicon oxynitride, for example.

The first interlayer insulating layer 26 is provided between the source electrode 10 and the gate electrode 20. The first interlayer insulating layer 26 is provided around the source region 14.

The first interlayer insulating layer 26 is an oxide, a nitride, or an oxynitride, for example. The first interlayer insulating layer 26 is silicon oxide, for example.

The second interlayer insulating layer 28 is provided between the drain electrode 12 and the gate electrode 20. The second interlayer insulating layer 28 is provided around the drain region 16.

The second interlayer insulating layer 28 is an oxide, a nitride, or an oxynitride, for example. The second interlayer insulating layer 28 is silicon oxide, for example.

The first protective insulating layer 30 is provided between the first interlayer insulating layer 26 and the gate electrode 20. The first protective insulating layer 30 is provided around the source region 14.

The first protective insulating layer 30 is an oxide, a nitride, or an oxynitride, for example. The first protective insulating layer 30 is formed of a material different from that forming the first interlayer insulating layer 26, for example. The first protective insulating layer 30 is silicon nitride, for example.

The second protective insulating layer 32 is provided between the second interlayer insulating layer 28 and the gate electrode 20. The second protective insulating layer 32 is provided around the drain region 16.

The second protective insulating layer 32 is an oxide, a nitride, or an oxynitride, for example. The second protective insulating layer 32 is formed of a material different from that forming the second interlayer insulating layer 28, for example. The second protective insulating layer 32 is silicon nitride, for example.

Next, an example of a semiconductor-device manufacturing method of the first embodiment will be described.

FIGS. 3 to 16 are schematic sectional views illustrating the semiconductor-device manufacturing method of the first embodiment. FIGS. 3 to 16 illustrate sections corresponding to the section illustrated in FIG. 1.

Figure 3:
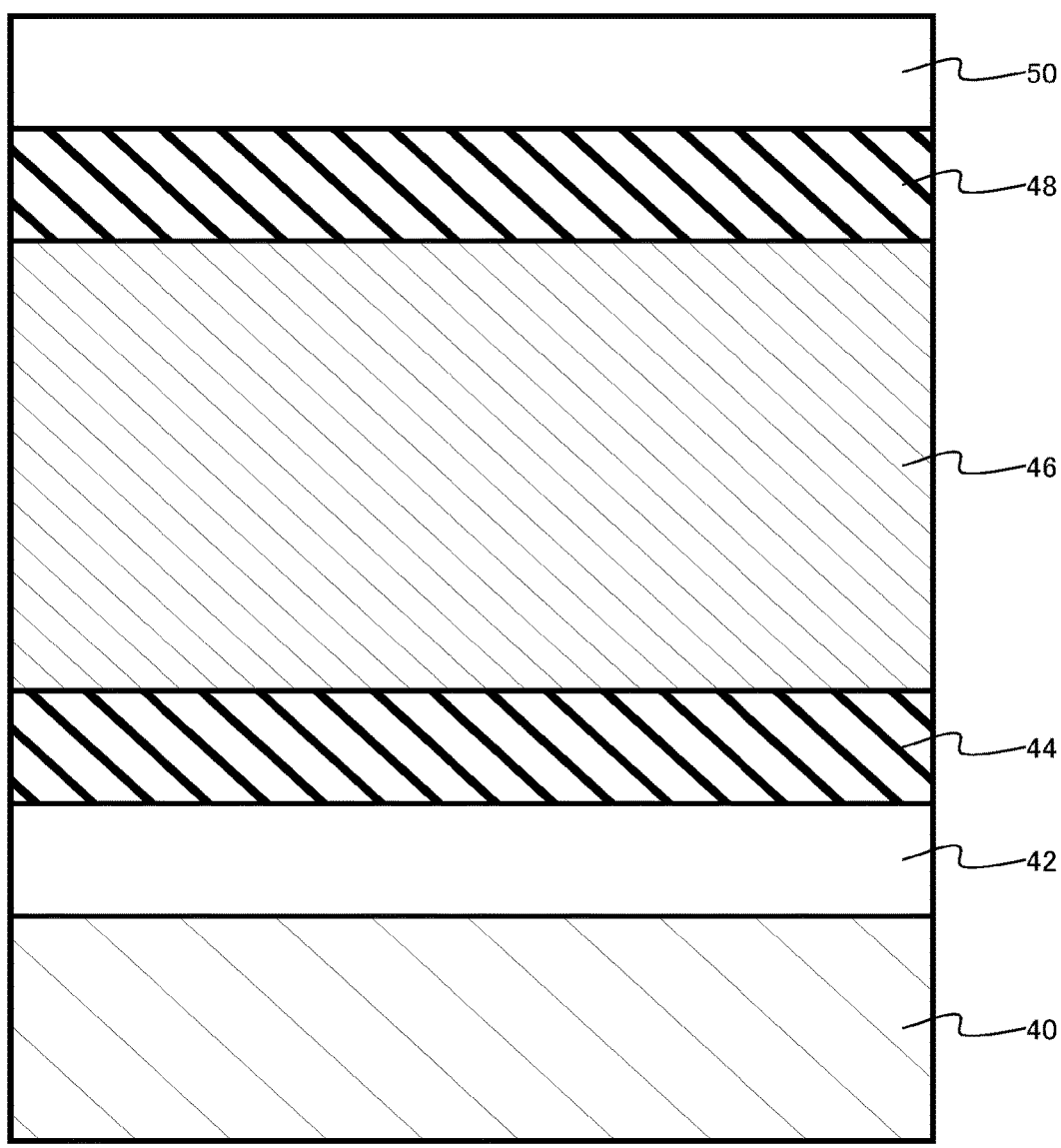
FIG. 3 is a schematic sectional view illustrating a semiconductor-device manufacturing method of the first embodiment.

First, a first tungsten film 40, a first silicon oxide film 42, a first silicon nitride film 44, a polycrystalline silicon film 46, a second silicon nitride film 48, and a second silicon oxide film 50 are formed sequentially in the stated order (FIG. 3). The first tungsten film 40, the first silicon oxide film 42, the first silicon nitride film 44, the polycrystalline silicon film 46, the second silicon nitride film 48, and the second silicon oxide film 50 are formed by a chemical vapor deposition process (CVD process), for example.

Figure 4:
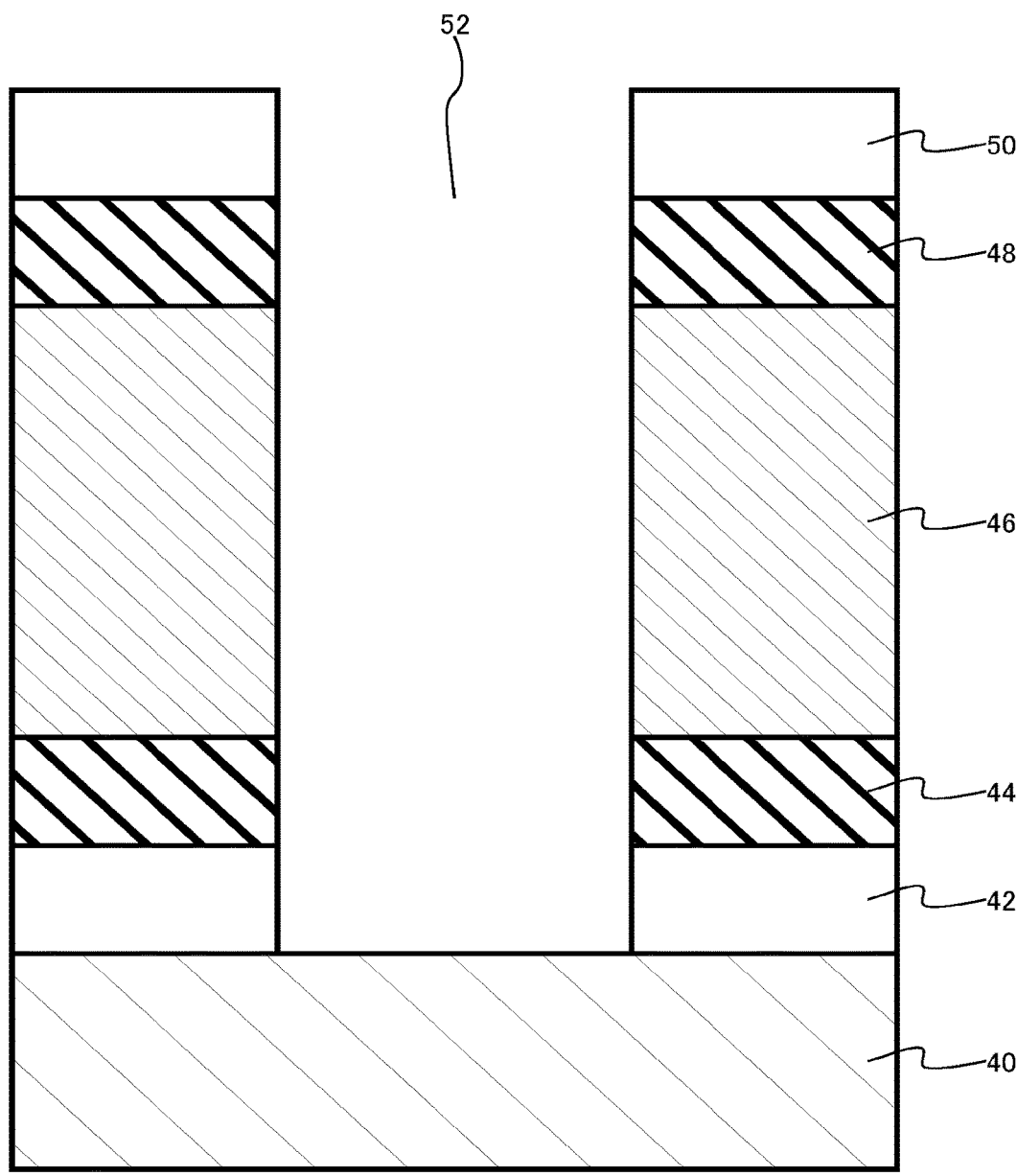
FIG. 4 is a schematic sectional view illustrating the semiconductor-device manufacturing method of the first embodiment.

Subsequently, boring is performed from the surface of the second silicon oxide film 50 to form a first opening 52 extending to the first tungsten film 40 (FIG. 4). The first opening 52 is formed using a lithography process and a reactive ion etching process (RIE process), for example.

Figure 5:
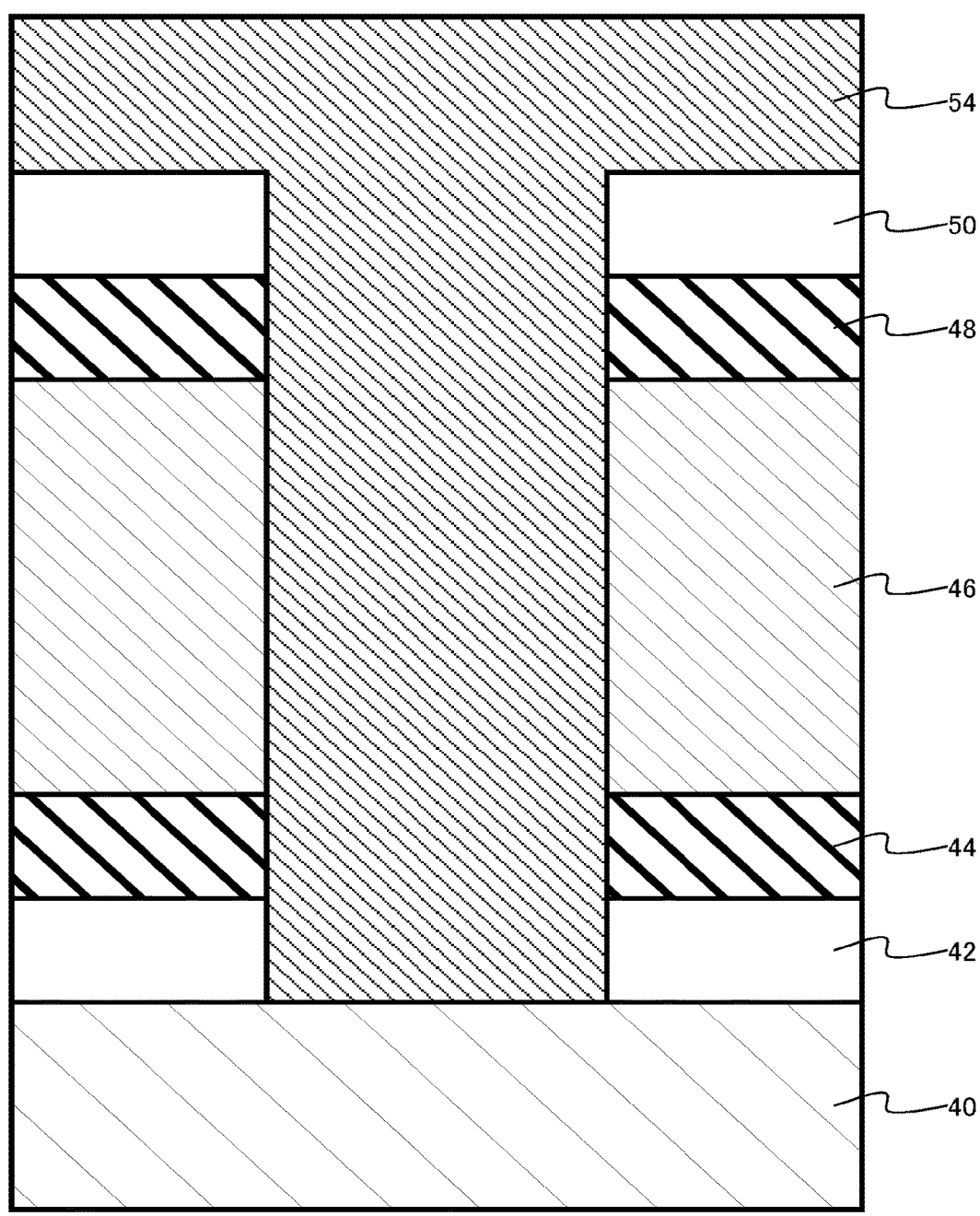
FIG. 5 is a schematic sectional view illustrating the semiconductor-device manufacturing method of the first embodiment.

Subsequently, a first metallic film 54 is buried in the first opening 52 (FIG. 5). The first metallic film 54 is a metal of which oxide acts as an oxide semiconductor. The first metallic film 54 includes indium (In), gallium (Ga), and zinc (Zn), for example.

Figure 6:
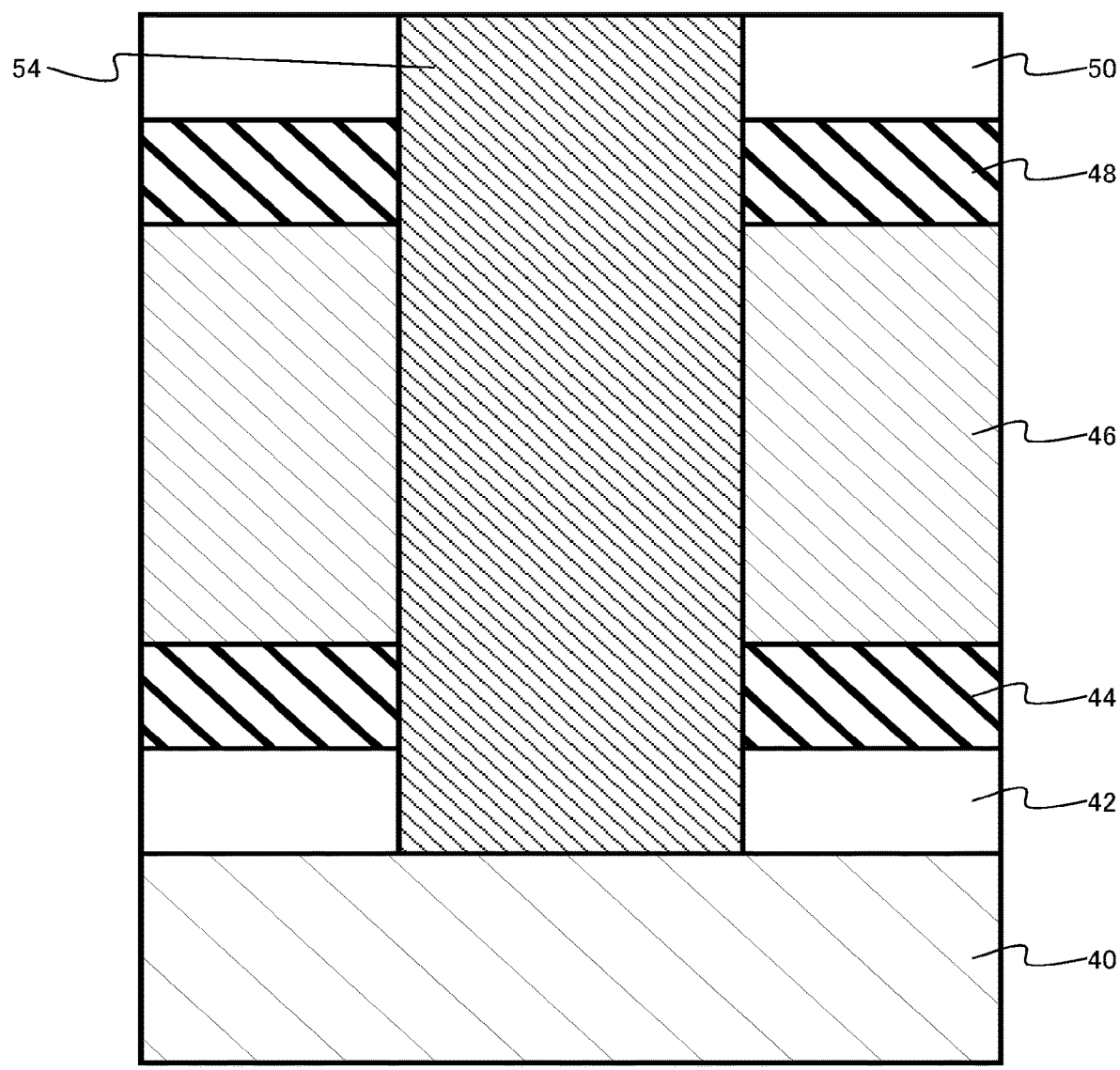
FIG. 6 is a schematic sectional view illustrating the semiconductor-device manufacturing method of the first embodiment.

Subsequently, a portion of the first metallic film 54 on the surface of the second silicon oxide film 50 is removed (FIG. 6). The portion of the first metallic film 54 is removed by a chemical mechanical polishing process (CMP process), for example.

Figure 7:
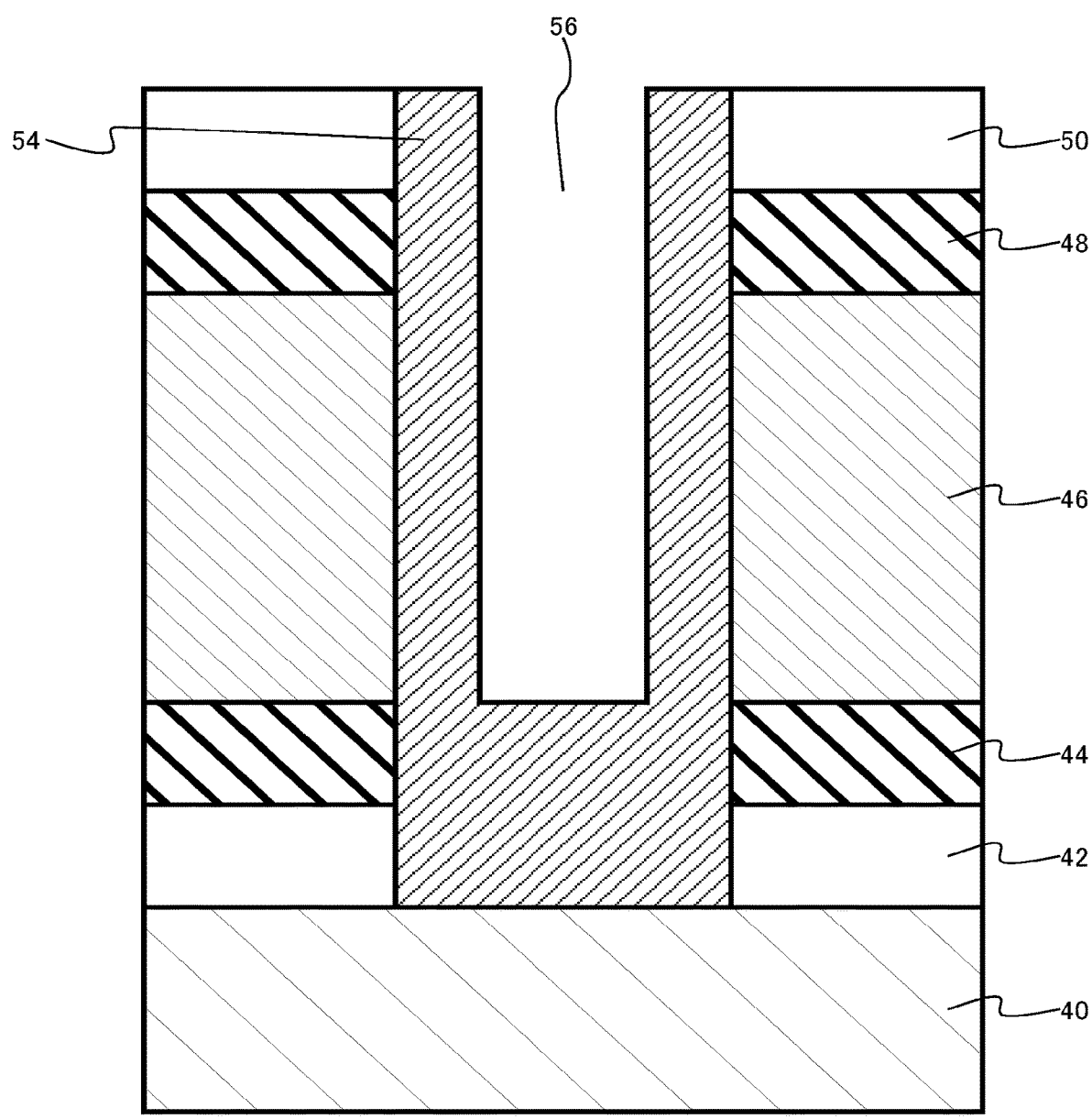
FIG. 7 is a schematic sectional view illustrating the semiconductor-device manufacturing method of the first embodiment.

Subsequently, a second opening 56 is formed in the first metallic film 54 (FIG. 7). The second opening 56 is formed using a lithography process and a RIE process, for example.

Figure 8:
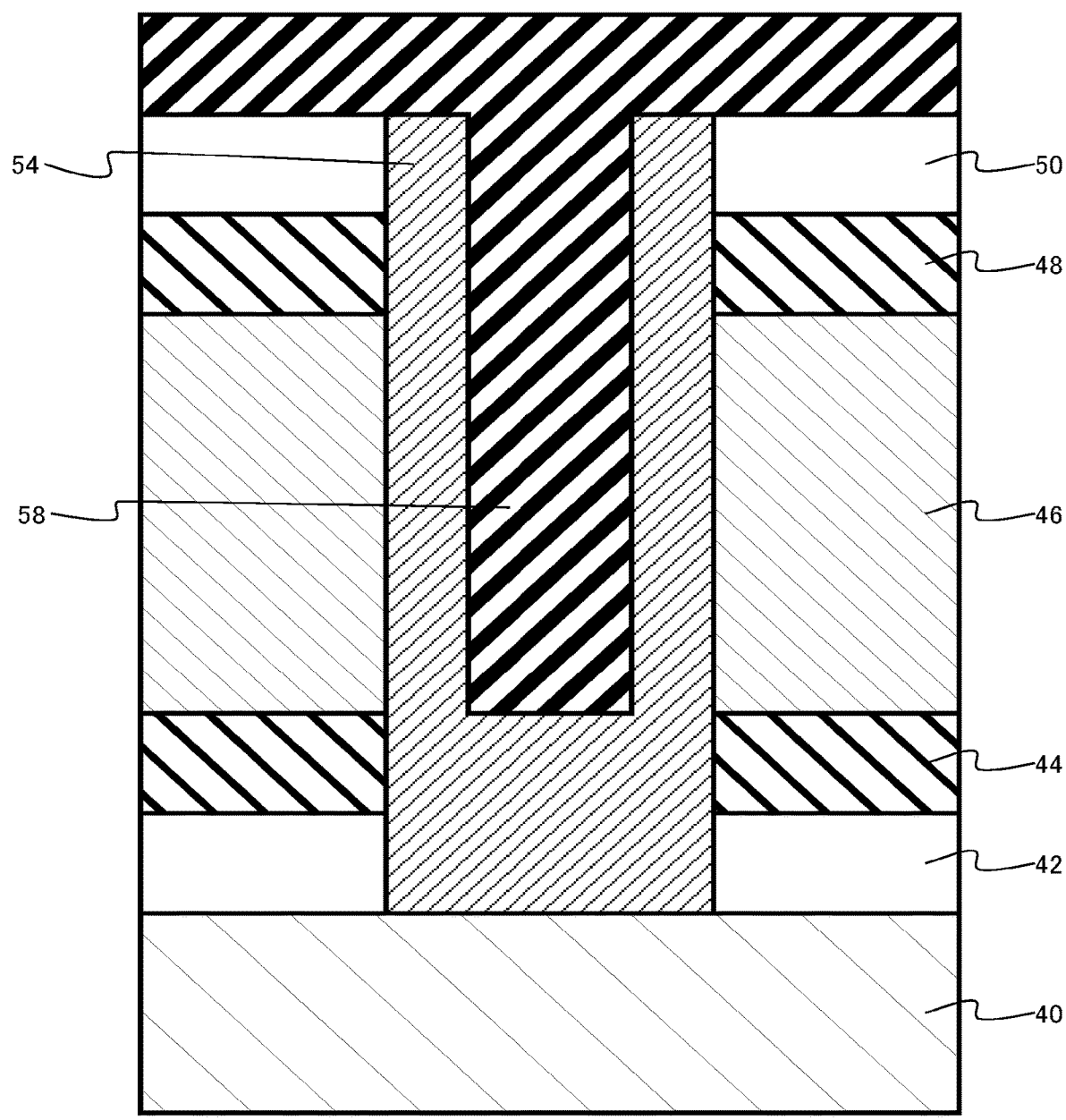
FIG. 8 is a schematic sectional view illustrating the semiconductor-device manufacturing method of the first embodiment.

Subsequently, a third silicon oxide film 58 is buried in the second opening 56 (FIG. 8). The third silicon oxide film 58 is formed by a CVD process, for example.

Figure 9:
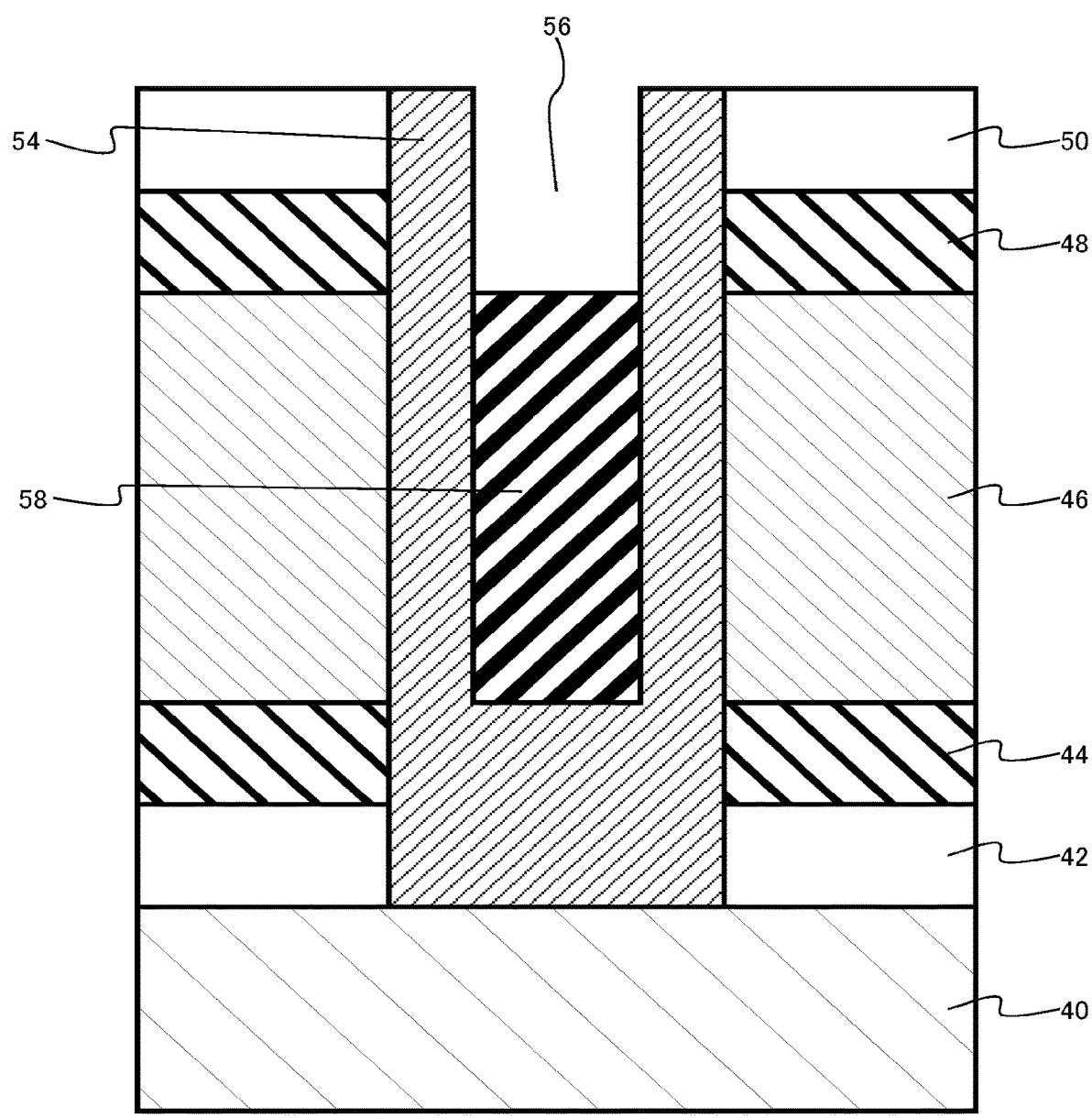
FIG. 9 is a schematic sectional view illustrating the semiconductor-device manufacturing method of the first embodiment.

Subsequently, the parts of the third silicon oxide film 58 on the surface of the second silicon oxide film 50 and in a portion of the second opening 56 are removed (FIG. 9). The parts of the third silicon oxide film 58 are removed by a RIE process, for example.

Figure 10:
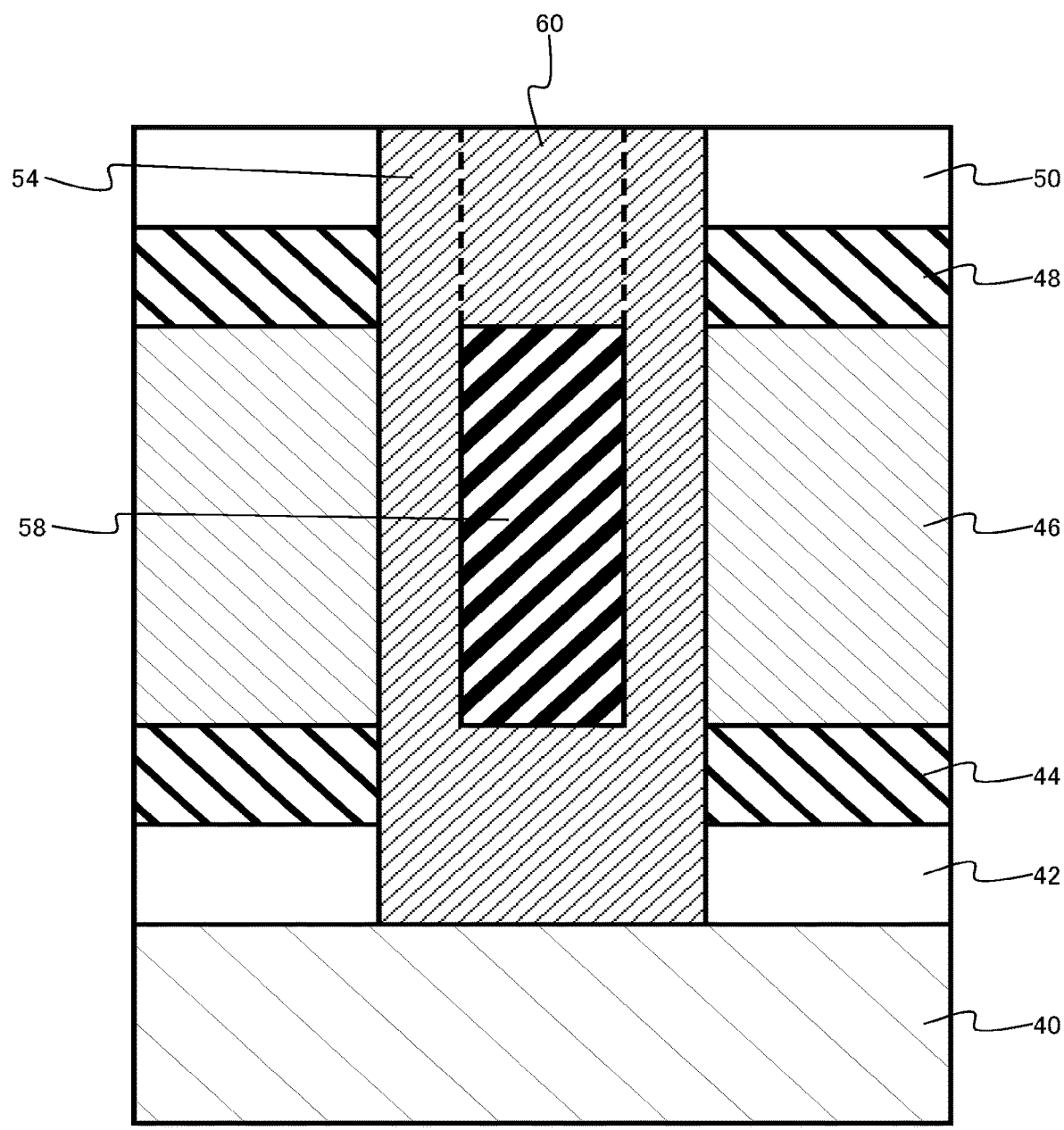
FIG. 10 is a schematic sectional view illustrating the semiconductor-device manufacturing method of the first embodiment.

Subsequently, a second metallic film 60 is buried in the second opening 56 (FIG. 10). The second metallic film 60 has the same chemical composition as that of the first metallic film 54. Hereinafter, the second metallic film 60 will be described as being included in the first metallic film 54. The second metallic film 60 is formed through deposition by a CVD process and polishing by a CMP process, for example.

Figure 11:
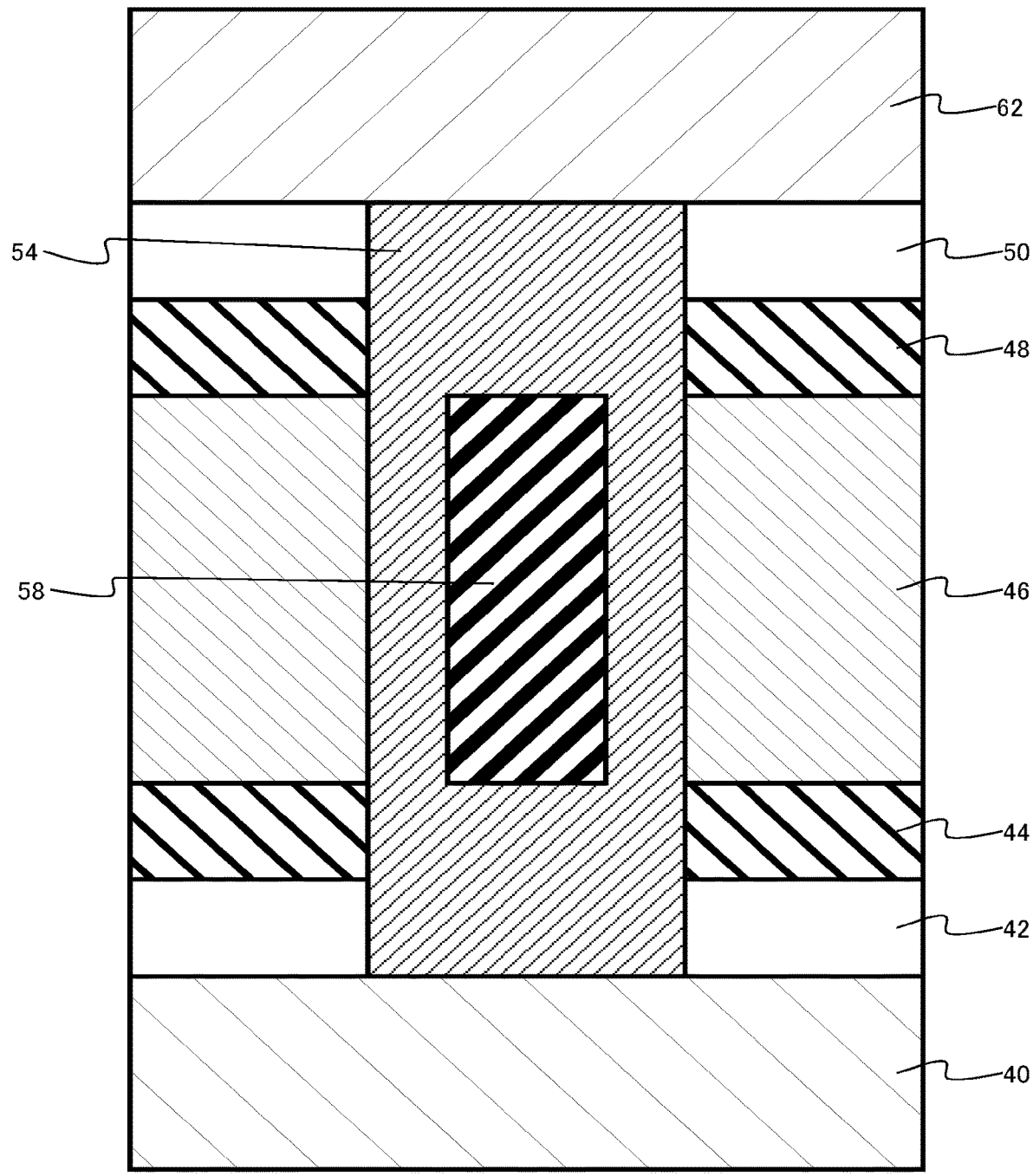
FIG. 11 is a schematic sectional view illustrating the semiconductor-device manufacturing method of the first embodiment.

Subsequently, a second tungsten film 62 is formed on the second silicon oxide film 50 and the first metallic film 54 (FIG. 11). The second tungsten film 62 is formed by a CVD process, for example.

Figure 12:
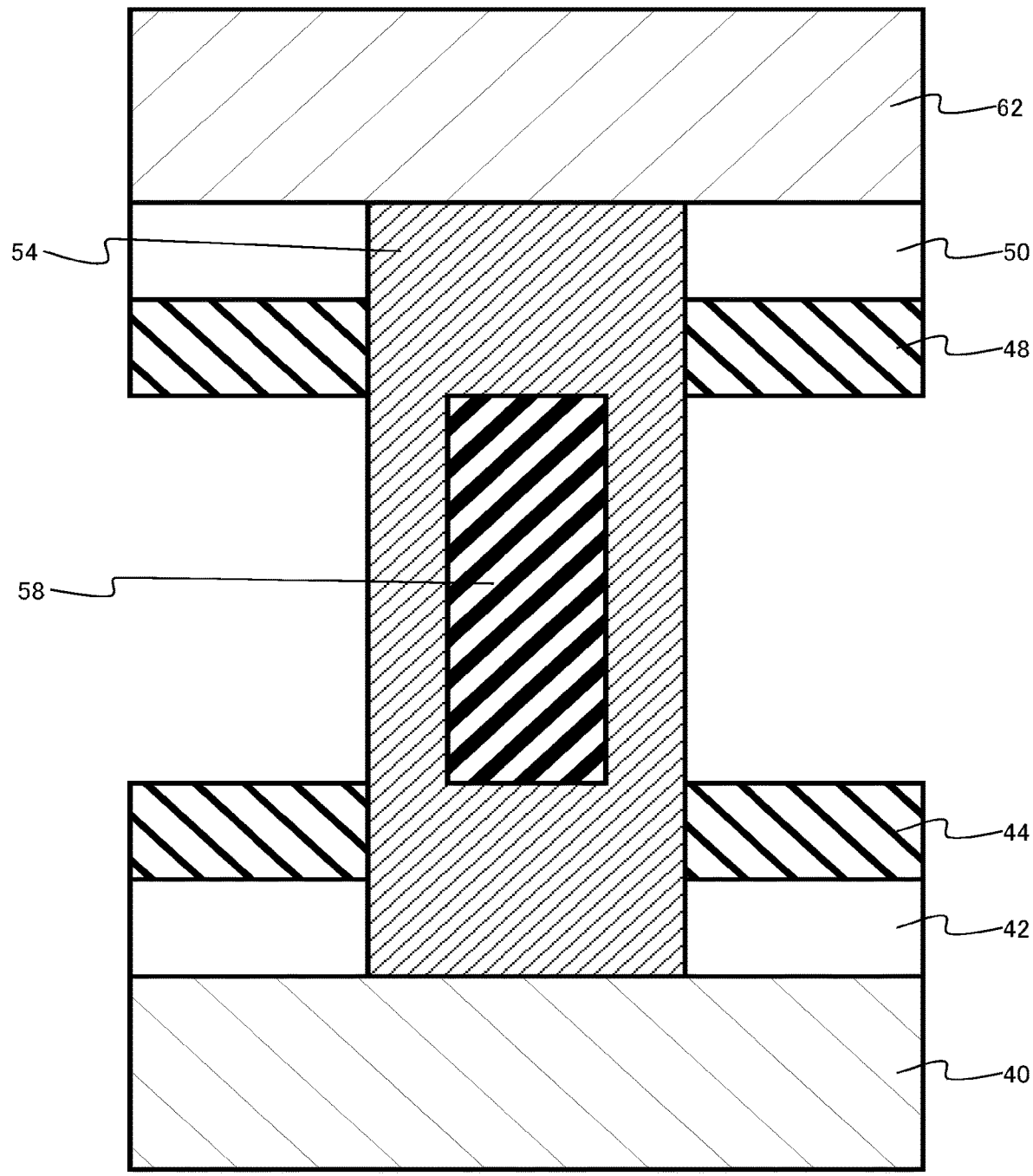
FIG. 12 is a schematic sectional view illustrating the semiconductor-device manufacturing method of the first embodiment.

Subsequently, the polycrystalline silicon film 46 is removed (FIG. 12). The polycrystalline silicon film 46 is removed by a wet etching process, for example.

Figure 13:
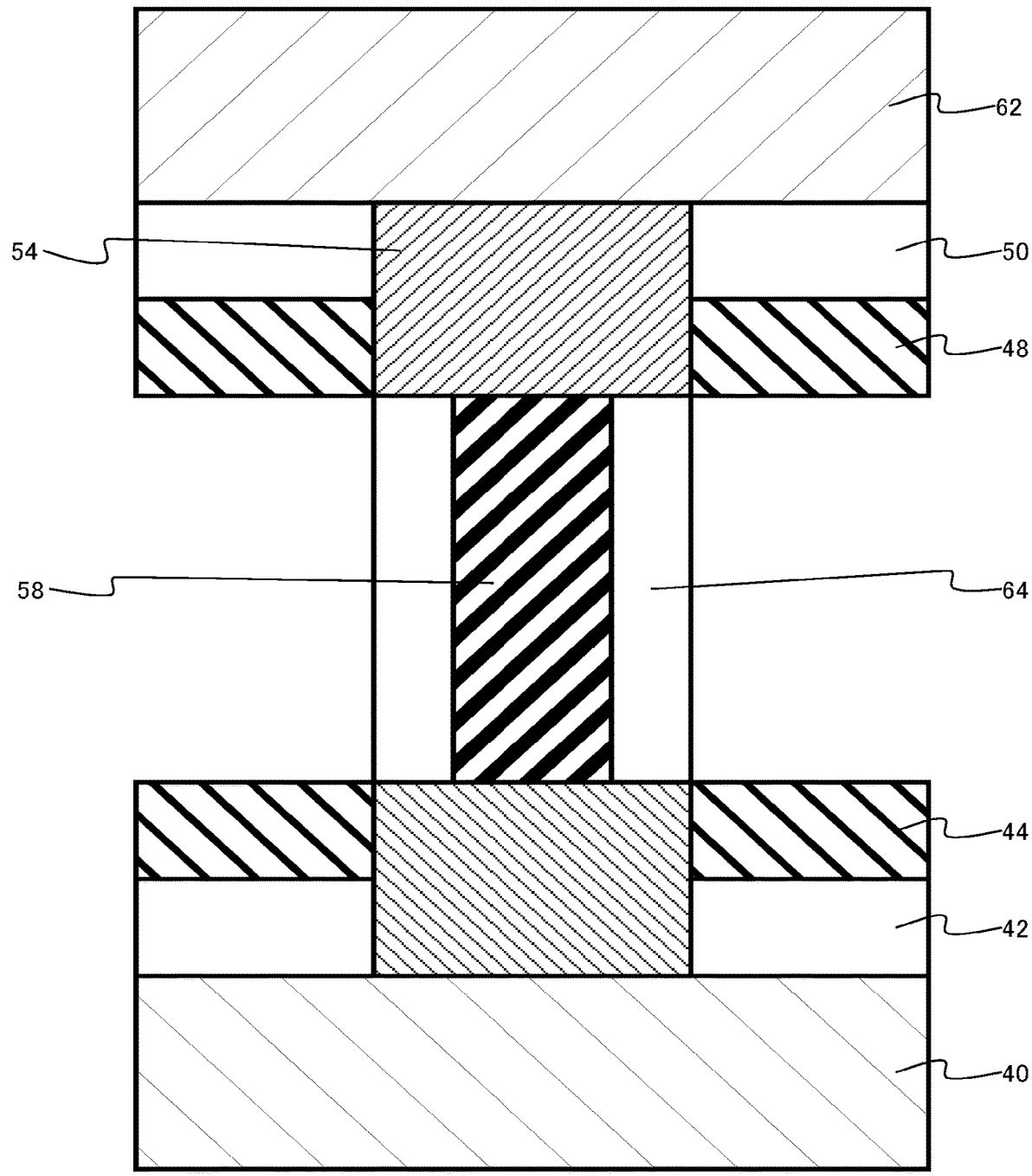
FIG. 13 is a schematic sectional view illustrating the semiconductor-device manufacturing method of the first embodiment.

Subsequently, a portion of the first metallic film 54, which is exposed to a region where the polycrystalline silicon film 46 has been removed, is oxidized (FIG. 13). The oxidization of the first metallic film 54 forms an oxide semiconductor region 64. The oxide semiconductor region 64 serves as the channel region 18.

Figure 14:
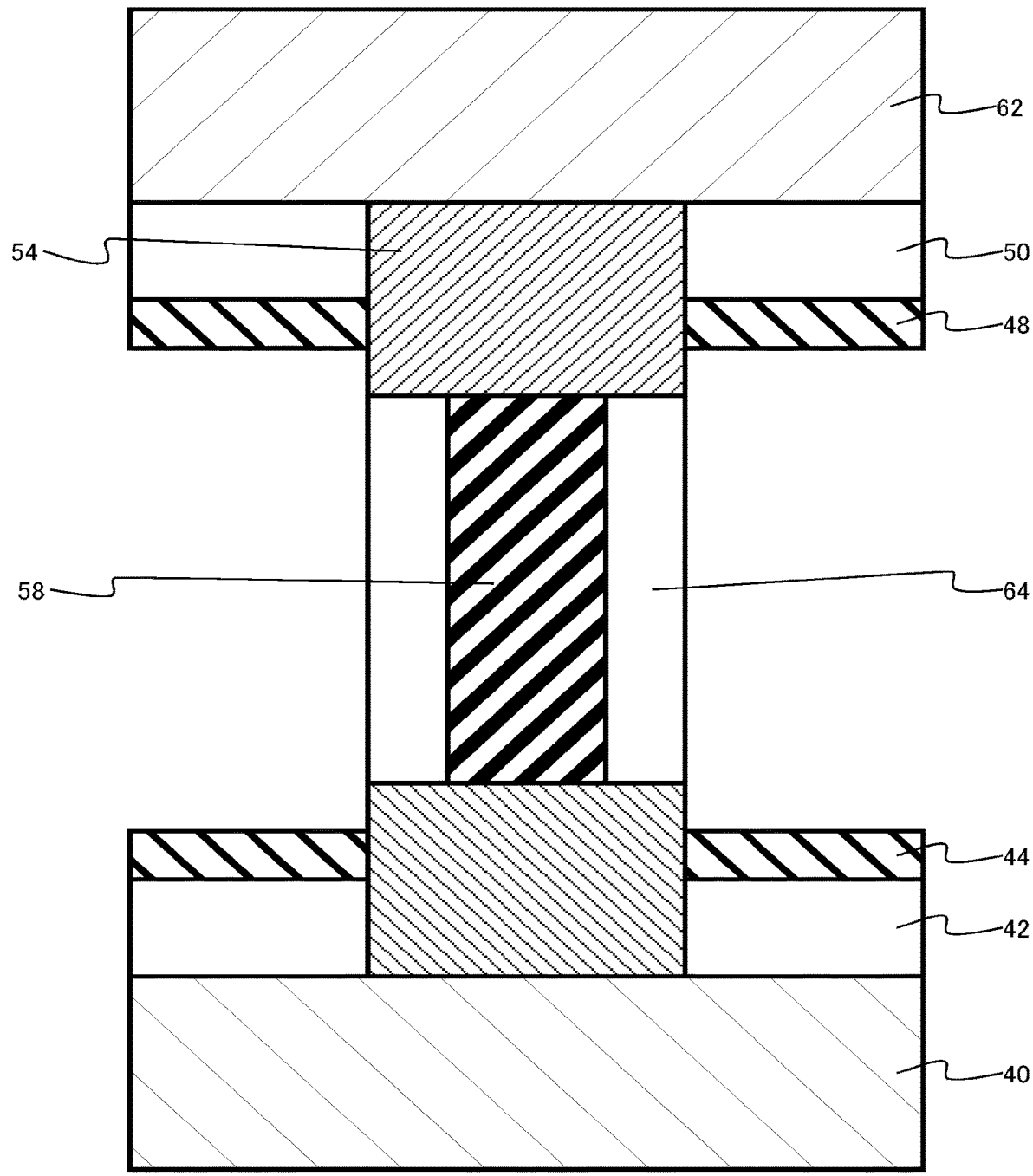
FIG. 14 is a schematic sectional view illustrating the semiconductor-device manufacturing method of the first embodiment.

Subsequently, a part of the first silicon nitride film 44 and a part of the second silicon nitride film 48 are removed to make the first silicon nitride film 44 and the second silicon nitride film 48 thinner (FIG. 14). The respective parts of the first silicon nitride film 44 and the second silicon nitride film 48 are removed by a wet etching process, for example.

Figure 15:
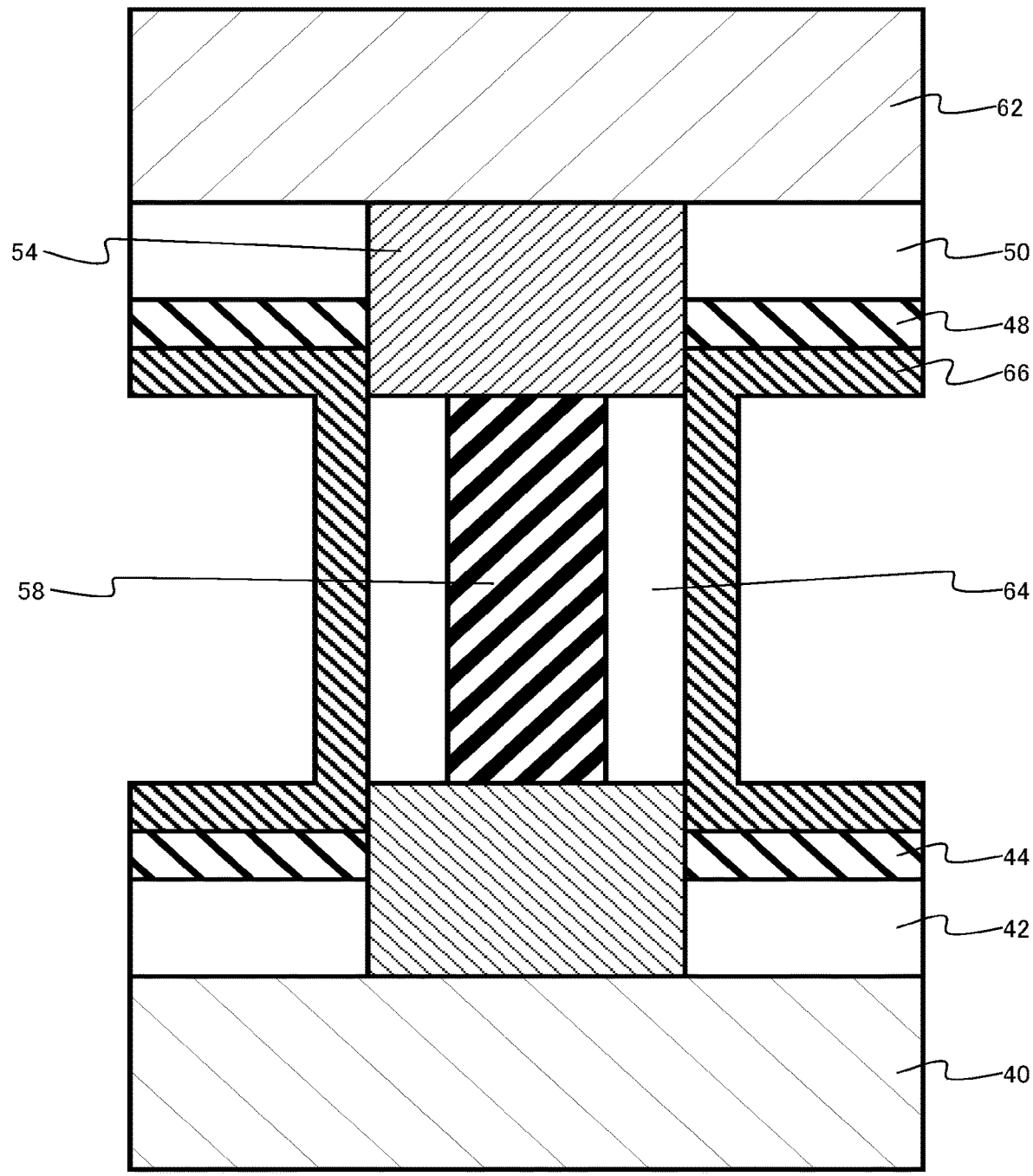
FIG. 15 is a schematic sectional view illustrating the semiconductor-device manufacturing method of the first embodiment.

Subsequently, a fourth silicon oxide film 66 is formed so as to be in contact with the oxide semiconductor region 64 (FIG. 15). The fourth silicon oxide film 66 is formed by a CVD process, for example. The fourth silicon oxide film 66 serves as the gate insulating layer 22.

Figure 16:
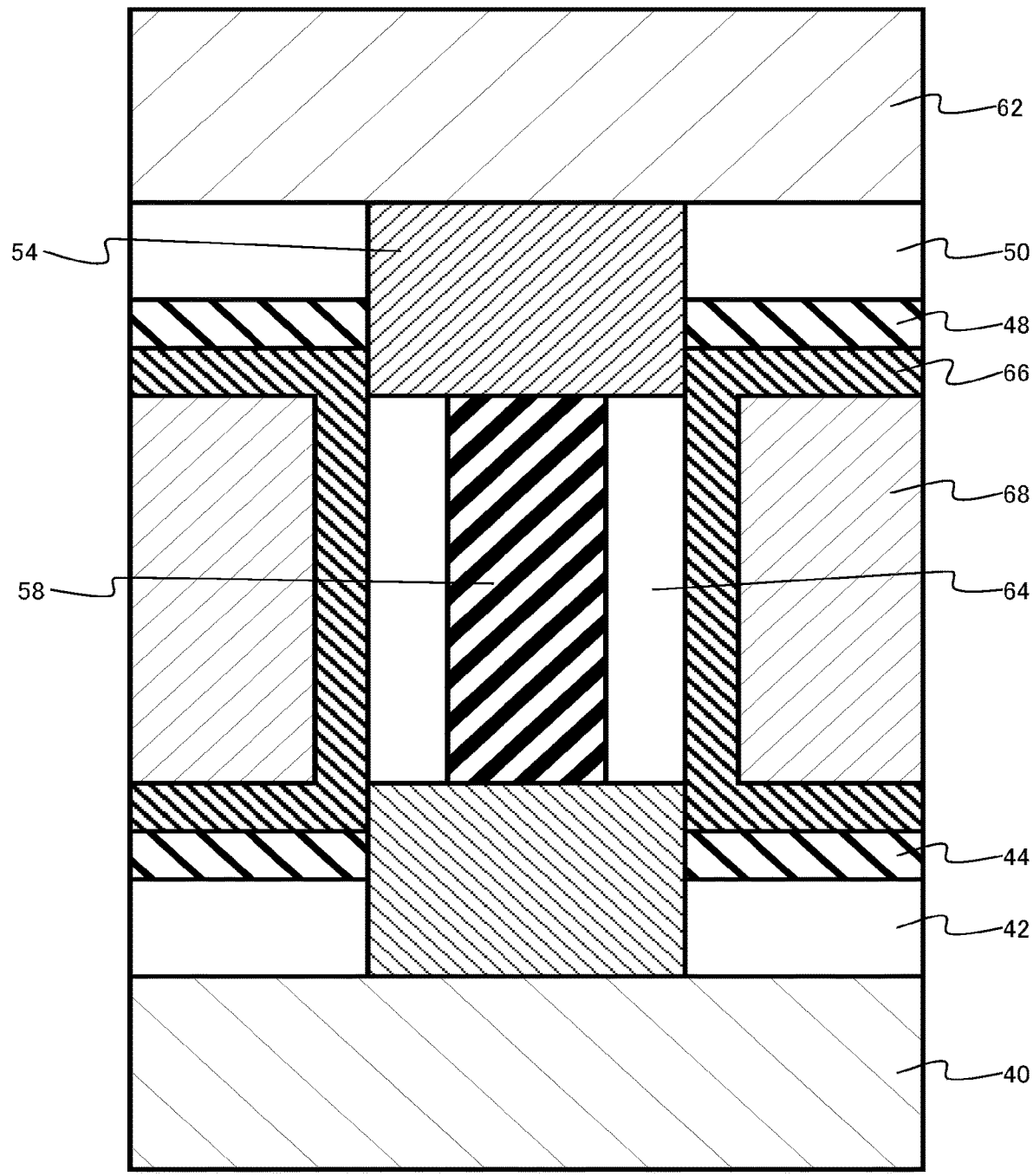
FIG. 16 is a schematic sectional view illustrating the semiconductor-device manufacturing method of the first embodiment.

Subsequently, a third tungsten film 68 is formed so as to be in contact with the fourth silicon oxide film 66 (FIG. 16). The third tungsten film 68 is formed by a CVD process, for example. The third tungsten film 68 serves as the gate electrode 20.

By the above-described manufacturing method, the transistor 100 illustrated in FIG. 1 is formed.

Next, functions and effects of the semiconductor device of the first embodiment will be described.

Figure 17:
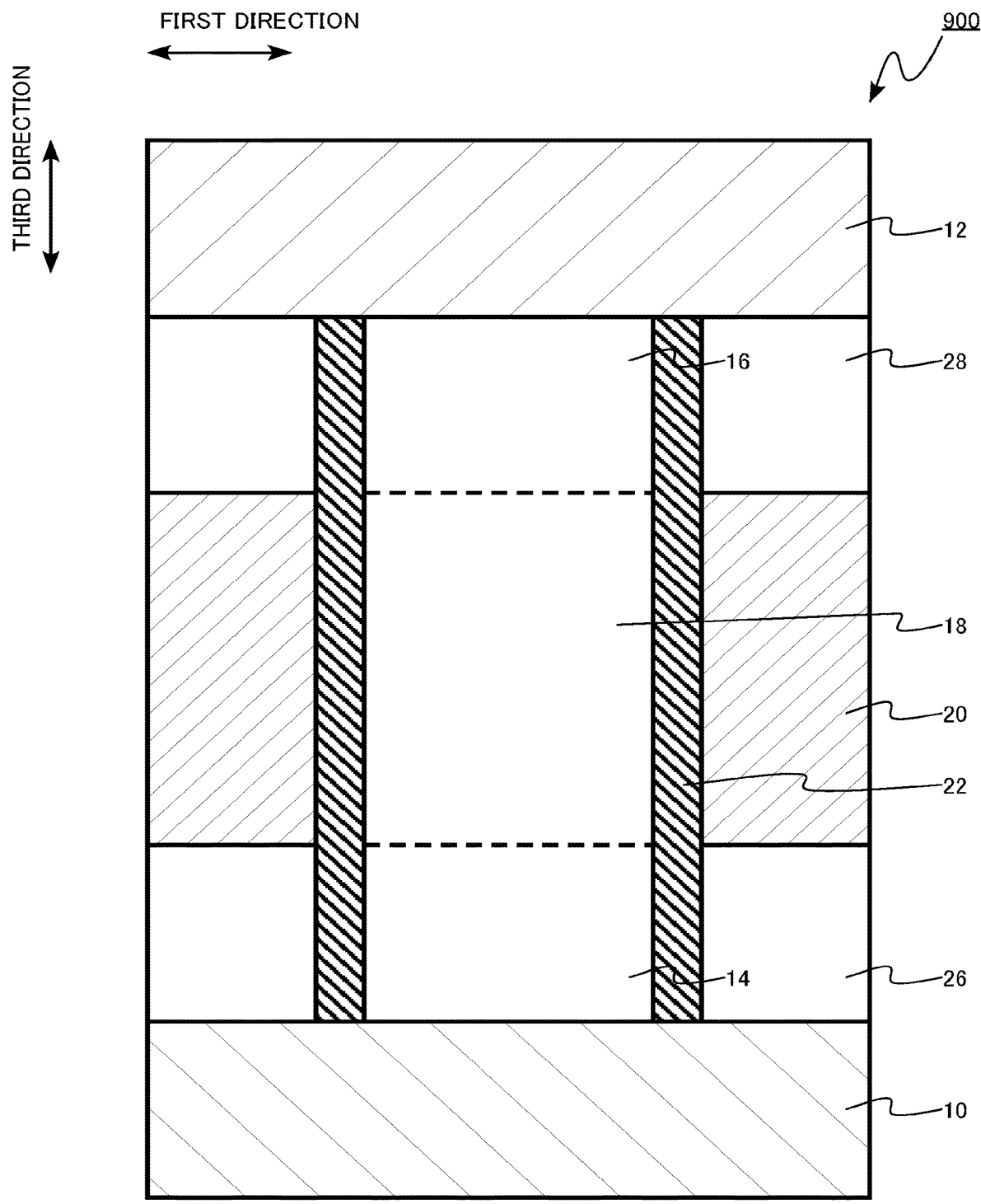
FIG. 17 is a schematic sectional view of a semiconductor device of a comparative example.

FIG. 17 is a schematic sectional view of a semiconductor device of a comparative example. The semiconductor device of the comparative example is a transistor 900. The transistor 900 is an oxide semiconductor transistor in which a channel is formed in an oxide semiconductor. The transistor 900 is a so-called SGT including a gate electrode provided so as to surround an oxide semiconductor in which a channel is formed. The transistor 900 is a so-called vertical transistor.

The transistor 900 is different from the transistor 100 of the first embodiment in that the core insulating region 24 is not included. The transistor 900 is different from the transistor 100 also in that each of the source region 14 and the drain region 16 is not a metal, but an oxide semiconductor.

The transistor 900 does not include the core insulating region 24. Thus, the channel region 18 has a large thickness. Because of the large thickness of the channel region 18, a leakage current is more likely to flow through a region remote from the gate electrode 20 in the channel region 18 during off-operation of the transistor 900. Therefore, it is difficult to reduce an off-leakage current.

Further, in the transistor 900, each of the source region 14 and the drain region 16 is an oxide semiconductor. Thus, a junction between the source electrode 10 and the source region 14 is a metal-semiconductor junction, which makes it difficult to reduce contact resistance. Likewise, a junction between the drain electrode 12 and the drain region 16 is a metal-semiconductor junction, which makes it difficult to reduce contact resistance. Therefore, it is difficult to reduce on-resistance.

In the transistor 100 of the first embodiment, the core insulating region 24 is provided inside the channel region 18. This can reduce the thickness of the channel region 18. Therefore, it is easy to reduce an off-leakage current.

Further, each of the source region 14 and the drain region 16 of the transistor 100 of the first embodiment is a metal. Thus, a junction between the source electrode 10 and the source region 14 is a metal-metal junction. For this reason, it is easy to reduce contact resistance. Likewise, a junction between the drain electrode 12 and the drain region 16 is a metal-metal junction, and for this reason, it is easy to reduce contact resistance. Therefore, it is easy to reduce on-resistance.

Moreover, the channel region 18 is formed of an oxide of a metal forming the source region 14 and the drain region 16. Thus, the channel region 18 can be formed by oxidization of a metal forming the source region 14 and the drain region 16. This makes an interface between the channel region 18 and the source region 14 and an interface between the channel region 18 and the drain region 16 stable with fewer defects. Therefore, resistance at each interface is reduced and on-resistance is reduced.

The transistor 100 of the first embodiment can reduce an off-leakage current and can reduce on-resistance as compared to the transistor 900 of the comparative example.

Figure 18:
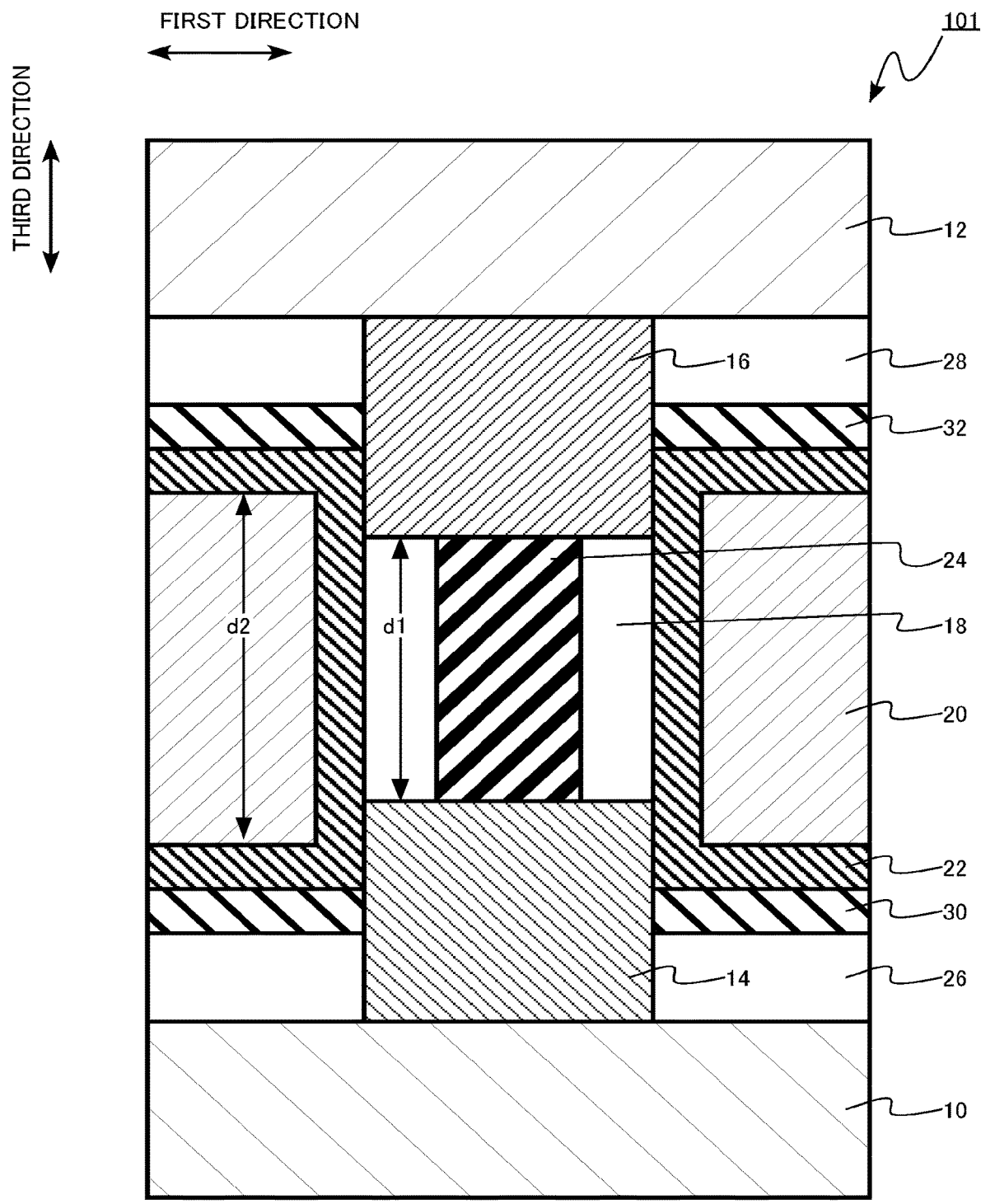
FIG. 18 is a schematic sectional view of a semiconductor device of a first modification of the first embodiment.

FIG. 18 is a schematic sectional view of a semiconductor device of a first modification of the first embodiment. The semiconductor device of the first modification is a transistor 101.

The transistor 101 is different from the transistor 100 of the first embodiment in that a part of the source region 14 and the gate electrode 20 positionally overlap each other along the third direction and that a part of the drain region 16 and the gate electrode 20 positionally overlap each other along the third direction. Thus, a distance (d1 in FIG. 18) between the source region 14 and the drain region 16 along the third direction is smaller than a length (d2 in FIG. 18) of the gate electrode 20 along the third direction. The distance d1 between the source region 14 and the drain region 16 along the third direction is equal to or smaller than 0.9 times the length d2 of the gate electrode 20 along the third direction, for example.

In the transistor 101 of the first modification, the source region 14 and the gate electrode 20 overlap each other and the drain region 16 and the gate electrode 20 overlap each other. As a result of this, offsets between the source region 14 and the gate electrode 20 and between the drain region 16 and the gate electrode 20 due to variation in process, for example, are unlikely to occur. Therefore, a transistor with stable on-resistance can be achieved.

Figure 19:
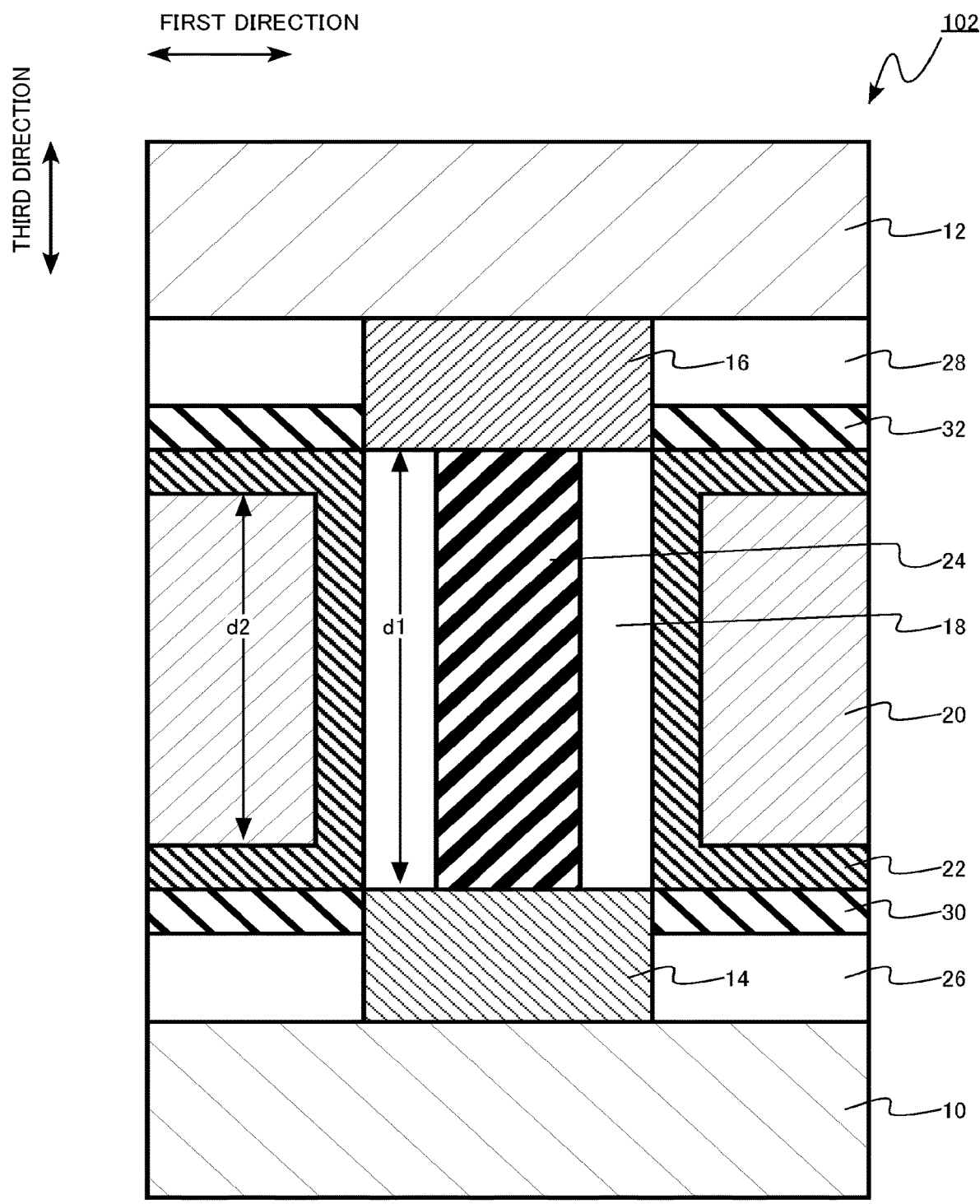
FIG. 19 is a schematic sectional view of a semiconductor device of a second modification of the first embodiment.

FIG. 19 is a schematic sectional view of a semiconductor device of a second modification of the first embodiment. The semiconductor device of the second modification is a transistor 102.

The transistor 102 is different from the transistor 100 of the first embodiment in that the source region 14 and the gate electrode 20 do not positionally overlap each other along the third direction and in that the drain region 16 and the gate electrode 20 do not positionally overlap each other along the third direction. Thus, a distance (d1 in FIG. 19) between the source region 14 and the drain region 16 along the third direction is larger than a length (d2 in FIG. 19) of the gate electrode 20 along the third direction. The distance d1 between the source region 14 and the drain region 16 along the third direction is equal to or larger than 1.1 times the length d2 of the gate electrode 20 along the third direction, for example.

The configuration of the transistor 102 of the second modification can reduce the volume of the gate electrode 20. Thus, particularly in a case where a material of the gate electrode 20 is a metal, the stress of the transistor 102 is relieved. Therefore, a highly-reliable transistor can be achieved.

As described above, according to the first embodiment and its modifications, a transistor that can reduce an off-leakage current and can reduce on-resistance can be achieved.

Second Embodiment

A semiconductor device of a second embodiment includes a first electrode, a second electrode, a first oxide semiconductor region provided between the first electrode and the second electrode, a second oxide semiconductor region provided between the first oxide semiconductor region and the second electrode, a third oxide semiconductor region provided between the first oxide semiconductor region and the second oxide semiconductor region, the third oxide semiconductor region having electrical resistance higher than those of the first oxide semiconductor region and the second oxide semiconductor region, and the third oxide semiconductor region including a first portion and a second portion surrounded by the first portion in which a first distance between the first oxide semiconductor region and the second oxide semiconductor region between which the first portion is sandwiched is smaller than a second distance between the first oxide semiconductor region and the second oxide semiconductor region between which the second portion is sandwiched, a gate electrode surrounding the third oxide semiconductor region, and a gate insulating layer provided between the third oxide semiconductor region and the gate electrode.

Figure 20:
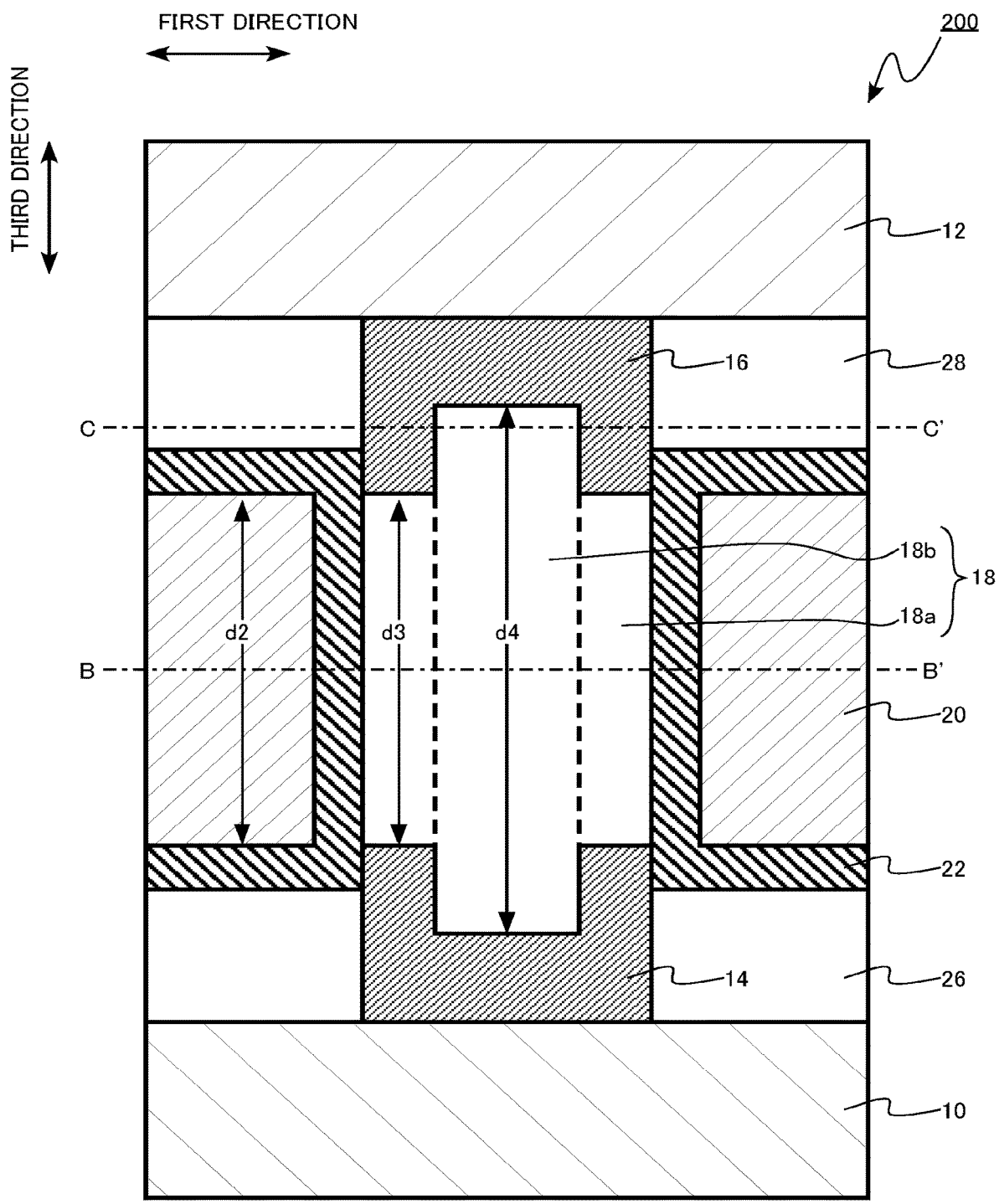
FIG. 20 is a schematic sectional view of a semiconductor device of a second embodiment.
Figure 21:
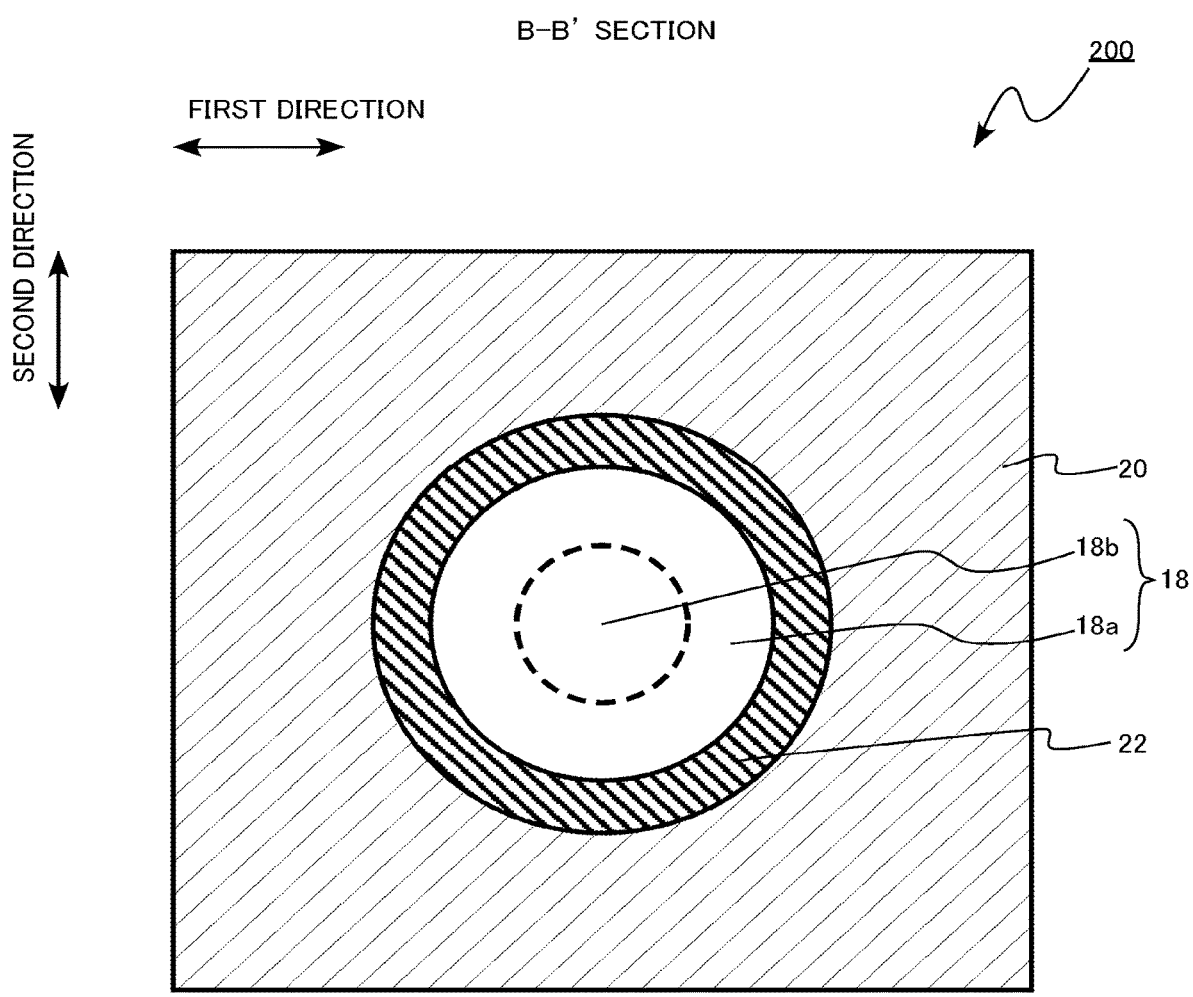
FIG. 21 is a schematic sectional view of the semiconductor device of the second embodiment.
Figure 22:
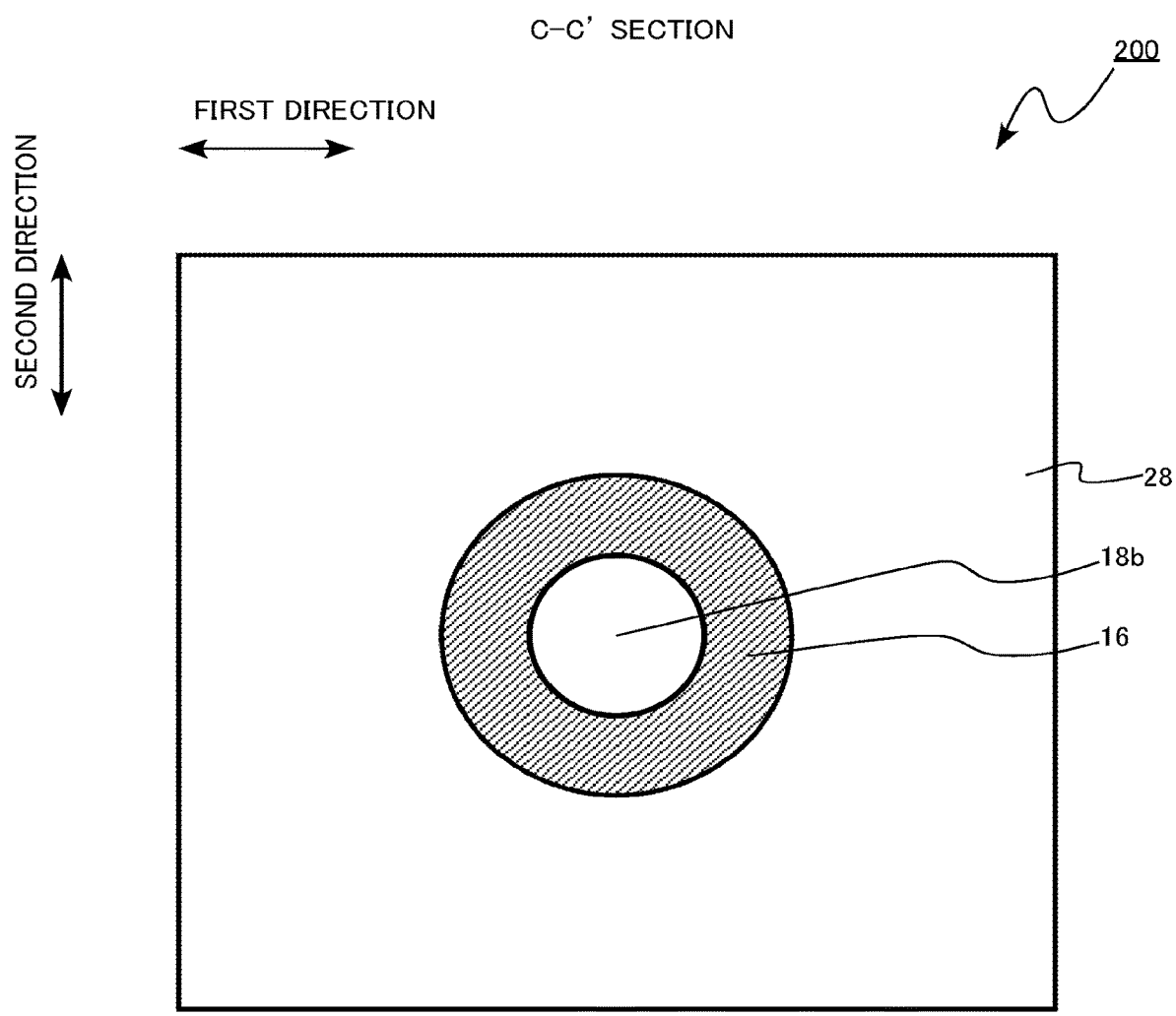
FIG. 22 is a schematic sectional view of the semiconductor device of the second embodiment.

FIGS. 20 to 22 are schematic sectional views of the semiconductor device of the second embodiment. FIG. 21 is a sectional view taken along B-B' in FIG. 20. FIG. 22 is a sectional view taken along C-C' in FIG. 20. In FIG. 20, a horizontal direction is referred to as a first direction, a depth direction is referred to as a second direction, and a vertical direction is referred to as a third direction.

The semiconductor device of the second embodiment is a transistor 200. The transistor 200 is an oxide semiconductor transistor in which a channel is formed in an oxide semiconductor. In the transistor 200, a gate electrode is provided so as to surround an oxide semiconductor in which a channel is formed. The transistor 200 is a so-called SGT. The transistor 200 is a so-called vertical transistor.

The transistor 200 includes a source electrode 10, a drain electrode 12, a source region 14, a drain region 16, a channel region 18, agate electrode 20, a gate insulating layer 22, a first interlayer insulating layer 26, and a second interlayer insulating layer 28. The channel region 18 includes a surface portion 18a and a core portion 18b.

The source electrode 10 is one example of the first electrode. The drain electrode 12 is one example of the second electrode. The source region 14 is one example of the first oxide semiconductor region. The drain region 16 is one example of the second oxide semiconductor region. The channel region 18 is one example of the third oxide semiconductor region. The surface portion 18a is one example of the first portion. The core portion 18b is one example of the second portion.

The source electrode 10 is a metal or a metallic compound, for example. The source electrode 10 is tungsten (W), for example.

The drain electrode 12 is a metal or a metallic compound, for example. The drain electrode 12 is tungsten (W), for example.

The source region 14 is provided between the source electrode 10 and the drain electrode 12. The source region 14 and the source electrode 10 are in contact with each other. The source region 14 and the source electrode 10 are electrically connected.

The source region 14 is an oxide semiconductor. The source region 14 includes at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn), and oxygen (O). The source region 14 is amorphous, for example.

The drain region 16 is provided between the source region 14 and the drain electrode 12. The drain region 16 is in contact with the drain electrode 12. The drain region 16 is electrically connected to the drain electrode 12.

The drain region 16 is an oxide semiconductor. The drain region 16 includes at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn), and oxygen (O).

The drain region 16 is formed of the same oxide semiconductor as that forming the source region 14. The drain region 16 includes the same metallic element as that included in the source region 14. The drain region 16 is amorphous, for example.

The channel region 18 is provided between the source region 14 and the drain region 16. The channel region 18 is in contact with the source region 14 and the drain region 16.

The channel region 18 is spaced apart from the source electrode 10. The channel region 18 is spaced apart from the drain electrode 12.

In the channel region 18, a channel serving as a current path during on-operation of the transistor 200 is formed. The channel region 18 extends along a direction toward the drain electrode 12 from the source electrode 10, that is, along the third direction. During on-operation of the transistor 200, a current flows along the third direction in the channel region 18.

The channel region 18 includes the surface portion 18a and the core portion 18b. The core portion 18b is surrounded by the surface portion 18a. Apart of the core portion 18b on a side close to the source region 14 is surrounded by the source region 14. A part of the core portion 18b on a side close to the drain region 16 is surrounded by the drain region 16.

A first distance (d3 in FIG. 20) along the third direction between respective portions of the source region 14 and the drain region 16 between which the surface portion 18a is sandwiched is smaller than a second distance (d4 in FIG. 20) along the third direction between respective portions of the source region 14 and the drain region 16 between which the core portion 18b is sandwiched. In other words, a length of the surface portion 18a along the third direction is smaller than a length of the core portion 18b along the third direction.

The first distance d3 is equal to or larger than 20 nm and is equal to or smaller than 100 nm, for example. The second distance d4 is equal to or larger than 1.2 times the first distance d3 and is equal to or smaller than 2.0 times the first distance d3, for example.

The channel region 18 is an oxide semiconductor. The channel region 18 includes at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn), and oxygen (O).

The channel region 18 is formed of the same oxide semiconductor as that forming the source region 14 and the drain region 16. The channel region 18 includes the same metallic element as that included in the source region 14 and the drain region 16. The channel region 18 is amorphous, for example.

The channel region 18 has electrical resistance higher than the electrical resistance of the source region 14. The channel region 18 has electrical resistance higher than the electrical resistance of the drain region 16.

In other words, the source region 14 has electrical resistance lower than the electrical resistance of the channel region 18. The drain region 16 has electrical resistance lower than the electrical resistance of the channel region 18.

The channel region 18 has a carrier concentration lower than the carrier concentration of the source region 14. The channel region 18 has a carrier concentration lower than the carrier concentration of the drain region 16.

In other words, the source region 14 has a carrier concentration higher than the carrier concentration of the channel region 18. The drain region 16 has a carrier concentration higher than the carrier concentration of the channel region 18.

For example, the source region 14 and the drain region 16 include at least one predetermined element selected from the group consisting of indium (In), silicon (Si), and tin (Sn). The channel region 18 either includes the above-stated predetermined element, or does not include the above-stated predetermined element. The concentration of the above-stated predetermined element in the source region 14 and the drain region 16 is higher than the concentration of the above-stated predetermined element in the channel region 18.

The above-stated predetermined element functions as a donor that emits electrons in an oxide semiconductor. The concentration of the above-stated predetermined element in the source region 14 and the drain region 16 is equal to or higher than $1 \times 10^{17}$ cm$^{-3}$ and is equal to or lower than $1 \times 10^{21}$ cm$^{-3}$, for example.

For example, the source region 14 and the drain region 16 include an oxide vacancy. The channel region 18 either includes an oxide vacancy or does not include an oxide vacancy. The concentration of oxide vacancy in the source region 14 and the drain region 16 is higher than the concentration of oxide vacancy in the channel region 18.

The oxide vacancy functions as a donor that emits electrons in an oxide semiconductor.

The source region 14, the drain region 16, and the channel region 18 include indium (In), gallium (Ga), zinc (Zn), and oxygen (O), for example.

The atomic ratio of a sum of indium, gallium, and zinc in metallic elements included in the source region 14, the drain region 16, and the channel region 18 is, for example, 90% or higher. For example, the source region 14 and the drain region 16 do not include any element that has a higher atomic ratio than any of indium, gallium, and zinc.

The atomic ratio of a sum of indium, gallium, and zinc in metallic elements included in the source region 14, the drain region 16, and the channel region 18 is, for example, 90% or higher. The atomic ratio of a sum of indium, gallium, and zinc in elements included in the channel region 18 except oxygen, is, for example, 90% or higher. For example, the channel region 18 does not include any element that has a higher atomic ratio than any of indium, gallium, and zinc, except oxygen.

The gate electrode 20 is provided so as to surround the channel region 18. The gate electrode 20 is provided around the channel region 18.

The gate electrode 20 is a metal, a metallic compound, or a semiconductor, for example. The gate electrode 20 is tungsten (W), for example. A length (d2 in FIG. 20) of the gate electrode 20 along the third direction is equal to or larger than 20 nm and is equal to or smaller than 100 nm, for example. The length d2 of the gate electrode 20 along the third direction is the gate length of the transistor 200.

The first distance d3 along the third direction between respective portions of the source region 14 and the drain region 16 between which the surface portion 18a is sandwiched is equal to the length d2 of the gate electrode 20 along the third direction, for example. In other words, the length of the surface portion 18a along the third direction is equal to the length d2 of the gate electrode 20 along the third direction.

The gate electrode 20 is a metal, a metallic compound, or a semiconductor, for example. The gate electrode 20 is tungsten (W), for example.

The gate insulating layer 22 is provided between the channel region 18 and the gate electrode 20. The gate insulating layer 22 is provided so as to surround the channel region 18.

The gate insulating layer 22 is an oxide or an oxynitride, for example. The gate insulating layer 22 is silicon oxide or aluminum oxide, for example. The gate insulating layer 22 has a thickness equal to or larger than 2 nm and is equal to or smaller than 10 nm, for example.

The first interlayer insulating layer 26 is provided between the source electrode 10 and the gate electrode 20. The first interlayer insulating layer 26 is provided around the source region 14.

The first interlayer insulating layer 26 is an oxide, a nitride, or an oxynitride, for example. The first interlayer insulating layer 26 is silicon oxide, for example.

The second interlayer insulating layer 28 is provided between the drain electrode 12 and the gate electrode 20. The second interlayer insulating layer 28 is provided around the drain region 16.

The second interlayer insulating layer 28 is an oxide, a nitride, or an oxynitride, for example. The second interlayer insulating layer 28 is silicon oxide, for example.

Next, an example of a semiconductor-device manufacturing method of the second embodiment will be described.

FIGS. 23 to 34 are schematic sectional views illustrating the semiconductor-device manufacturing method of the second embodiment. FIGS. 23 to 34 illustrate sections corresponding to the section illustrated in FIG. 20.

Figure 23:
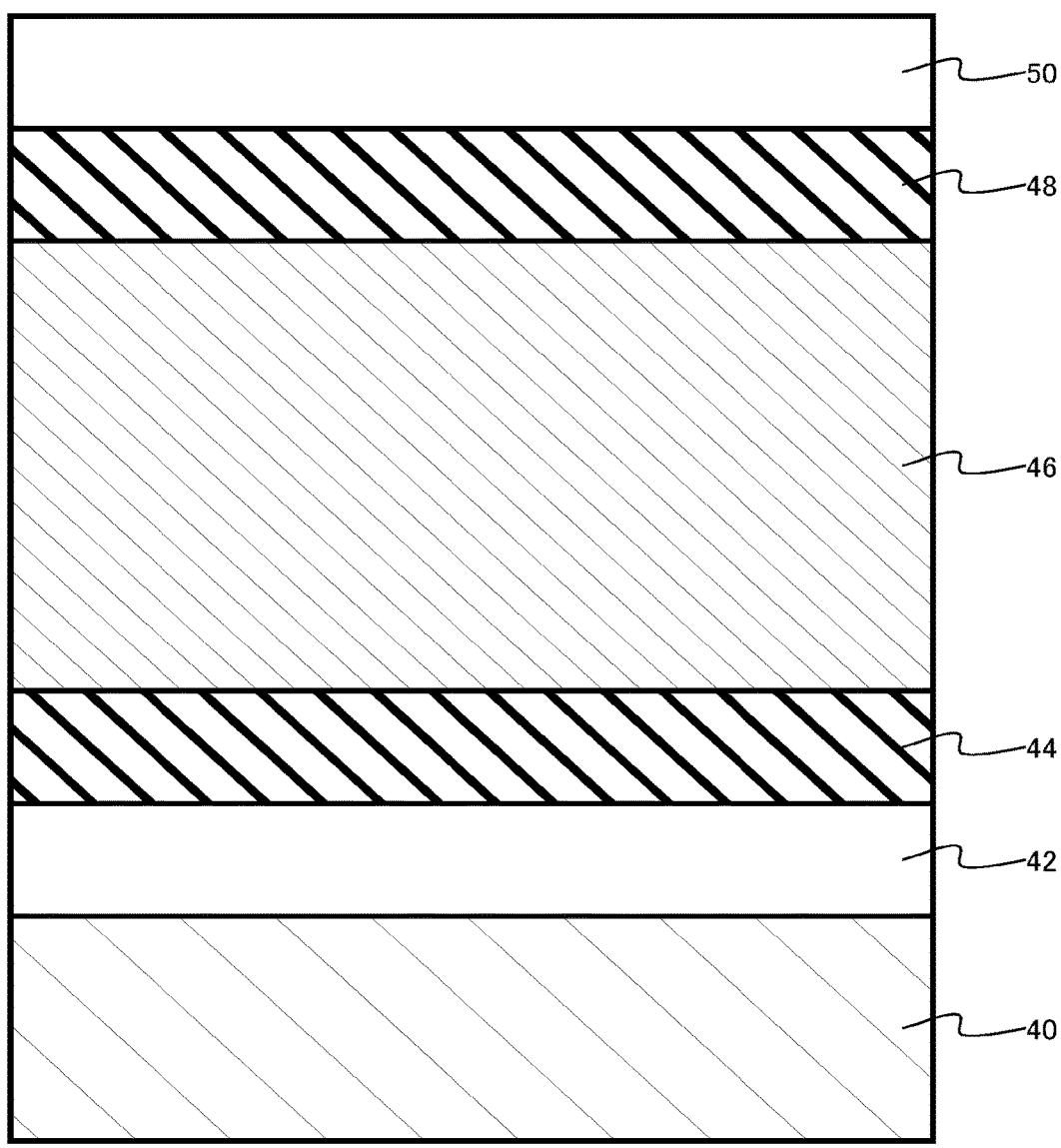
FIG. 23 is a schematic sectional view illustrating a semiconductor-device manufacturing method of the second embodiment.

First, a first tungsten film 40, a first silicon oxide film 42, a first silicon nitride film 44, a polycrystalline silicon film 46, a second silicon nitride film 48, and a second silicon oxide film 50 are formed sequentially in the stated order (FIG. 23). The first tungsten film 40, the first silicon oxide film 42, the first silicon nitride film 44, the polycrystalline silicon film 46, the second silicon nitride film 48, and the second silicon oxide film 50 are formed by a CVD process, for example.

Figure 24:
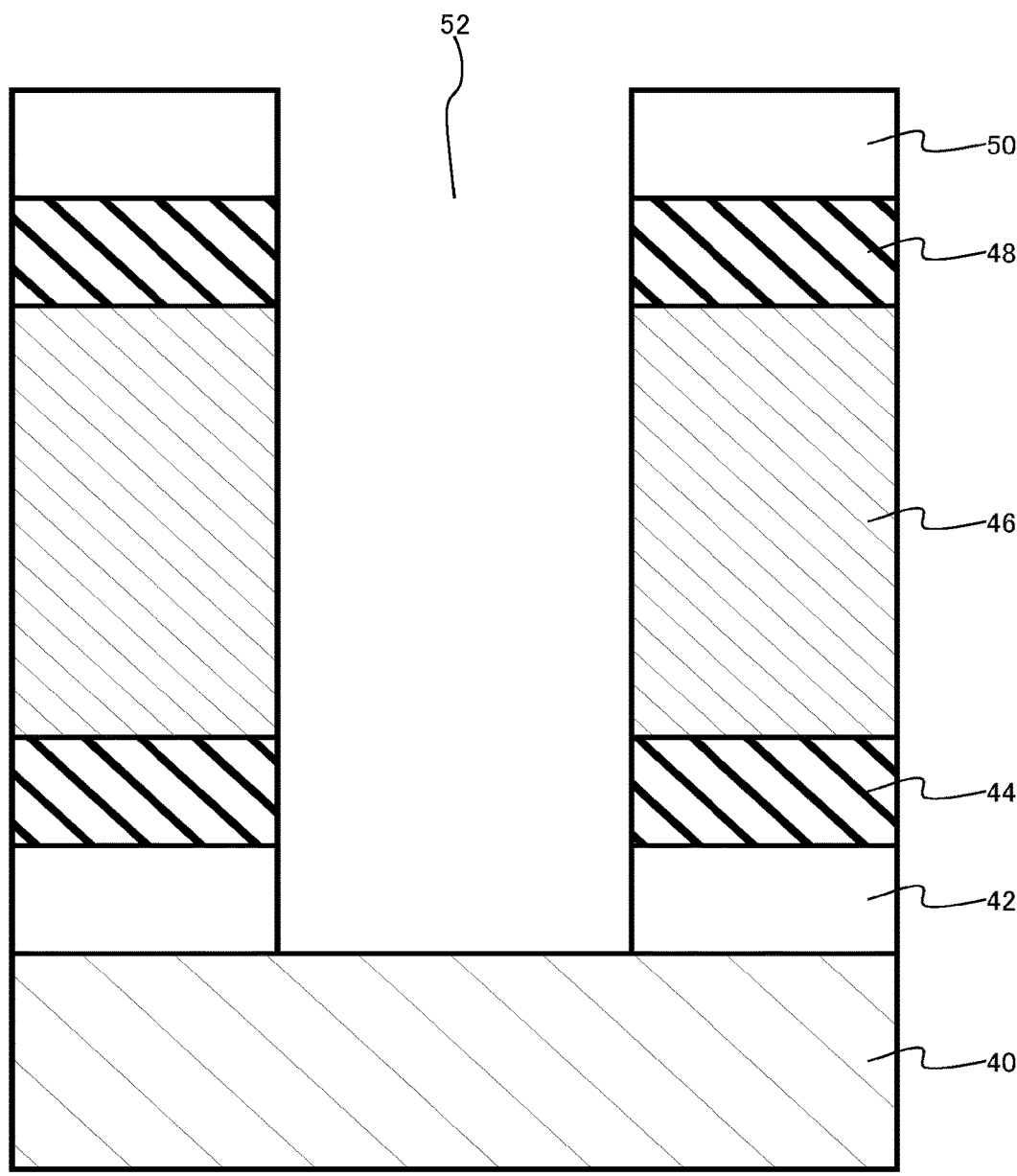
FIG. 24 is a schematic sectional view illustrating the semiconductor-device manufacturing method of the second embodiment.

Subsequently, boring is performed from the surface of the second silicon oxide film 50 to form a first opening 52 extending to the first tungsten film 40 (FIG. 24). The first opening 52 is formed using a lithography process and a RIE process, for example.

Figure 25:
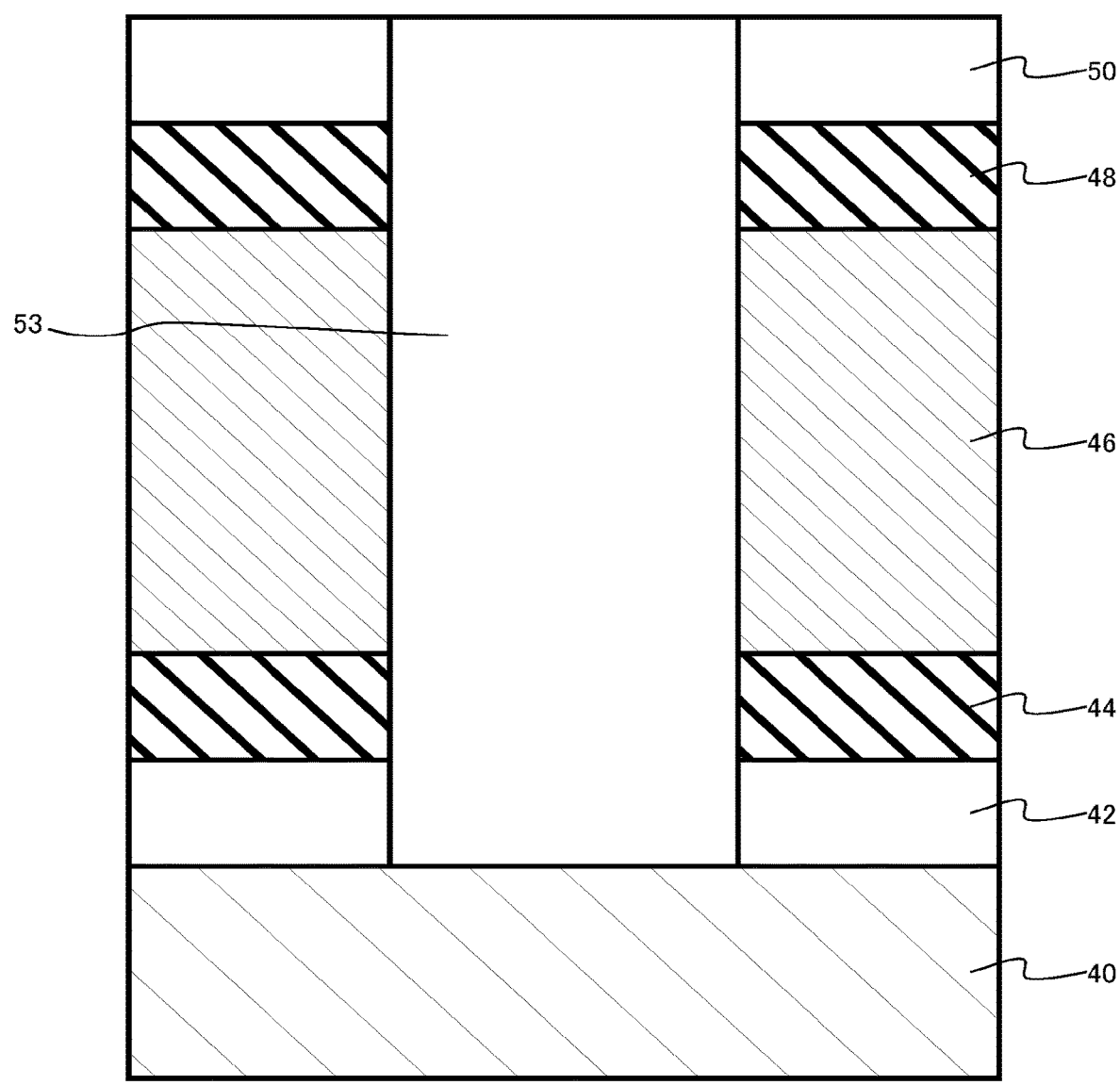
FIG. 25 is a schematic sectional view illustrating the semiconductor-device manufacturing method of the second embodiment.

Subsequently, an oxide semiconductor film 53 is buried in the first opening 52 (FIG. 25). The oxide semiconductor film 53 includes indium (In), gallium (Ga), and zinc (Zn), for example.

Figure 26:
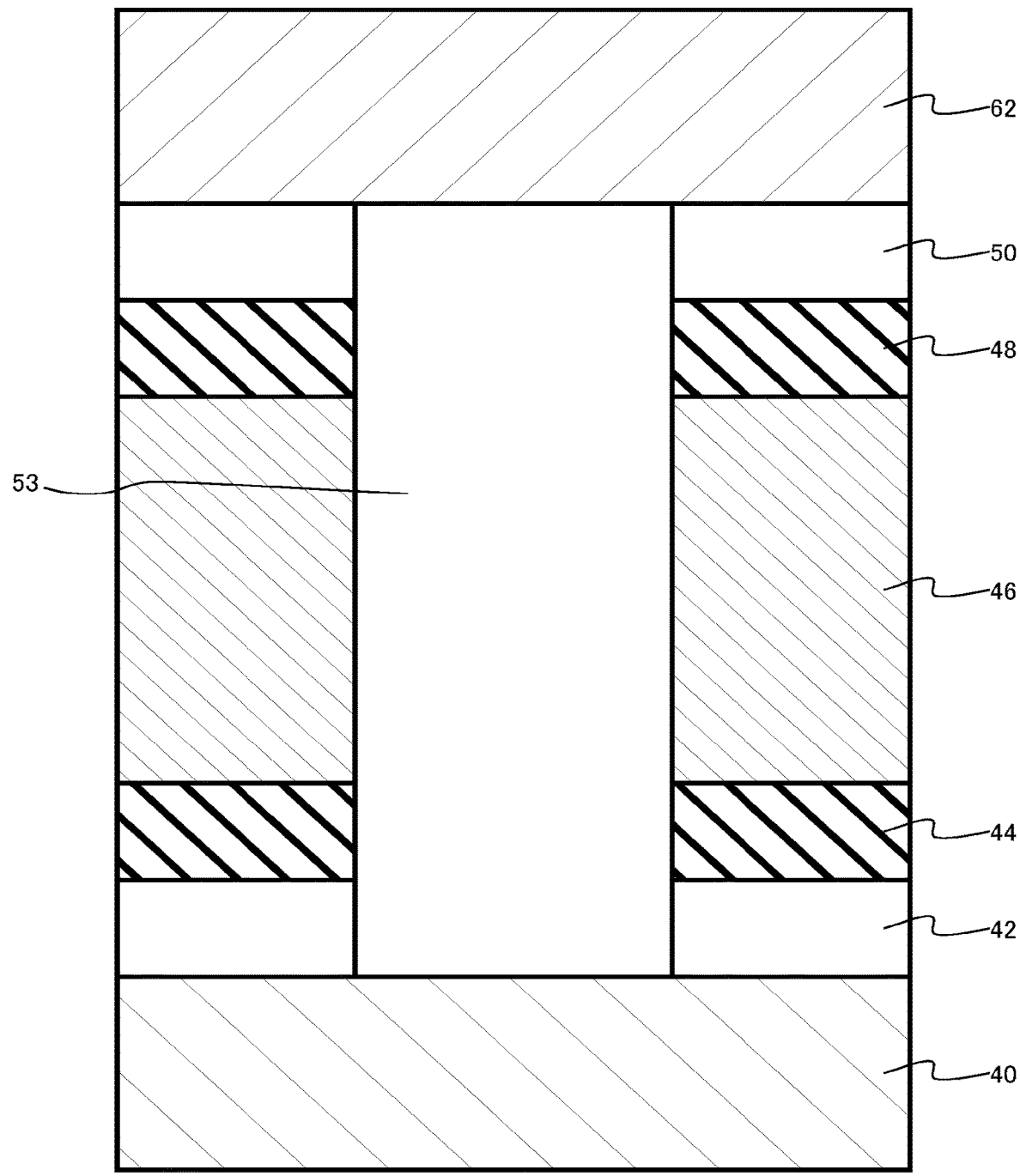
FIG. 26 is a schematic sectional view illustrating the semiconductor-device manufacturing method of the second embodiment.

Subsequently, a second tungsten film 62 is formed on the second silicon oxide film 50 and the oxide semiconductor film 53 (FIG. 26). The second tungsten film 62 is formed by a CVD process, for example.

Figure 27:
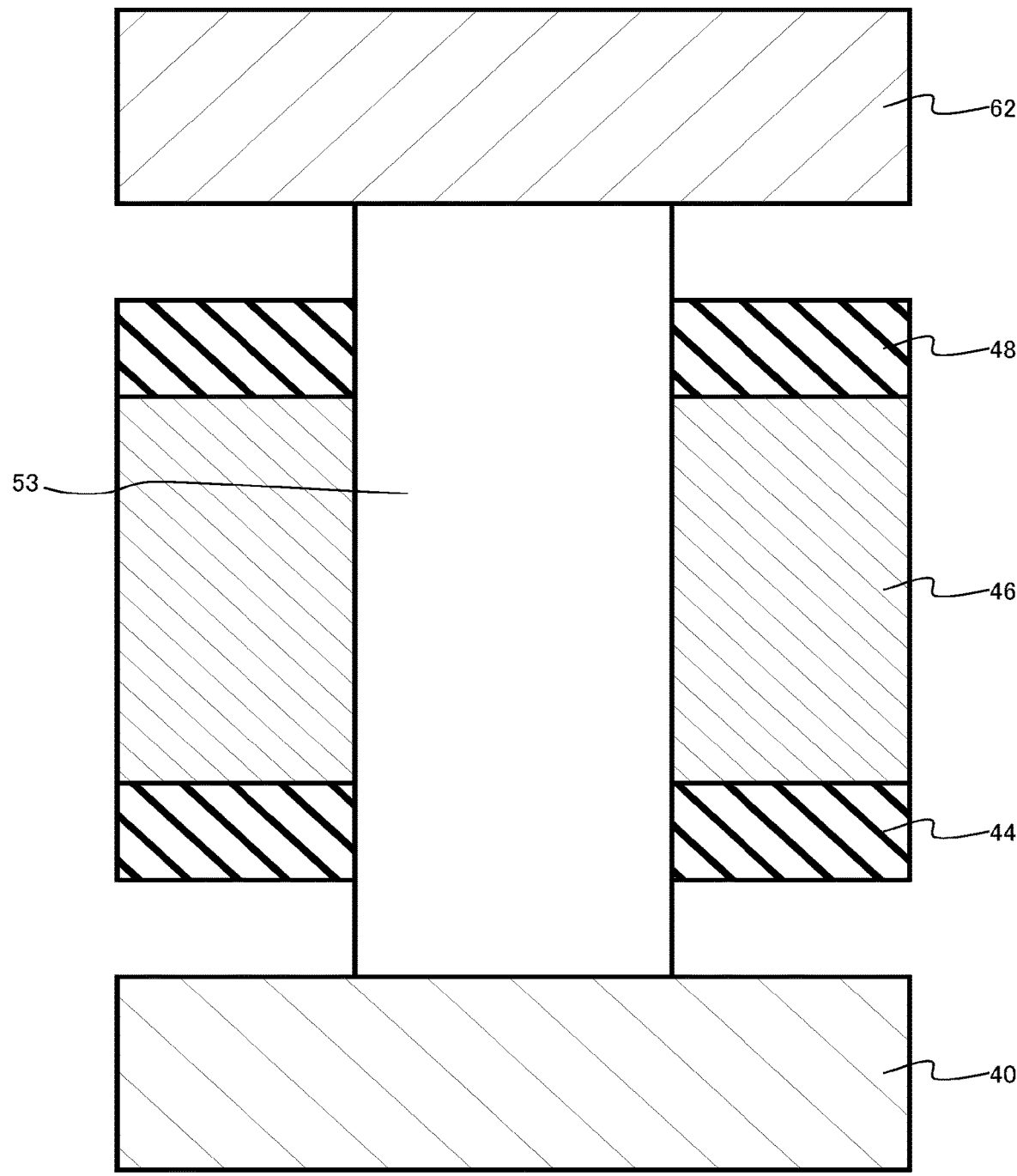
FIG. 27 is a schematic sectional view illustrating the semiconductor-device manufacturing method of the second embodiment.

Subsequently, the first silicon oxide film 42 and the second silicon oxide film 50 are removed (FIG. 27). The first silicon oxide film 42 and the second silicon oxide film 50 are removed by a wet etching process, for example.

Figure 28:
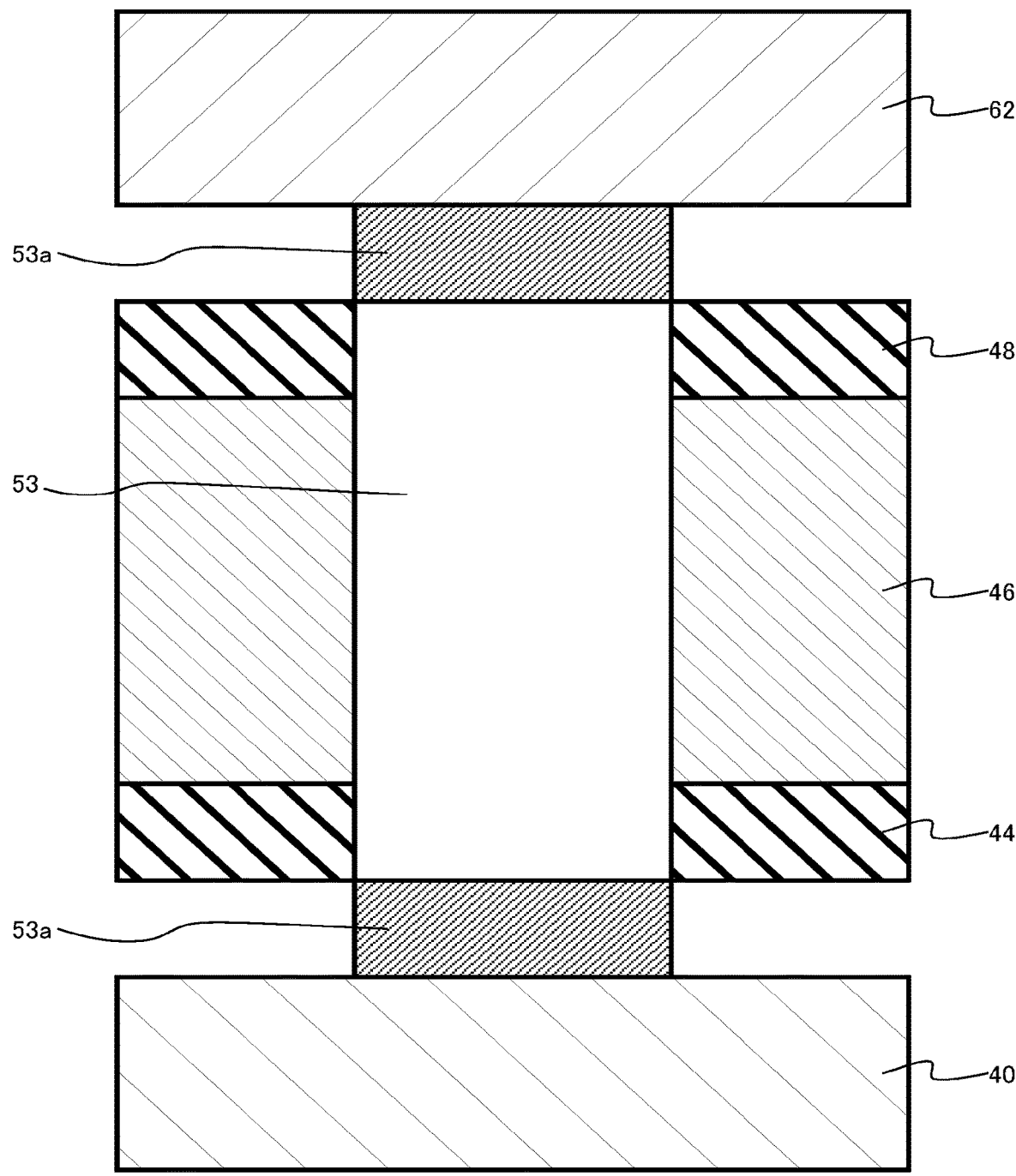
FIG. 28 is a schematic sectional view illustrating the semiconductor-device manufacturing method of the second embodiment.

Subsequently, an exposed portion of the oxide semiconductor film 53 is subjected to a process for reducing the resistance of the oxide semiconductor film 53, thereby forming a first low-resistance region 53a (FIG. 28).

The first low-resistance region 53a is formed by heat treatment in an atmosphere including at least one predetermined element selected from the group consisting of indium (In), silicon (Si), and tin (Sn), for example. The heat treatment causes the predetermined element to be introduced into the oxide semiconductor film 53. Further, the first low-resistance region 53a is formed through generation of an oxide vacancy by hydrogen annealing, for example.

Figure 29:
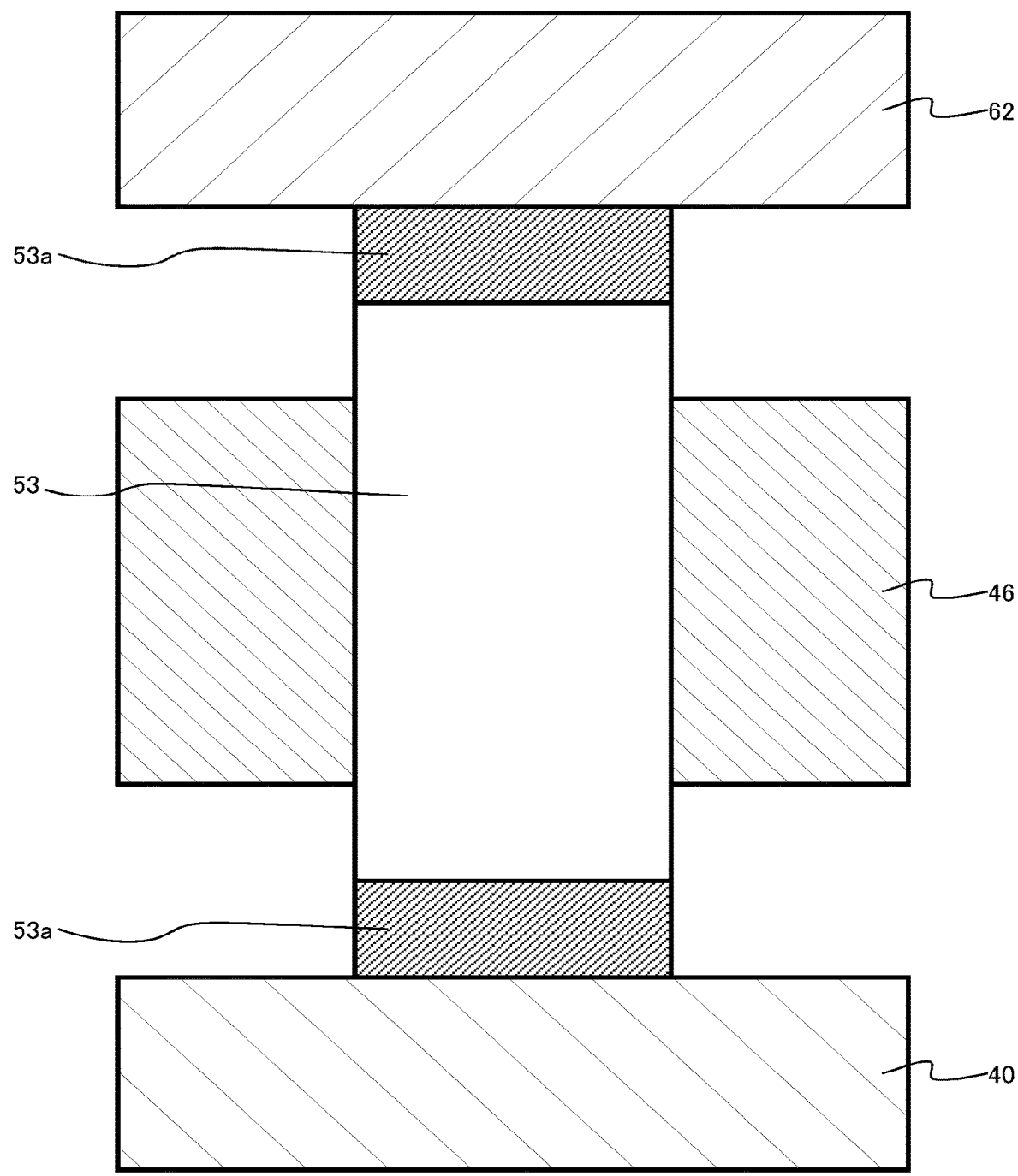
FIG. 29 is a schematic sectional view illustrating the semiconductor-device manufacturing method of the second embodiment.

Subsequently, the first silicon nitride film 44 and the second silicon nitride film 48 are removed (FIG. 29). The first silicon nitride film 44 and the second silicon nitride film 48 are removed by a wet etching process, for example.

Figure 30:
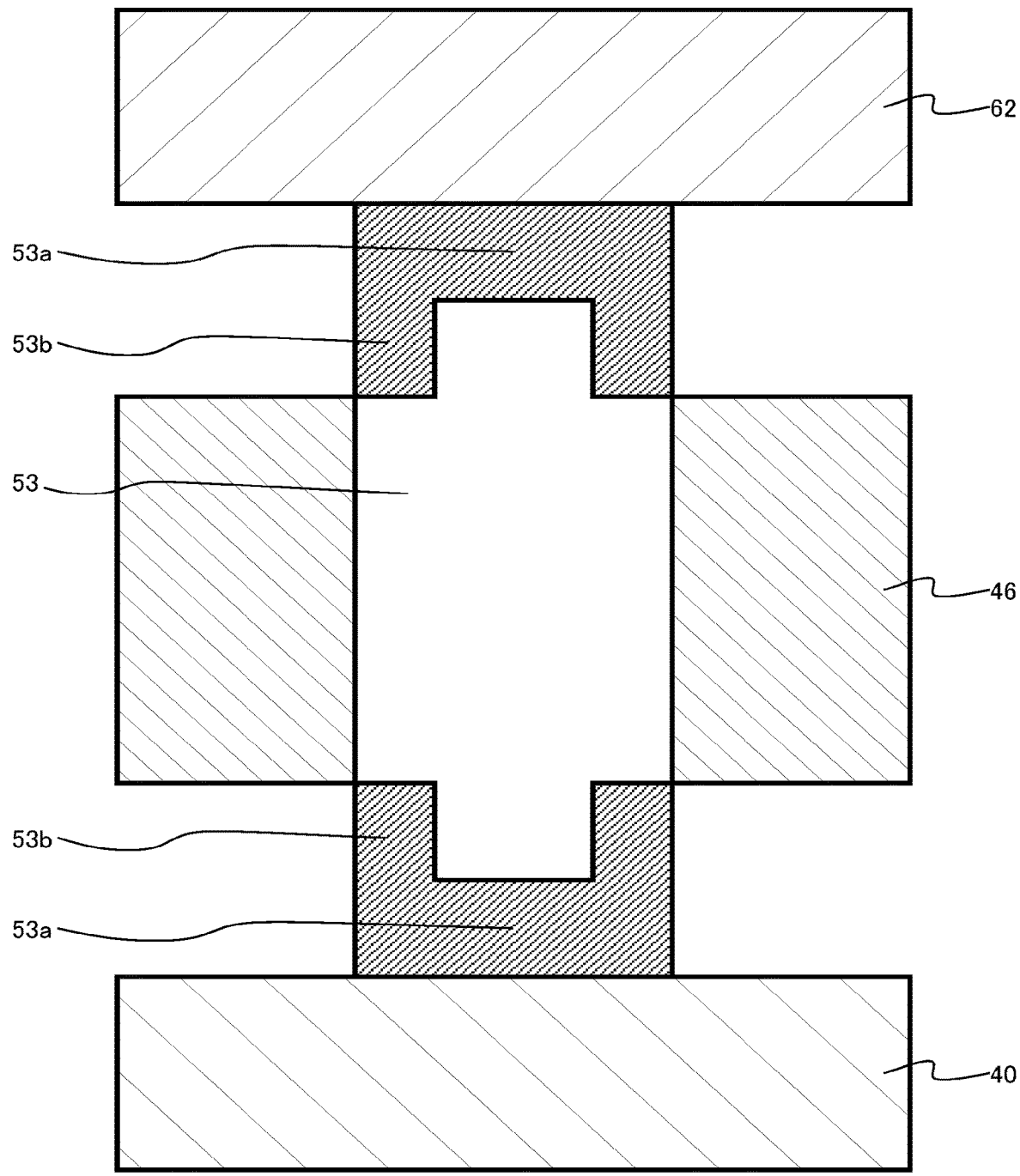
FIG. 30 is a schematic sectional view illustrating the semiconductor-device manufacturing method of the second embodiment.

Subsequently, an exposed portion of the oxide semiconductor film 53 is subjected to a process for reducing the resistance of the oxide semiconductor film 53, thereby forming a second low-resistance region 53b (FIG. 30).

The second low-resistance region 53b is formed by heat treatment in an atmosphere including at least one predetermined element selected from the group consisting of indium (In), silicon (Si), and tin (Sn), for example. Further, the second low-resistance region 53b is formed through generation of an oxide vacancy by hydrogen annealing, for example.

Figure 31:
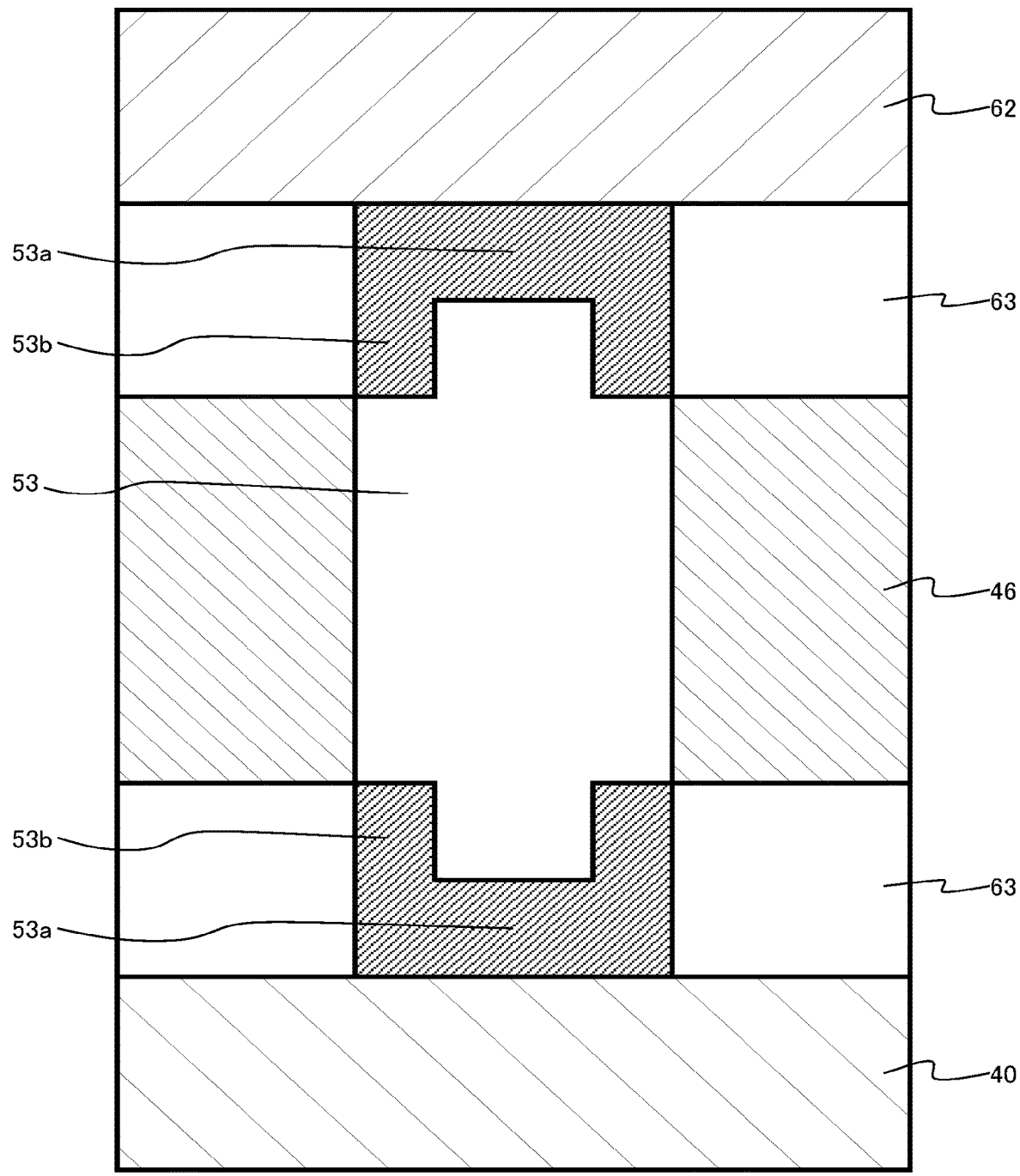
FIG. 31 is a schematic sectional view illustrating the semiconductor-device manufacturing method of the second embodiment.

Subsequently, a third silicon oxide film 63 is formed so as to cover an exposed portion of the oxide semiconductor film 53 (FIG. 31). The third silicon oxide film 63 is formed by a CVD process, for example.

Figure 32:
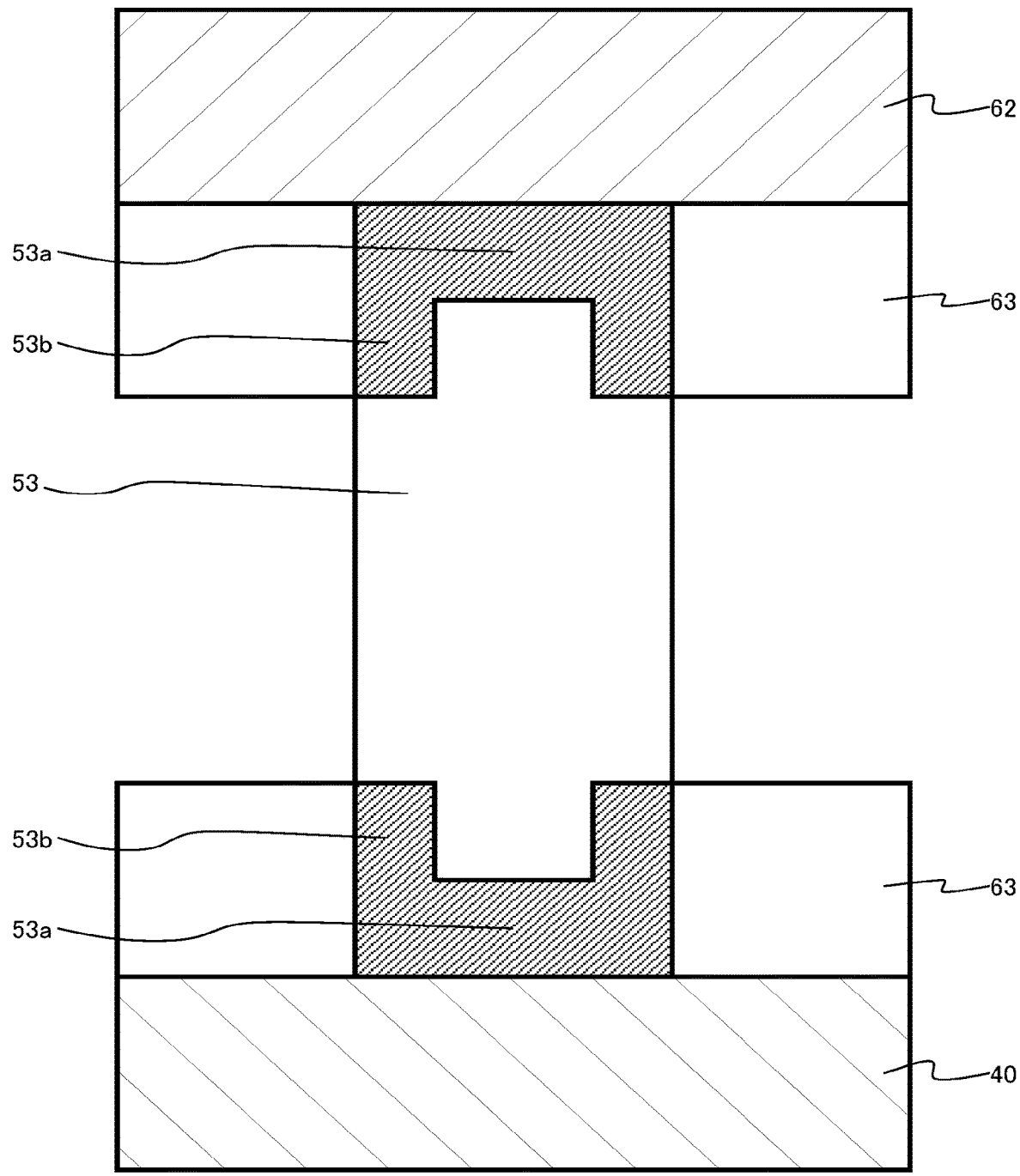
FIG. 32 is a schematic sectional view illustrating the semiconductor-device manufacturing method of the second embodiment.

Subsequently, the polycrystalline silicon film 46 is removed (FIG. 32). The polycrystalline silicon film 46 is removed by a wet etching process, for example. The oxide semiconductor film 53 is partially exposed.

Figure 33:
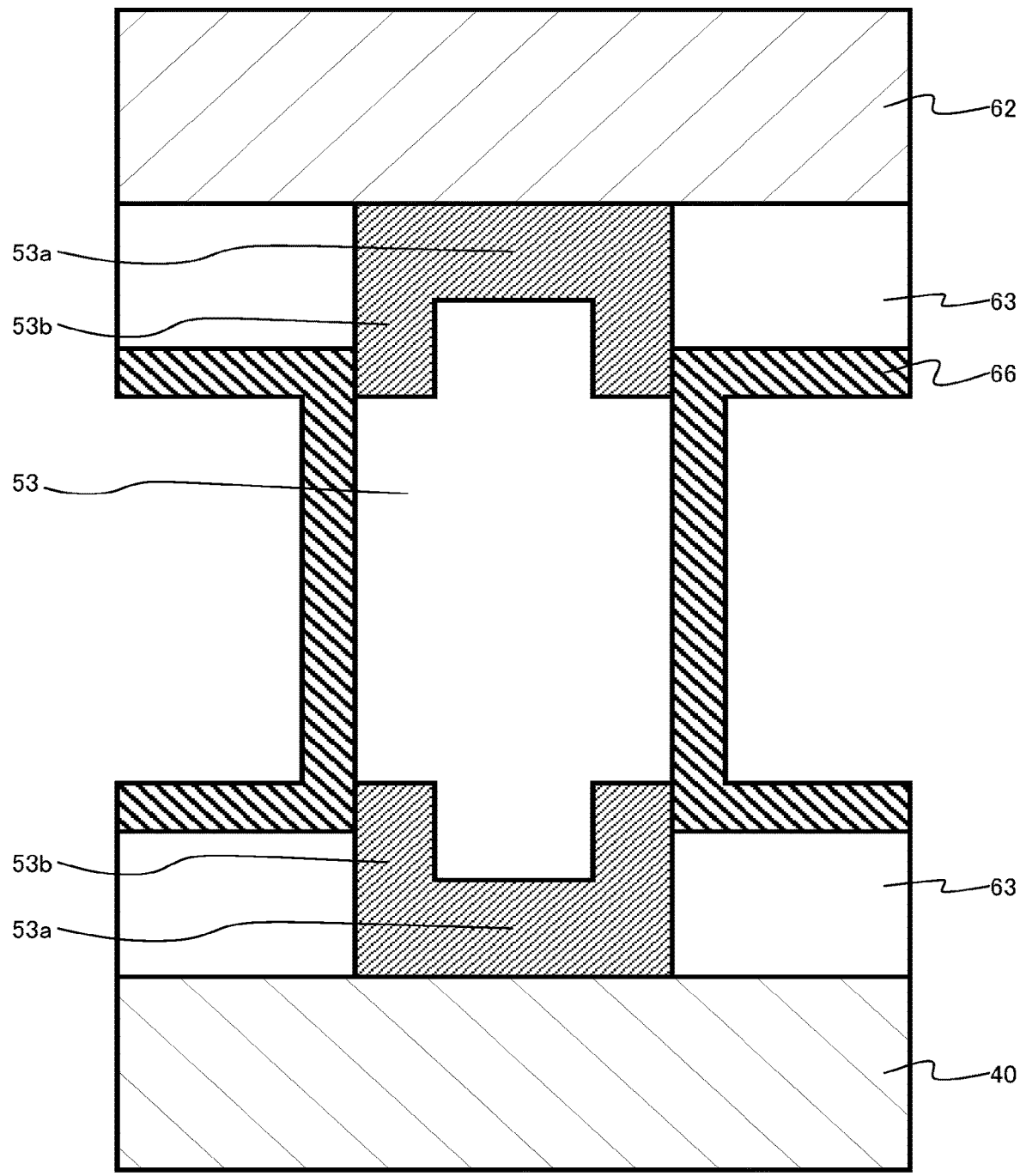
FIG. 33 is a schematic sectional view illustrating the semiconductor-device manufacturing method of the second embodiment.

Subsequently, a fourth silicon oxide film 66 is formed so as to be in contact with the exposed portion of the oxide semiconductor film 53 (FIG. 33). The fourth silicon oxide film 66 is formed by a CVD process, for example. The fourth silicon oxide film 66 serves as the gate insulating layer 22.

Figure 34:
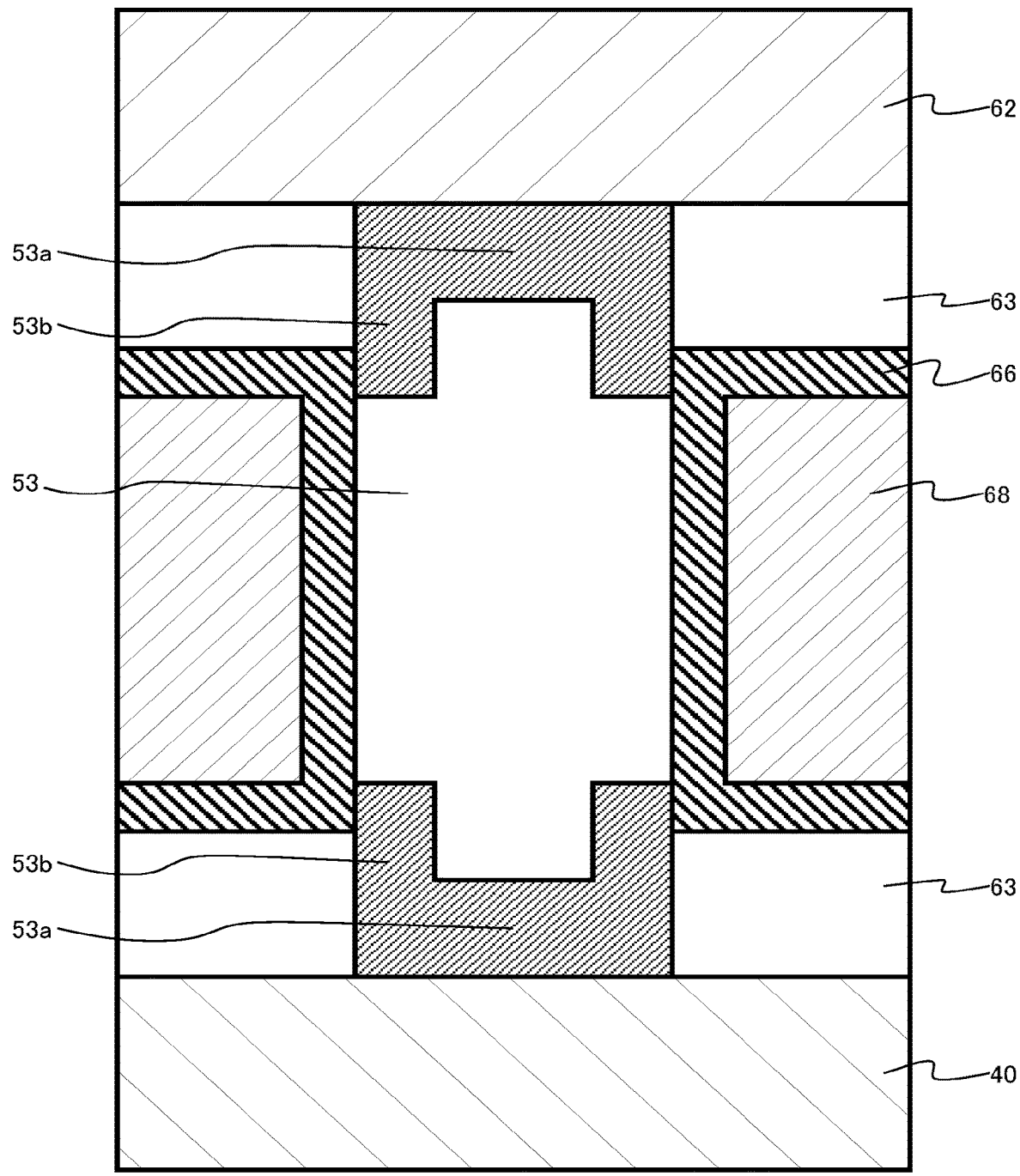
FIG. 34 is a schematic sectional view illustrating the semiconductor-device manufacturing method of the second embodiment.

Subsequently, a third tungsten film 68 is formed so as to be in contact with the fourth silicon oxide film 66 (FIG. 34). The third tungsten film 68 is formed by a CVD process, for example. The third tungsten film 68 serves as the gate electrode 20.

By the above-described manufacturing method, the transistor 200 illustrated in FIG. 20 is formed.

In the transistor 200 of the second embodiment, a distance (d4 in FIG. 20) between the source region 14 and the drain region 16 in a portion remote from the gate electrode 20 in the channel region 18, i.e., in the core portion 18b, is larger than a distance (d3 in FIG. 20) between the source region 14 and the drain region 16 in the surface portion 18a immediately below the gate electrode 20. Thus, a leakage current is unlikely to flow in a portion remote from the gate electrode 20 in the channel region 18. Therefore, it is easy to reduce an off-leakage current.

Further, each of the source region 14 and the drain region 16 of the transistor 200 of the second embodiment is an oxide semiconductor with low electrical resistance. For this reason, it is easy to reduce contact resistance between the source electrode 10 and the source region 14. For the same reasons, it is easy to reduce contact resistance between the drain electrode 12 and the drain region 16. Therefore, it is easy to reduce on-resistance.

The transistor 200 of the second embodiment can reduce an off-leakage current and can reduce on-resistance as compared to the transistor 900 of the comparative example in the first embodiment.

Figure 35:
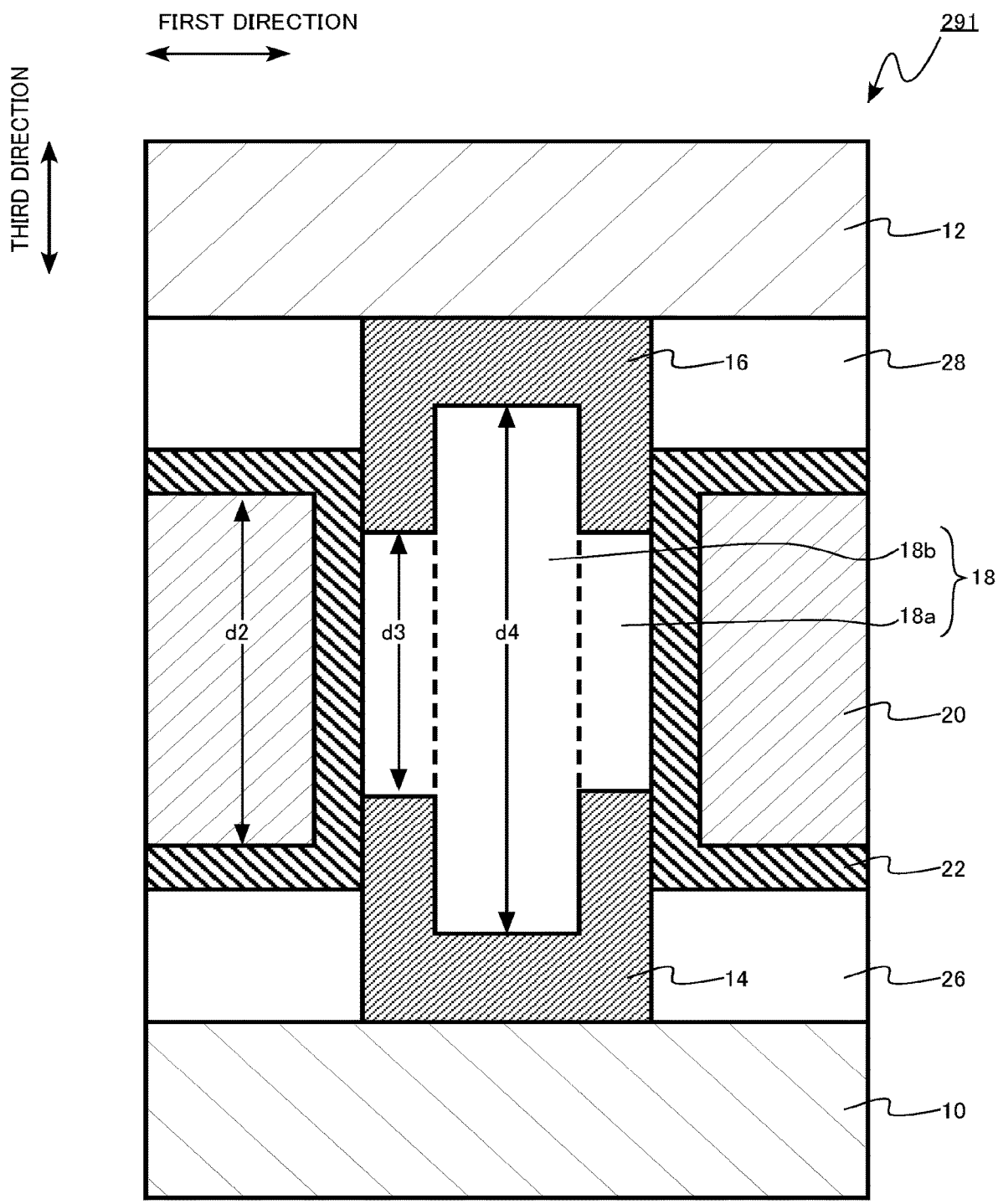
FIG. 35 is a schematic sectional view of a semiconductor device of a first modification of the second embodiment.

FIG. 35 is a schematic sectional view of a semiconductor device of a first modification of the second embodiment. The semiconductor device of the first modification is a transistor 291.

The transistor 291 is different from the transistor 200 of the second embodiment in that a part of the source region 14 and the gate electrode 20 positionally overlap each other along the third direction and that a part of the drain region 16 and the gate electrode 20 positionally overlap each other along the third direction. Thus, a distance (d3 in FIG. 35) between respective portions of the source region 14 and the drain region 16 in the surface portion 18a is smaller than a length (d2 in FIG. 35) of the gate electrode 20 along the third direction. The distance d3 between respective portions of the source region 14 and the drain region 16 in the surface portion 18a is equal to or smaller than 0.9 times the length d2 of the gate electrode 20 along the third direction, for example.

In the transistor 291 of the first modification, the source region 14 and the gate electrode 20 overlap each other and the drain region 16 and the gate electrode 20 overlap each other. As a result of this, offsets between the source region 14 and the gate electrode 20 and between the drain region 16 and the gate electrode 20 due to variation in process, for example, are unlikely to occur. Therefore, a transistor with stable on-resistance can be achieved.

Figure 36:
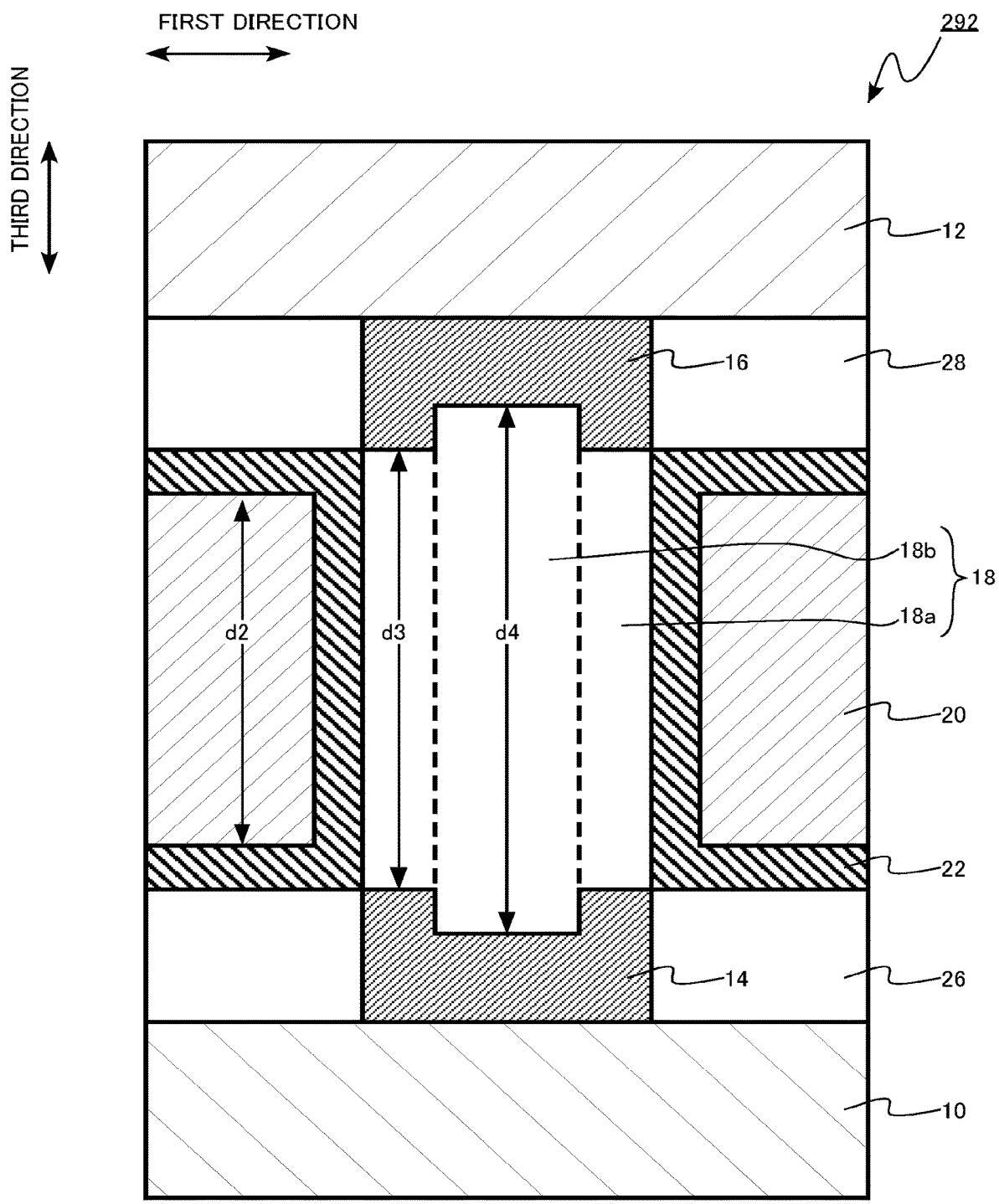
FIG. 36 is a schematic sectional view of a semiconductor device of a second modification of the second embodiment.

FIG. 36 is a schematic sectional view of a semiconductor device of a second modification of the second embodiment. The semiconductor device of the second modification is a transistor 292.

The transistor 292 is different from the transistor 200 of the second embodiment in that the source region 14 and the gate electrode 20 do not positionally overlap each other along the third direction and in that the drain region 16 and the gate electrode 20 do not positionally overlap each other along the third direction. Thus, a distance (d3 in FIG. 36) between respective portions of the source region 14 and the drain region 16 in the surface portion 18a is larger than a length (d2 in FIG. 36) of the gate electrode 20 along the third direction. The distance d3 between respective portions of the source region 14 and the drain region 16 in the surface portion 18a is equal to or larger than 1.1 times the length d2 of the gate electrode 20 along the third direction.

In the transistor 292 of the second modification, the source region 14 and the gate electrode 20, as well as the drain region 16 and the gate electrode 20, are displaced with respect to each other. Therefore, a transistor with a further reduced off-leakage current can be achieved.

As described above, according to the second embodiment, a transistor that can reduce an off-leakage current and can reduce on-resistance can be achieved.

Third Embodiment

A semiconductor device of a third embodiment includes a first electrode, a second electrode, a ring-shaped first oxide semiconductor region provided between the first electrode and the second electrode, a ring-shaped second oxide semiconductor region provided between the first oxide semiconductor region and the second electrode, a third oxide semiconductor region at least partly provided between the first oxide semiconductor region and the second oxide semiconductor region, the third oxide semiconductor region having electrical resistance higher than those of the first oxide semiconductor region and the second oxide semiconductor region, a gate electrode surrounding the third oxide semiconductor region, a gate insulating layer provided between the third oxide semiconductor region and the gate electrode, a first insulating layer provided between the first electrode and the gate electrode, the first insulating layer including a first dielectric having a dielectric constant higher than that of silicon oxide, and a second insulating layer provided between the second electrode and the gate electrode, the second insulating layer including a second dielectric having a dielectric constant higher than that of silicon oxide.

Figure 37:
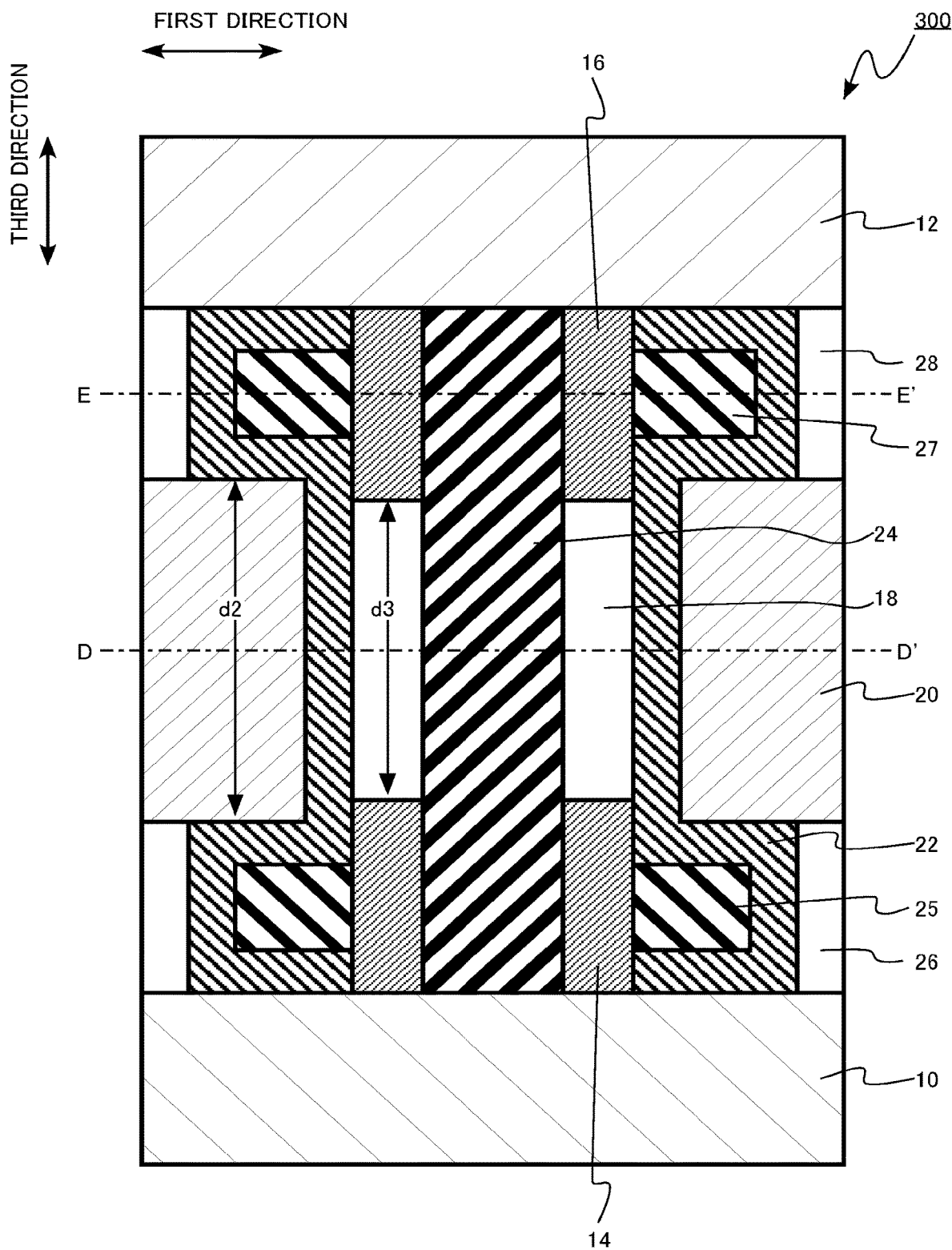
FIG. 37 is a schematic sectional view of a semiconductor device of a third embodiment.
Figure 38:
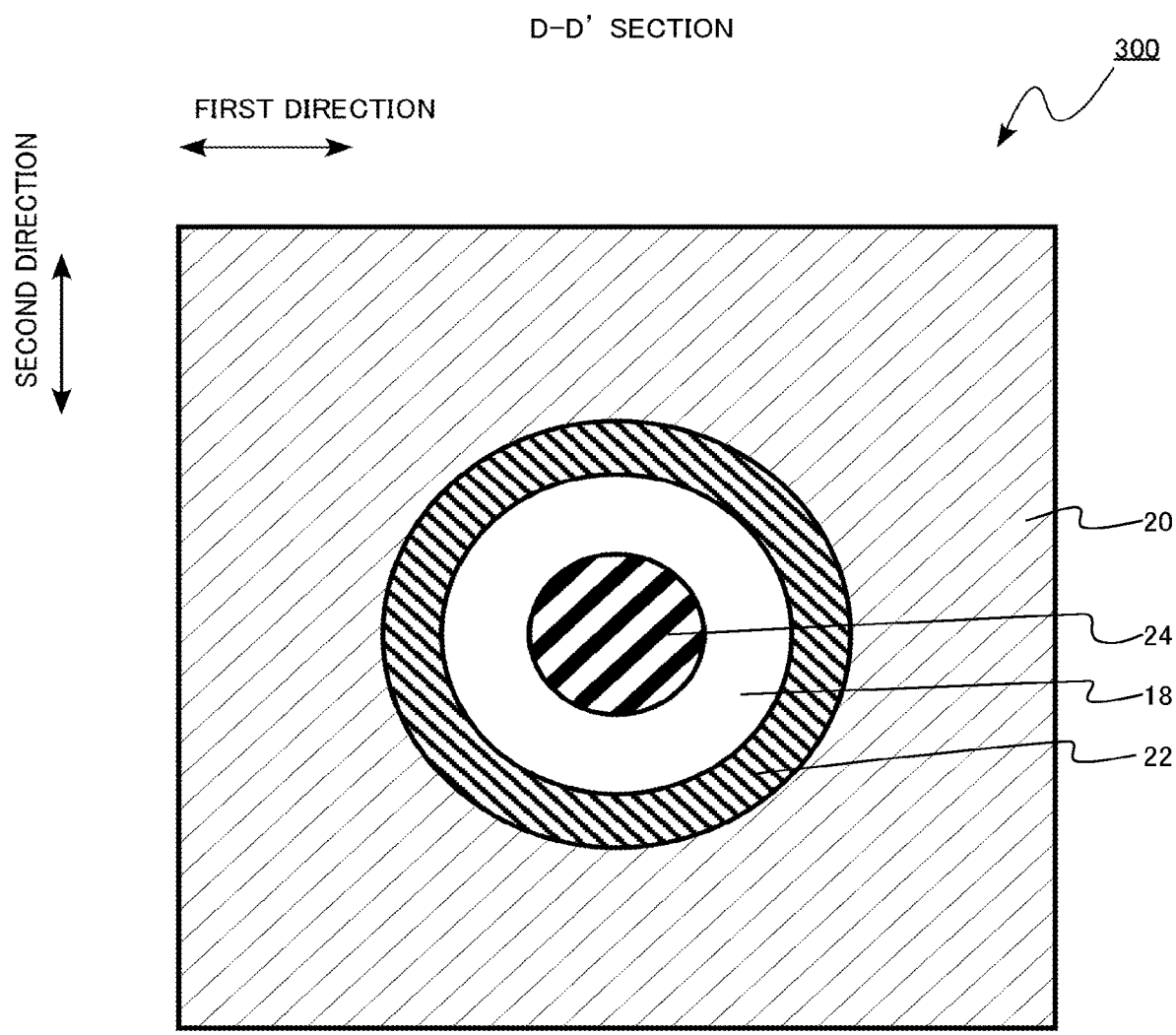
FIG. 38 is a schematic sectional view of the semiconductor device of the third embodiment.
Figure 39:
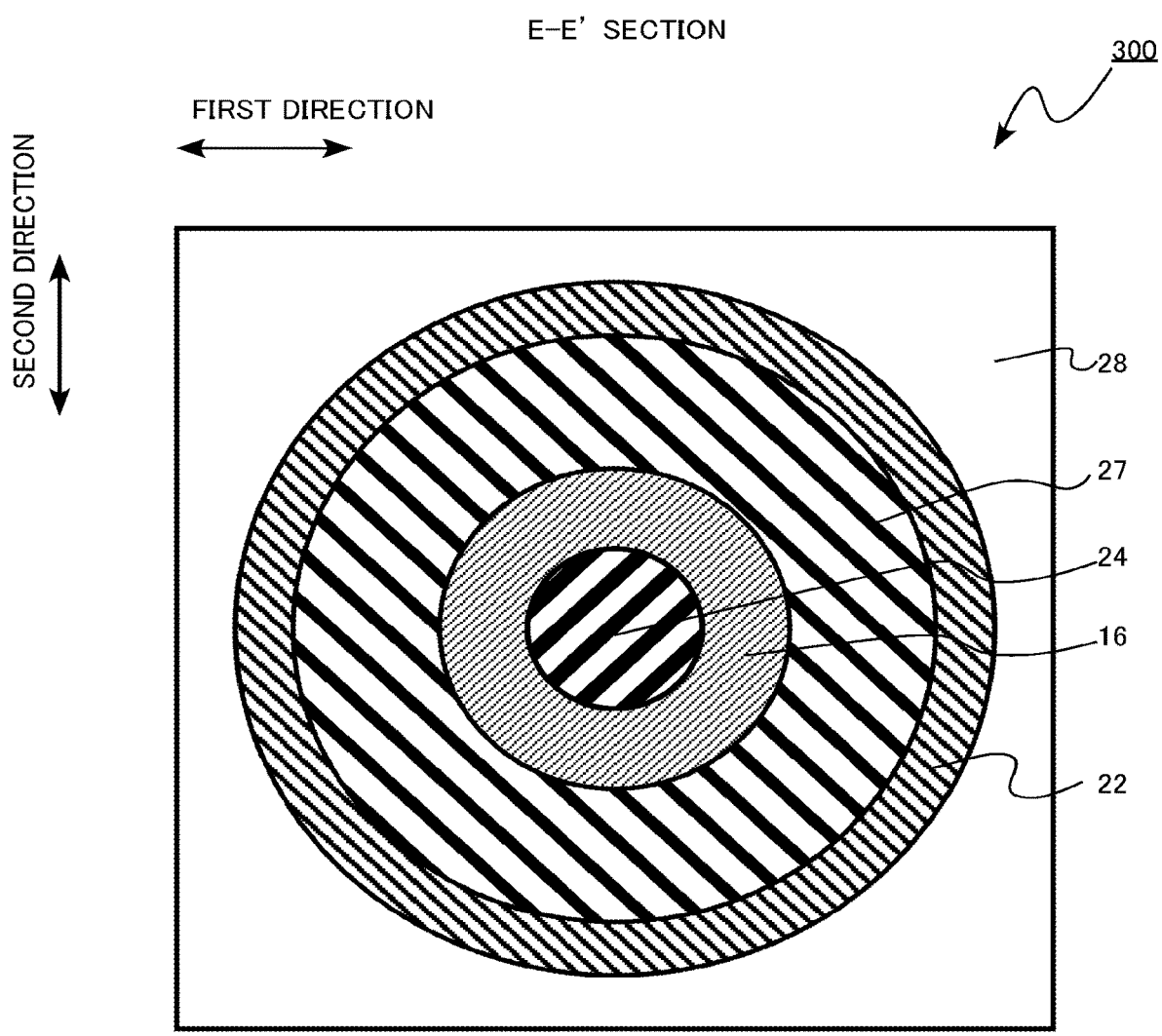
FIG. 39 is a schematic sectional view of the semiconductor device of the third embodiment.

FIGS. 37 to 39 are schematic sectional views of the semiconductor device of the third embodiment. FIG. 38 is a sectional view taken along D-D' in FIG. 37. FIG. 39 is a sectional view taken along E-E' in FIG. 37. In FIG. 37, a horizontal direction is referred to as a first direction, a depth direction is referred to as a second direction, and a vertical direction is referred to as a third direction.

The semiconductor device of the third embodiment is a transistor 300. The transistor 300 is an oxide semiconductor transistor in which a channel is formed in an oxide semiconductor. In the transistor 300, a gate electrode is provided so as to surround an oxide semiconductor in which a channel is formed. The transistor 300 is a so-called SGT. The transistor 300 is a so-called vertical transistor.

The transistor 300 includes a source electrode 10, a drain electrode 12, a source region 14, a drain region 16, a channel region 18, a gate electrode 20, a gate insulating layer 22, a core insulating region 24, a first high-dielectric-constant insulating layer 25, a second high-dielectric-constant insulating layer 27, a first interlayer insulating layer 26, and a second interlayer insulating layer 28.

The source electrode 10 is one example of the first electrode. The drain electrode 12 is one example of the second electrode. The source region 14 is one example of the first oxide semiconductor region. The drain region 16 is one example of the second oxide semiconductor region. The channel region 18 is one example of the third oxide semiconductor region. The core insulating region 24 is one example of the insulating region. The first high-dielectric-constant insulating layer 25 is one example of the first insulating layer. The second high-dielectric-constant insulating layer 27 is one example of the second insulating layer.

The source electrode 10 is a metal or a metallic compound, for example. The source electrode 10 is tungsten (W), for example.

The drain electrode 12 is a metal or a metallic compound, for example. The drain electrode 12 is tungsten (W), for example.

The source region 14 is provided between the source electrode 10 and the drain electrode 12. The source region 14 and the source electrode 10 are in contact with each other. The source region 14 and the source electrode 10 are electrically connected.

The source region 14 is ring-shaped. The source region 14 is ring-shaped in a plane parallel to the first direction and the second direction. The source region 14 surrounds the core insulating region 24. The source region 14 is in contact with the core insulating region 24.

The source region 14 is an oxide semiconductor. The source region 14 includes at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn), and oxygen (O). The source region 14 is amorphous, for example.

The drain region 16 is provided between the source region 14 and the drain electrode 12. The drain region 16 is in contact with the drain electrode 12. The drain region 16 is electrically connected to the drain electrode 12.

The drain region 16 is ring-shaped. The drain region 16 is ring-shaped in a plane parallel to the first direction and the second direction. The drain region 16 surrounds the core insulating region 24. The drain region 16 is in contact with the core insulating region 24.

The drain region 16 is an oxide semiconductor. The drain region 16 includes at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn), and oxygen (O).

The drain region 16 is formed of the same oxide semiconductor as that forming the source region 14. The drain region 16 includes the same metallic element as that included in the source region 14. The drain region 16 is amorphous, for example.

The channel region 18 is provided between the source region 14 and the drain region 16. The channel region 18 is in contact with the source region 14 and the drain region 16.

The channel region 18 is ring-shaped. The channel region 18 is ring-shaped in a plane parallel to the first direction and the second direction. The channel region 18 surrounds the core insulating region 24. The channel region 18 is tube-shaped, for example.

The channel region 18 is spaced apart from the source electrode 10. The channel region 18 is spaced apart from the drain electrode 12.

In the channel region 18, a channel serving as a current path during on-operation of the transistor 300 is formed. The channel region 18 extends along a direction toward the drain electrode 12 from the source electrode 10, that is, along the third direction. During on-operation of the transistor 300, a current flows along the third direction in the channel region 18.

The channel region 18 is an oxide semiconductor. The channel region 18 includes at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn), and oxygen (O).

The channel region 18 is formed of the same oxide semiconductor as that forming the source region 14 and the drain region 16. The channel region 18 includes the same metallic element as that included in the source region 14 and the drain region 16. The channel region 18 is amorphous, for example.

The channel region 18 has electrical resistance higher than the electrical resistance of the source region 14. The channel region 18 has electrical resistance higher than the electrical resistance of the drain region 16.

In other words, the source region 14 has electrical resistance lower than the electrical resistance of the channel region 18. The drain region 16 has electrical resistance lower than the electrical resistance of the channel region 18.

The channel region 18 has a carrier concentration lower than the carrier concentration of the source region 14. The channel region 18 has a carrier concentration lower than the carrier concentration of the drain region 16.

In other words, the source region 14 has a carrier concentration higher than the carrier concentration of the channel region 18. The drain region 16 has a carrier concentration higher than the carrier concentration of the channel region 18.

The source region 14 and the drain region 16 include an oxide vacancy. The channel region 18 either includes an oxide vacancy or does not include an oxide vacancy. The concentration of oxide vacancy in the source region 14 and the drain region 16 is higher than the concentration of oxide vacancy in the channel region 18.

The oxide vacancy functions as a donor that emits electrons in an oxide semiconductor.

The source region 14, the drain region 16, and the channel region 18 include indium (In), gallium (Ga), zinc (Zn), and oxygen (O), for example.

The source region 14 and the drain region 16 have an oxygen concentration lower than the oxygen concentration of the channel region 18.

The atomic ratio of a sum of indium, gallium and zinc in metallic elements included in the source region 14, the drain region 16, and the channel region 18 is, for example, 90% or higher. For example, the source region 14 and the drain region 16 do not include any element that has a higher atomic ratio than any of indium, gallium, and zinc.

The atomic ratio of a sum of indium, gallium, and zinc in metallic elements included in the source region 14, the drain region 16, and the channel region 18 is, for example, 90% or higher. The atomic ratio of a sum of indium, gallium, and zinc in elements included in the channel region 18 except oxygen, is, for example, 90% or higher. For example, the channel region 18 does not include any element that has a higher atomic ratio than any of indium, gallium, and zinc, except oxygen.

The gate electrode 20 is provided so as to surround the channel region 18. The gate electrode 20 is provided around the channel region 18.

The gate electrode 20 is a metal, a metallic compound, or a semiconductor, for example. The gate electrode 20 is tungsten (W), for example. A length (d2 in FIG. 37) of the gate electrode 20 along the third direction is equal to or larger than 20 nm and is equal to or smaller than 100 nm, for example. The length d2 of the gate electrode 20 along the third direction is the gate length of the transistor 300.

A first distance d3 along the third direction between the source region 14 and the drain region 16 between which the channel region 18 is sandwiched is smaller than the length d2 of the gate electrode 20 along the third direction, for example. In other words, a length of the channel region 18 along the third direction is smaller than the length d2 of the gate electrode 20 along the third direction.

The gate electrode 20 is a metal, a metallic compound, or a semiconductor, for example. The gate electrode 20 is tungsten (W), for example.

The gate insulating layer 22 is provided between the channel region 18 and the gate electrode 20. The gate insulating layer 22 is provided so as to surround the channel region 18.

The gate insulating layer 22 is an oxide or an oxynitride, for example. The gate insulating layer 22 is silicon oxide or aluminum oxide, for example. The gate insulating layer 22 has a thickness equal to or larger than 2 nm and is equal to or smaller than 10 nm, for example.

The core insulating region 24 is provided between the source electrode 10 and the drain electrode 12. The core insulating region 24 is surrounded by the source region 14, the drain region 16, and the channel region 18. The core insulating region 24 is cylindrical, for example. The core insulating region 24 and the source electrode 10 are in contact with each other, for example. The core insulating region 24 and the drain electrode 12 are in contact with each other, for example.

The core insulating region 24 is an oxide, a nitride, or an oxynitride, for example. The core insulating region 24 is silicon oxide, silicon nitride, or silicon oxynitride, for example.

The first high-dielectric-constant insulating layer 25 is provided between the source electrode 10 and the gate electrode 20. The gate insulating layer 22 is sandwiched between the gate electrode 20 and the first high-dielectric-constant insulating layer 25. The gate insulating layer 22 is sandwiched between the source electrode 10 and the first high-dielectric-constant insulating layer 25.

The first high-dielectric-constant insulating layer 25 surrounds the source region 14. The first high-dielectric-constant insulating layer 25 is in contact with the source region 14. The first high-dielectric-constant insulating layer 25 is ring-shaped.

The first high-dielectric-constant insulating layer 25 includes a first dielectric having a dielectric constant higher than that of silicon oxide. The first dielectric is an oxide, a nitride, or an oxynitride, for example. The first dielectric is a metal oxide, for example. The first dielectric is hafnium oxide, zirconium oxide, or aluminum oxide, for example. The first dielectric is silicon nitride or silicon oxynitride, for example.

The first dielectric is a compound having a composition deviated from a stoichiometric composition, for example. The first dielectric is a metal oxide including less oxygen than that in a stoichiometric composition, for example.

The second high-dielectric-constant insulating layer 27 is provided between the drain electrode 12 and the gate electrode 20. The gate insulating layer 22 is sandwiched between the gate electrode 20 and the second high-dielectric-constant insulating layer 27. The gate insulating layer 22 is sandwiched between the drain electrode 12 and the second high-dielectric-constant insulating layer 27.

The second high-dielectric-constant insulating layer 27 surrounds the drain region 16. The second high-dielectric-constant insulating layer 27 is in contact with the drain region 16. The second high-dielectric-constant insulating layer 27 is ring-shaped.

The second high-dielectric-constant insulating layer 27 includes a second dielectric having a dielectric constant higher than that of silicon oxide. The second dielectric is an oxide, a nitride, or an oxynitride, for example. The second dielectric is a metal oxide, for example. The second dielectric is hafnium oxide, zirconium oxide, or aluminum oxide, for example. The second dielectric is silicon nitride or silicon oxynitride, for example.

The second dielectric is a compound having a composition deviated from a stoichiometric composition, for example. The second dielectric is a metal oxide including less oxygen than that in a stoichiometric composition, for example.

The first dielectric and the second dielectric are the same substance, for example.

The first interlayer insulating layer 26 is provided between the source electrode 10 and the gate electrode 20. The first interlayer insulating layer 26 is provided around the source region 14 and the first high-dielectric-constant insulating layer 25.

The first interlayer insulating layer 26 is an oxide, a nitride, or an oxynitride, for example. The first interlayer insulating layer 26 is silicon oxide, for example.

The second interlayer insulating layer 28 is provided between the drain electrode 12 and the gate electrode 20. The second interlayer insulating layer 28 is provided around the drain region 16 and the second high-dielectric-constant insulating layer 27.

The second interlayer insulating layer 28 is an oxide, a nitride, or an oxynitride, for example. The second interlayer insulating layer 28 is silicon oxide, for example.

Next, an example of a semiconductor-device manufacturing method of the third embodiment will be described.

FIGS. 40 to 52 are schematic sectional views illustrating the semiconductor-device manufacturing method of the third embodiment. FIGS. 40 to 52 illustrate sections corresponding to the section illustrated in FIG. 37.

Figure 40:
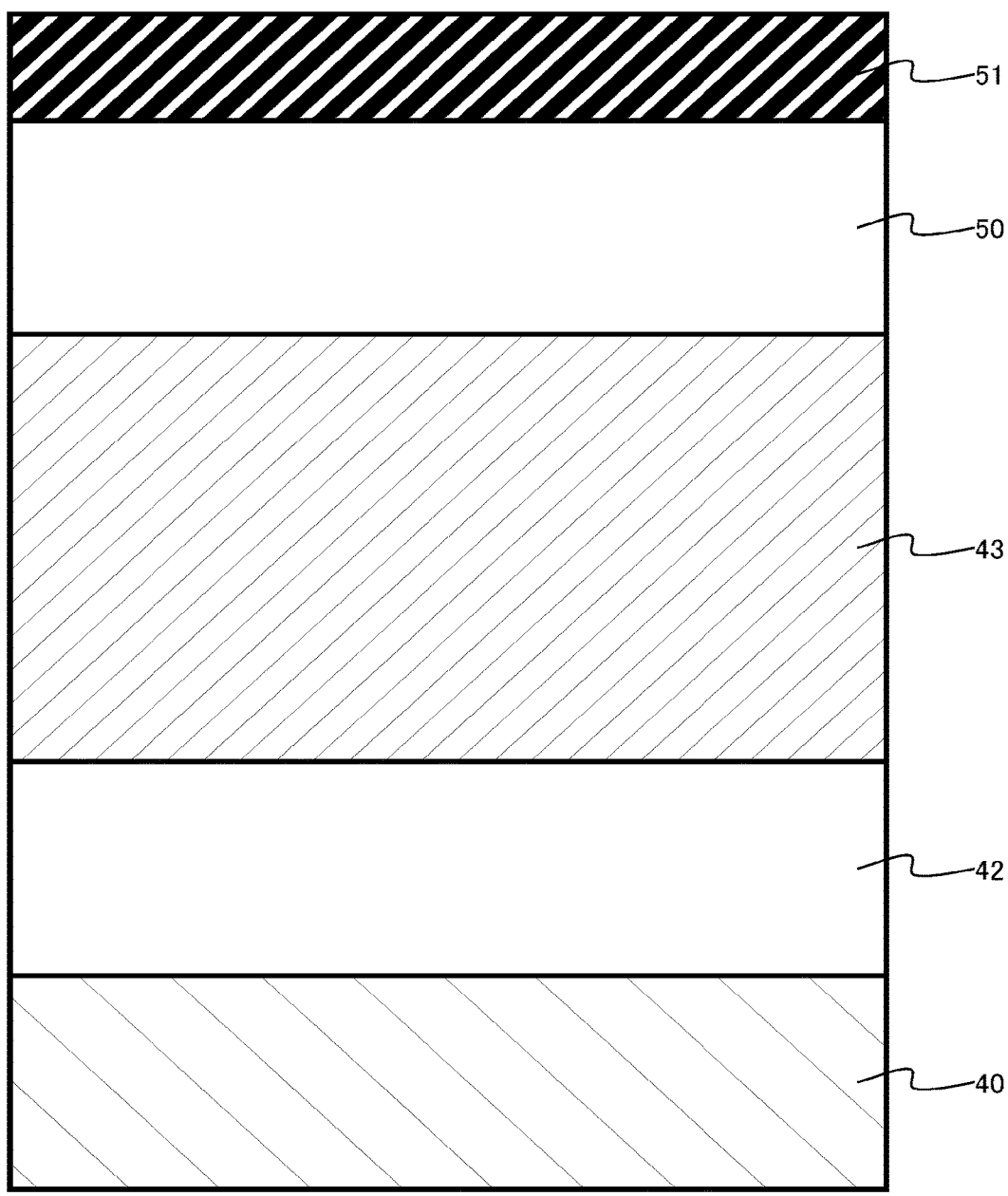
FIG. 40 is a schematic sectional view illustrating a semiconductor-device manufacturing method of the third embodiment.

First, a first tungsten film 40, a first silicon oxide film 42, a second tungsten film 43, a second silicon oxide film 50, and a silicon nitride film 51 are formed sequentially in the stated order (FIG. 40). The first tungsten film 40, the first silicon oxide film 42, the second tungsten film 43, the second silicon oxide film 50, and the silicon nitride film 51 are formed by a CVD process, for example.

The first tungsten film 40 eventually serves as the source electrode 10. A part of the first silicon oxide film 42 eventually serves as the first interlayer insulating layer 26. A part of the second tungsten film 43 eventually serves as the gate electrode 20. A part of the second silicon oxide film 50 eventually serves as the second interlayer insulating layer 28.

Figure 41:
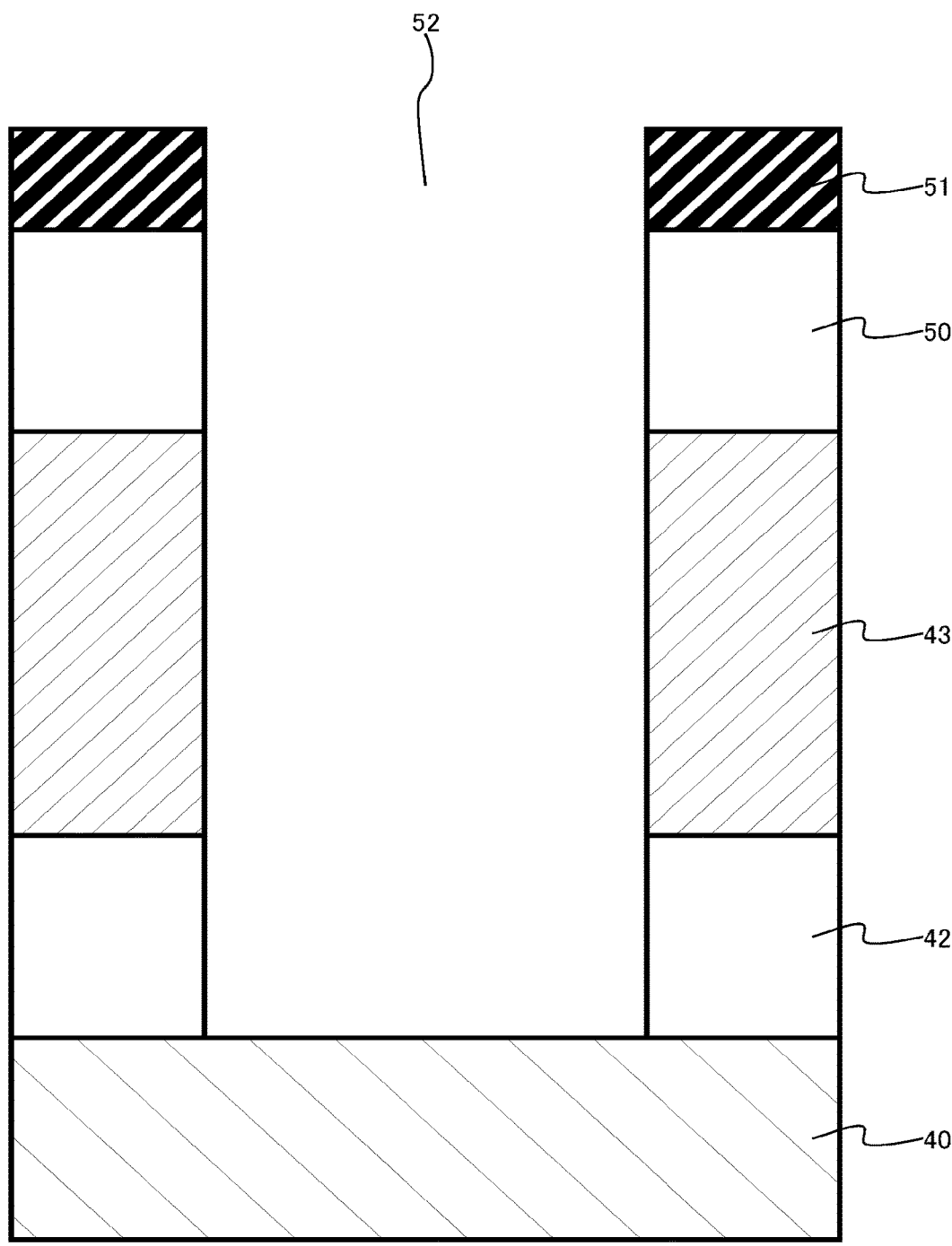
FIG. 41 is a schematic sectional view illustrating the semiconductor-device manufacturing method of the third embodiment.

Subsequently, boring is performed from the surface of the silicon nitride film 51 to form a first opening 52 extending to the first tungsten film 40 (FIG. 41). The first opening 52 is formed using a lithography process and a RIE process, for example.

Figure 42:
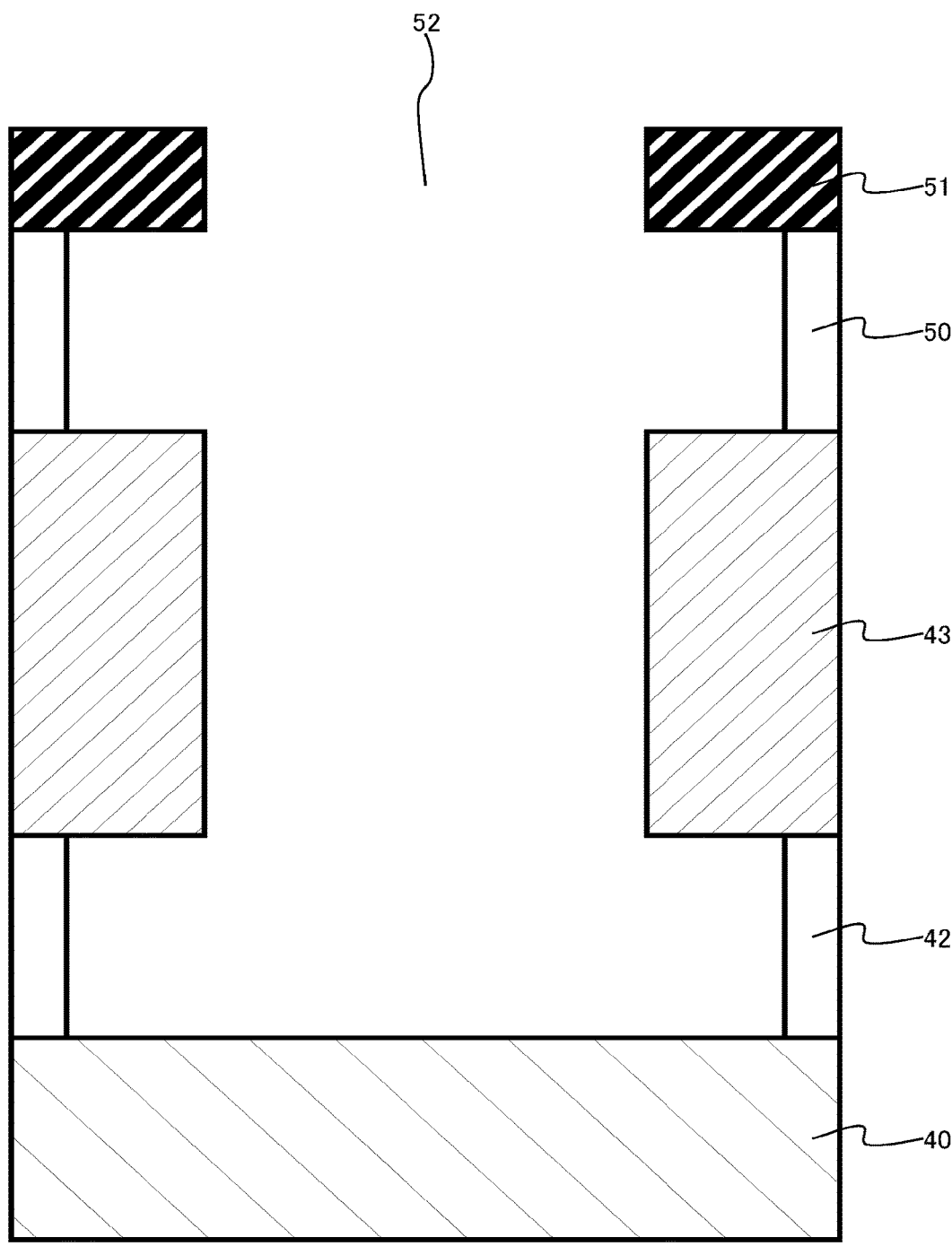
FIG. 42 is a schematic sectional view illustrating the semiconductor-device manufacturing method of the third embodiment.

Subsequently, the first silicon oxide film 42 and the second silicon oxide film 50 are selectively etched from the inner face of the first opening 52 to cause the first silicon oxide film 42 and the second silicon oxide film 50 to recede (FIG. 42). The first silicon oxide film 42 and the second silicon oxide film 50 are caused to recede by a wet etching process, for example.

Figure 43:
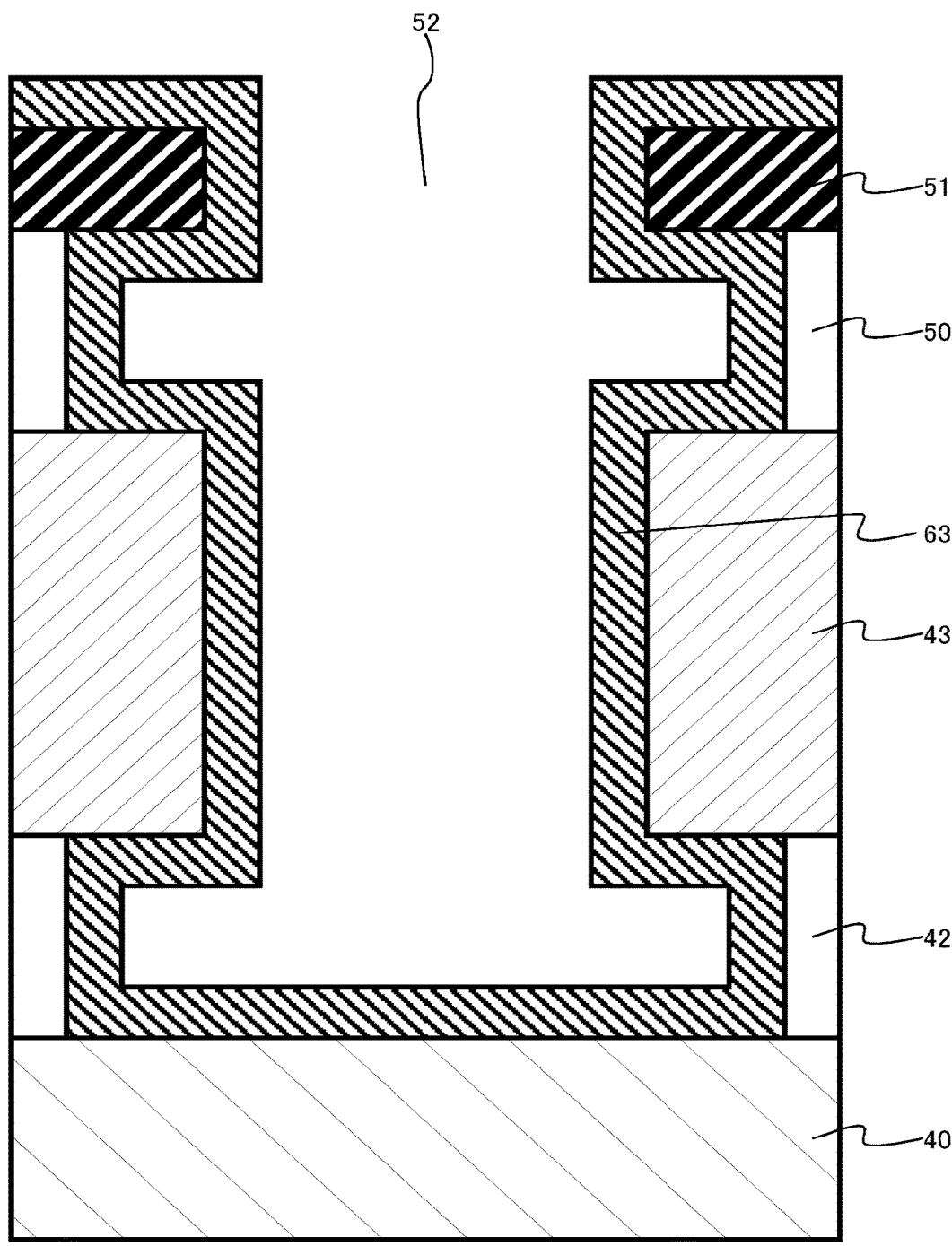
FIG. 43 is a schematic sectional view illustrating the semiconductor-device manufacturing method of the third embodiment.

Subsequently, a third silicon oxide film 63 is formed so as to cover the inner face of the first opening 52 (FIG. 43). The third silicon oxide film 63 is formed by a CVD process, for example. A part of the third silicon oxide film 63 eventually serves as the gate insulating layer 22.

Figure 44:
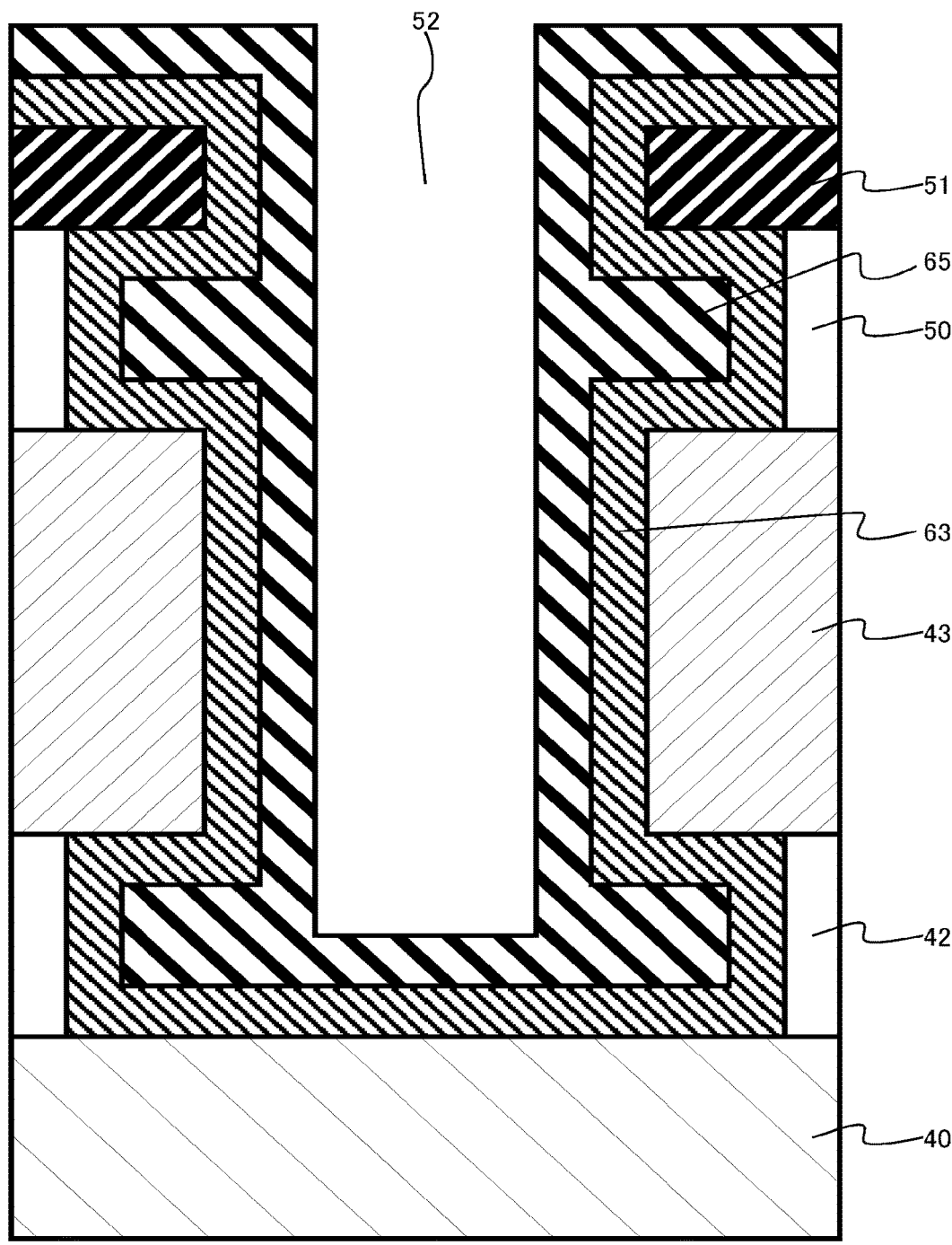
FIG. 44 is a schematic sectional view illustrating the semiconductor-device manufacturing method of the third embodiment.

Subsequently, a hafnium oxide film 65, for example, is formed so as to cover the third silicon oxide film 63 on the inner face of the first opening 52 (FIG. 44). The hafnium oxide film 65 is formed by a CVD process, for example.

A part of the hafnium oxide film 65 eventually serves as the first high-dielectric-constant insulating layer 25. Another part of the hafnium oxide film 65 eventually serves as the second high-dielectric-constant insulating layer 27.

The hafnium oxide film 65 has a composition including less oxygen than that in a stoichiometric composition of hafnium oxide, for example. The hafnium oxide film 65 includes an oxygen vacancy.

Thereafter, hydrogen annealing is performed, for example. The hydrogen annealing increases the amount of oxygen vacancies in the hafnium oxide film 65. The hydrogen annealing reduces the oxygen concentration of the hafnium oxide film 65.

Figure 45:
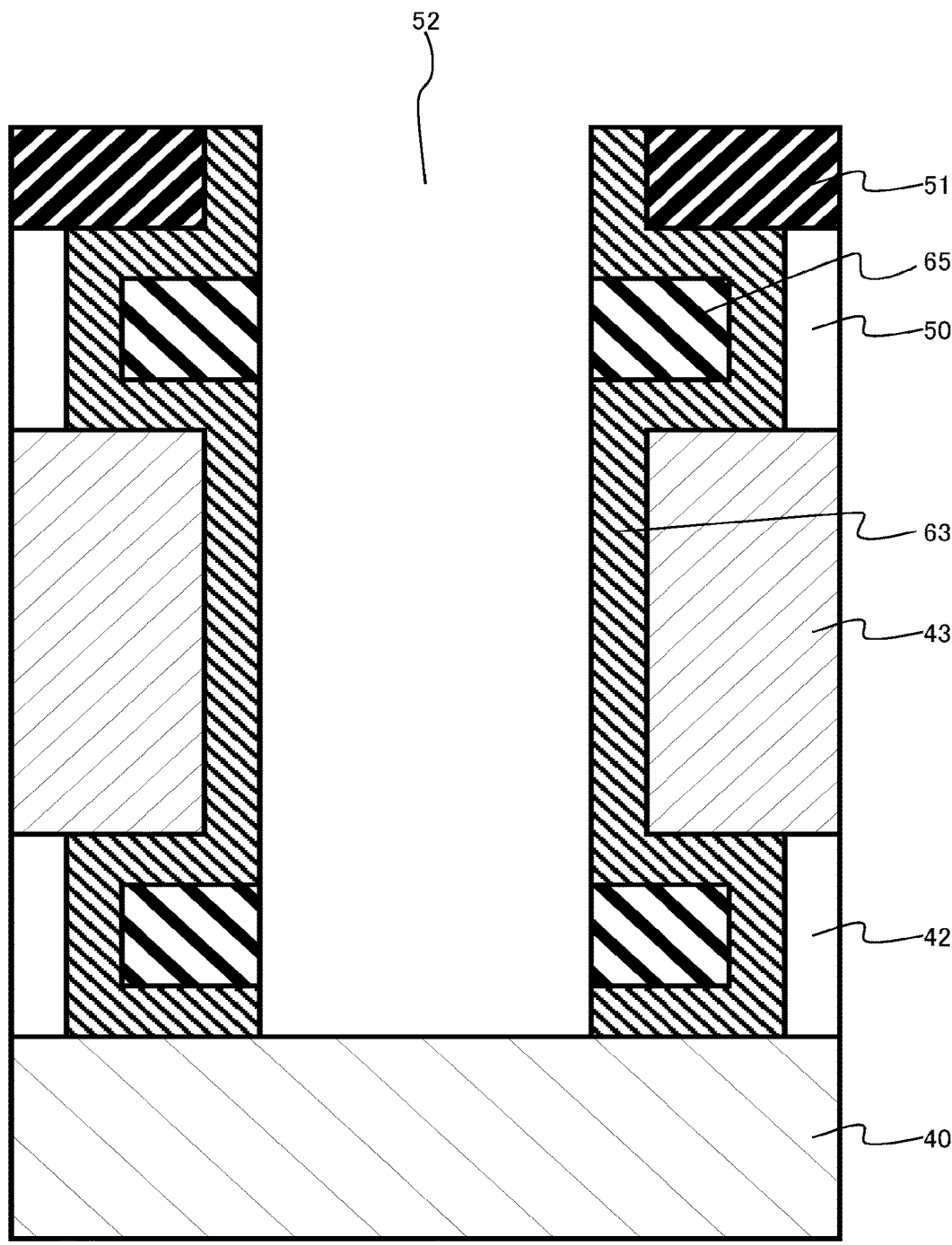
FIG. 45 is a schematic sectional view illustrating the semiconductor-device manufacturing method of the third embodiment.

Subsequently, portions of the hafnium oxide film 65 on the bottom and the inner face of the first opening 52 and above the silicon nitride film 51 are removed. Subsequently, portions of the third silicon oxide film 63 on the bottom of the first opening 52 and on the upper surface of the silicon nitride film 51 are removed (FIG. 45). The portions of the hafnium oxide film 65 and the portions of the third silicon oxide film 63 are removed using a RIE process, for example.

Figure 46:
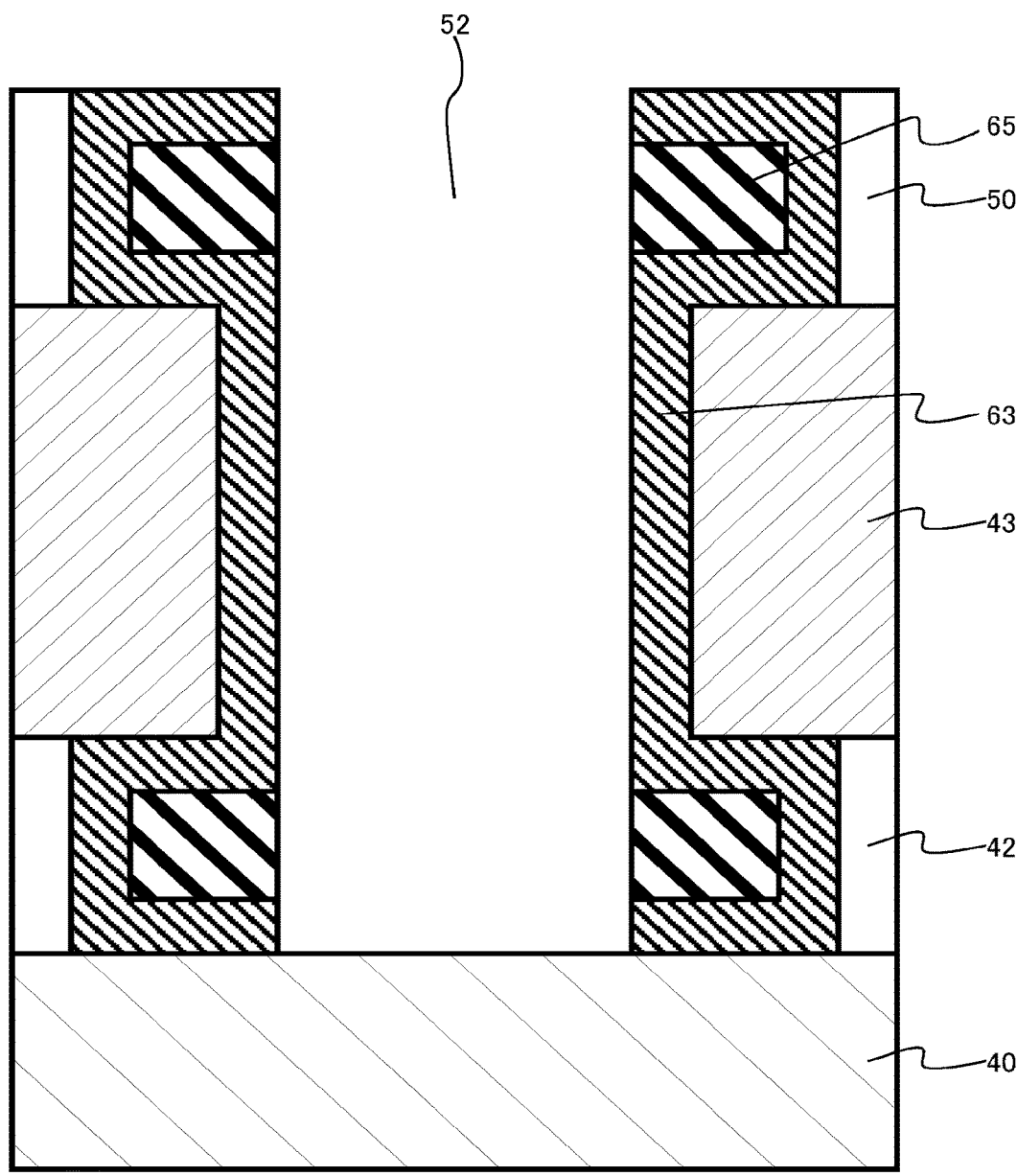
FIG. 46 is a schematic sectional view illustrating the semiconductor-device manufacturing method of the third embodiment.

Subsequently, the silicon nitride film 51 and a portion of the third silicon oxide film 63 on a side face of the silicon nitride film 51 are removed (FIG. 46). The silicon nitride film 51 and the portion of the third silicon oxide film 63 on a side face of the silicon nitride film 51 are removed using a wet etching process and a RIE process, for example.

Figure 47:
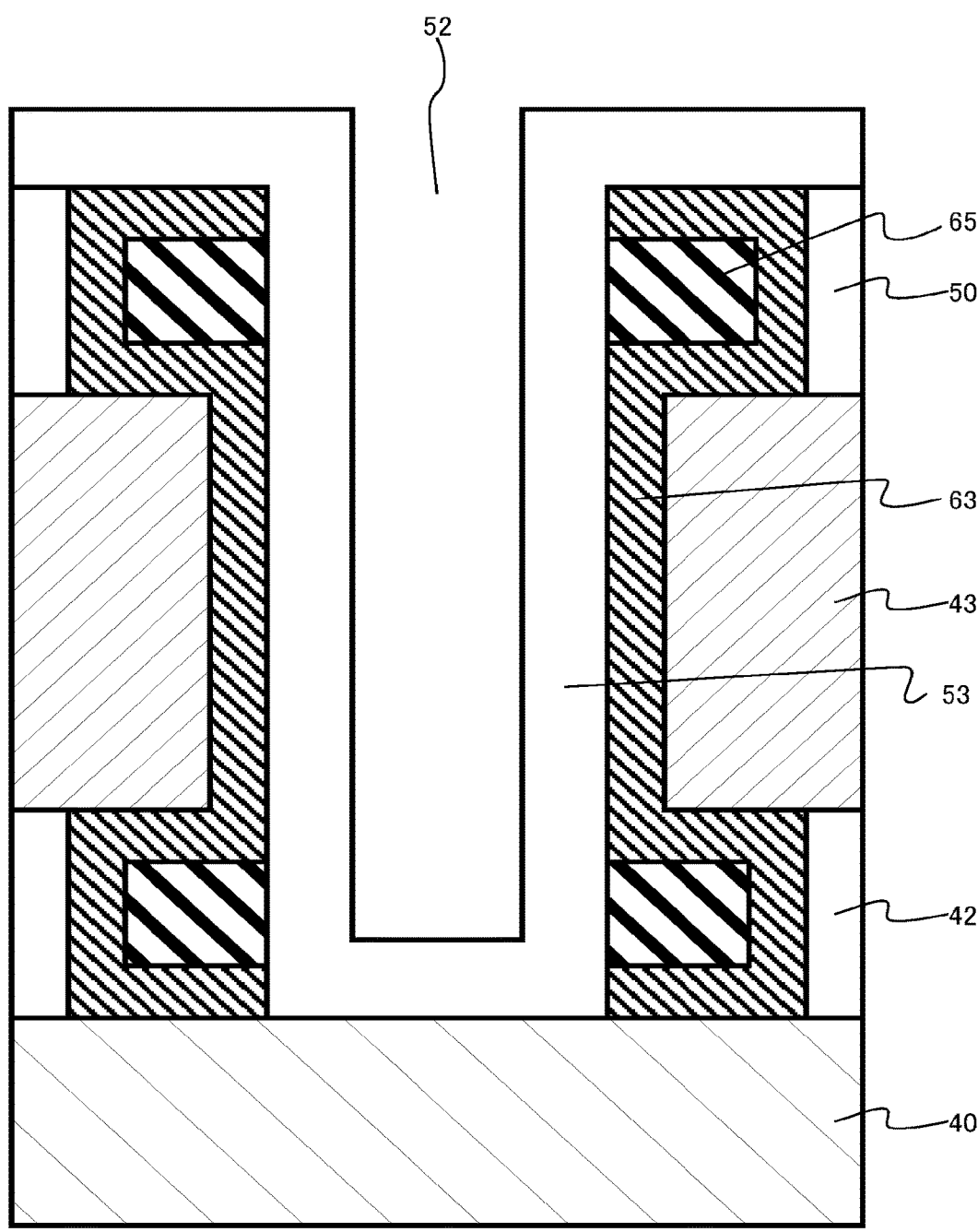
FIG. 47 is a schematic sectional view illustrating the semiconductor-device manufacturing method of the third embodiment.

Subsequently, an oxide semiconductor film 53 is formed in the first opening 52 (FIG. 47). The oxide semiconductor film 53 is formed by a CVD process, for example. The oxide semiconductor film 53 includes indium (In), gallium (Ga), and zinc (Zn), for example. A part of the oxide semiconductor film 53 eventually serves as the channel region 18.

Figure 48:
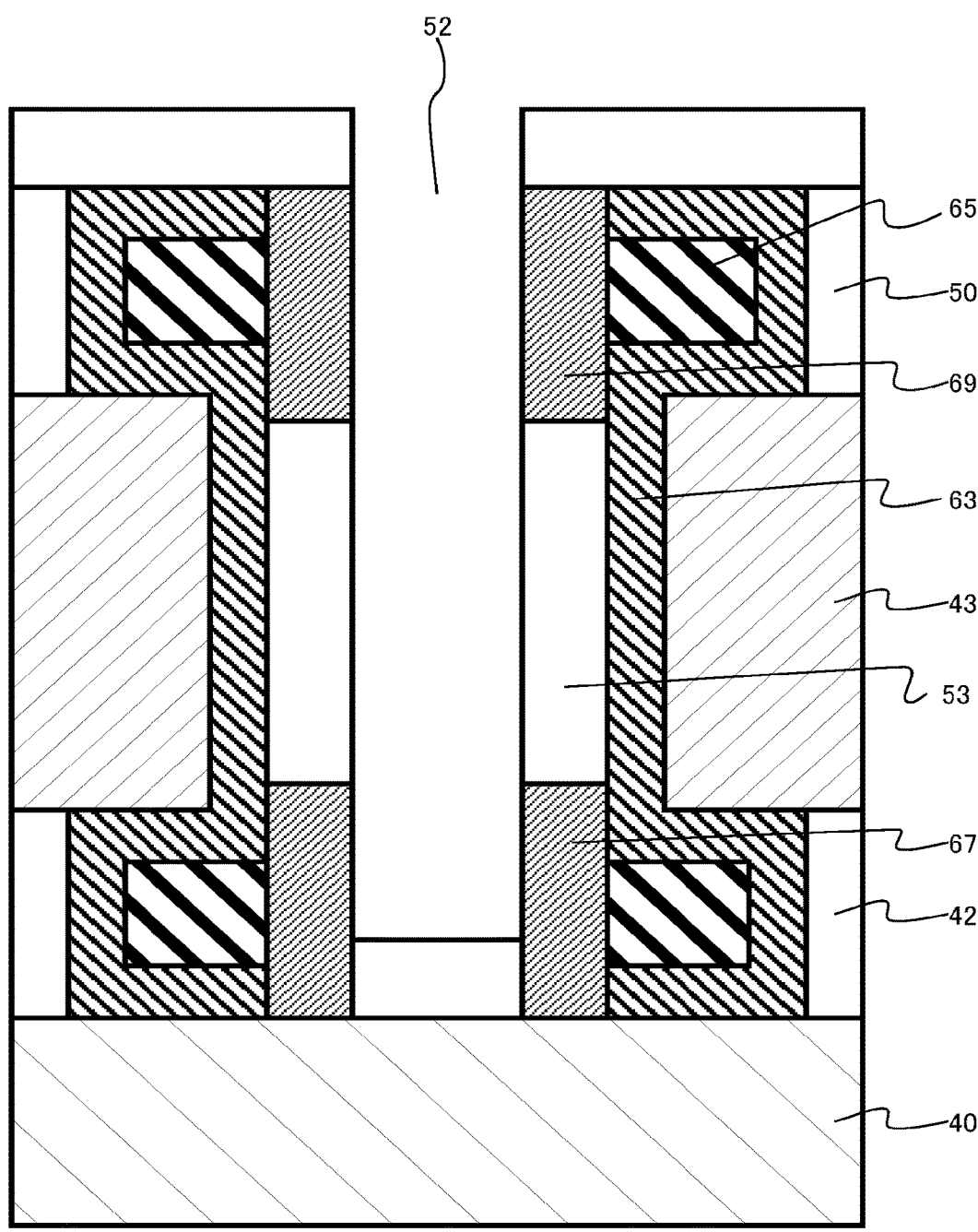
FIG. 48 is a schematic sectional view illustrating the semiconductor-device manufacturing method of the third embodiment.

Subsequently, heat treatment in a non-oxidizing atmosphere is performed. By the heat treatment, a first low-oxygen-concentration region 67 and a second low-oxygen-concentration region 69 are formed (FIG. 48). The heat treatment causes oxygen in the oxide semiconductor film 53 to be absorbed into the hafnium oxide film 65 that has many oxygen vacancies and thus has a low oxygen concentration. In the oxide semiconductor film 53, a neighborhood of a region in contact with the hafnium oxide film 65 forms the first low-oxygen-concentration region 67 and the second low-oxygen-concentration region 69 each of which has many oxygen vacancies and thus has a low oxygen concentration.

The first low-oxygen-concentration region 67 eventually serves as the source region 14. The second low-oxygen-concentration region 69 eventually serves as the drain region 16.

The first low-oxygen-concentration region 67 and the second low-oxygen-concentration region 69 are formed in a self-aligned manner with respect to the second tungsten film 43. Thus, the source region 14 and the drain region 16 are formed in a self-aligned manner with respect to the gate electrode 20.

Figure 49:
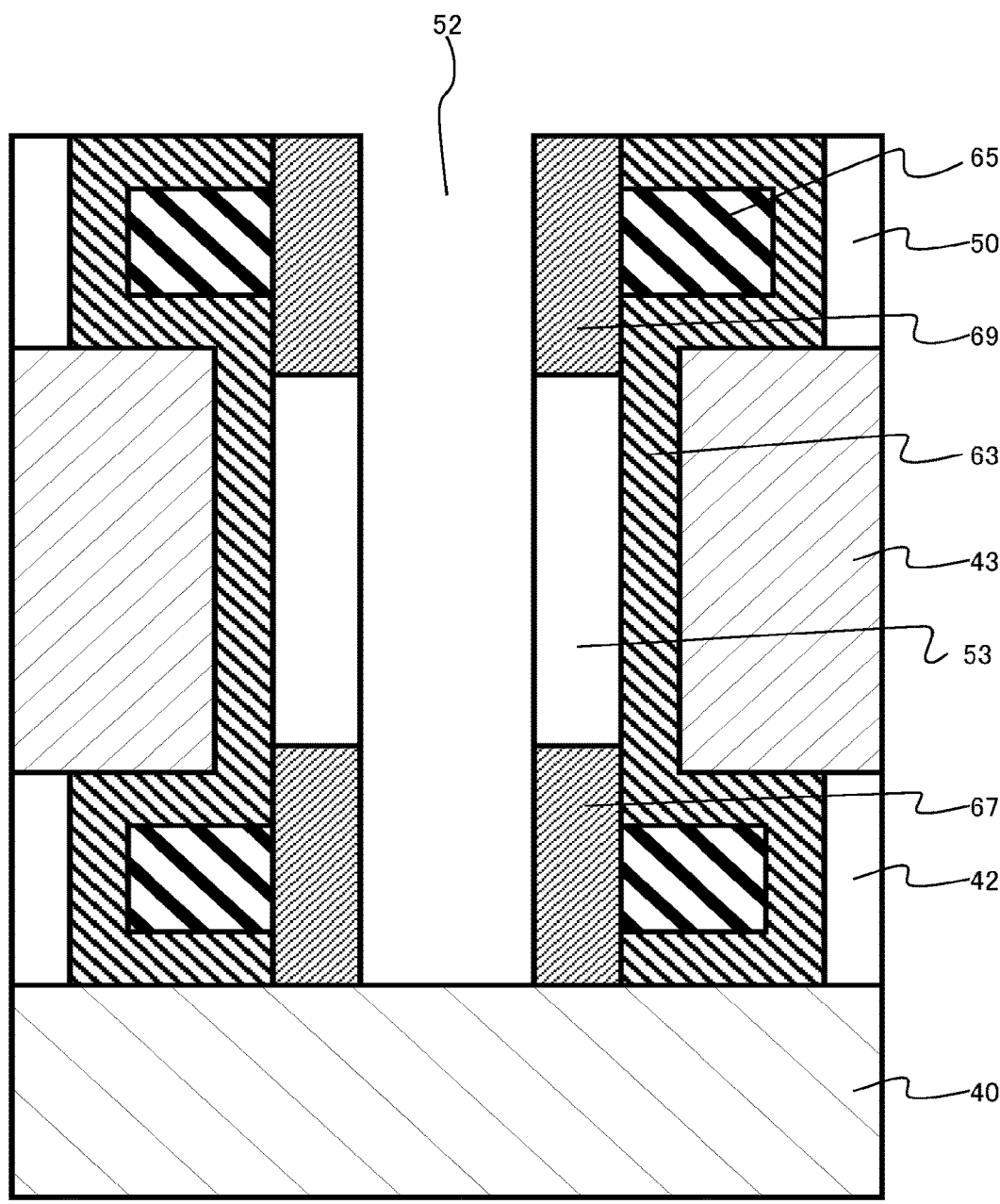
FIG. 49 is a schematic sectional view illustrating the semiconductor-device manufacturing method of the third embodiment.

Subsequently, portions of the oxide semiconductor film 53 on the bottom of the first opening 52 and on the upper portion of the third silicon oxide film 63 are removed (FIG. 49). The portions of the oxide semiconductor film 53 are removed using an RIE process, for example.

Figure 50:
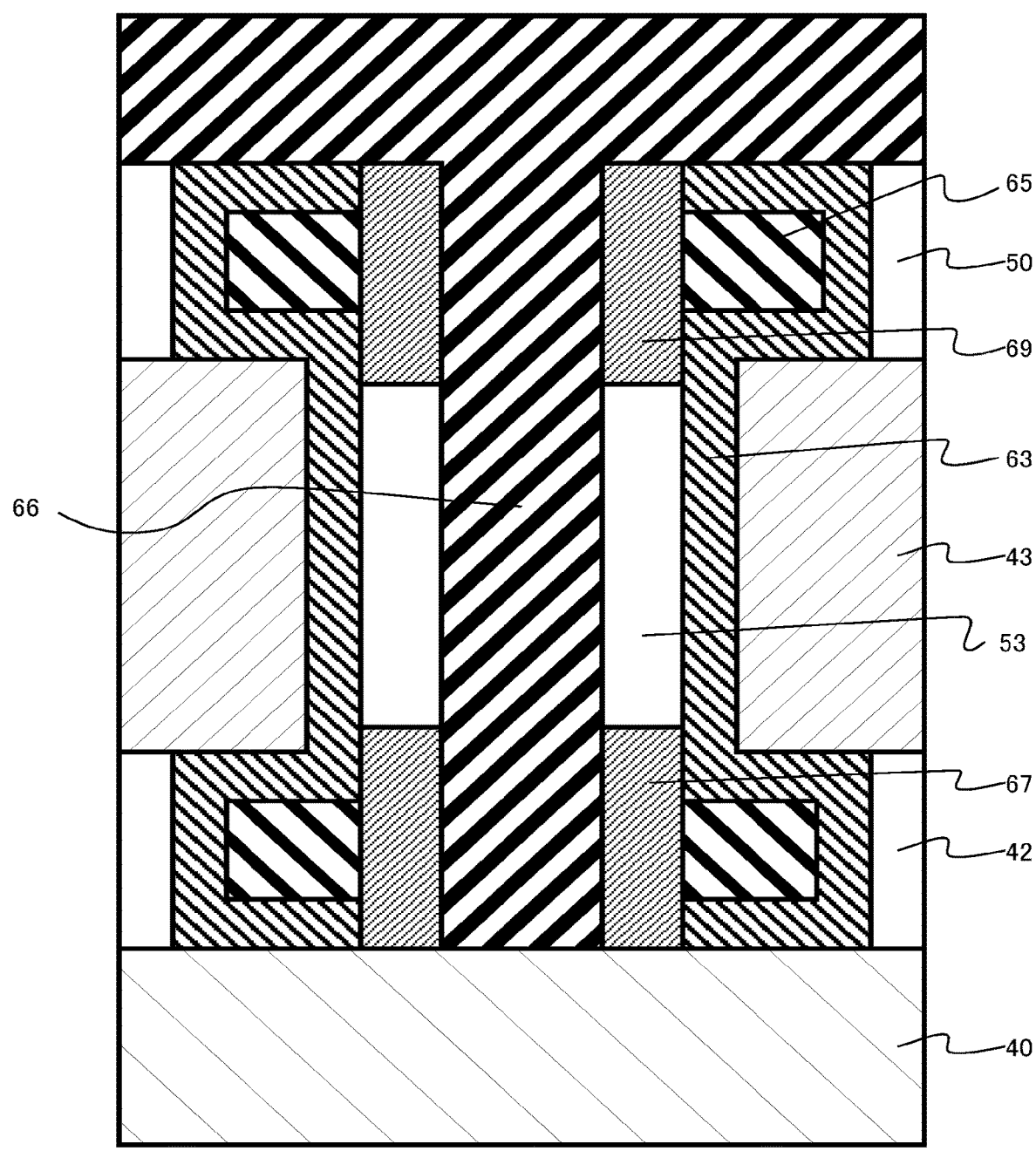
FIG. 50 is a schematic sectional view illustrating the semiconductor-device manufacturing method of the third embodiment.

Subsequently, a fourth silicon oxide film 66 is buried in the first opening 52 (FIG. 50). The fourth silicon oxide film 66 is formed by a CVD process, for example. A part of the fourth silicon oxide film 66 eventually serves as the core insulating region 24.

Figure 51:
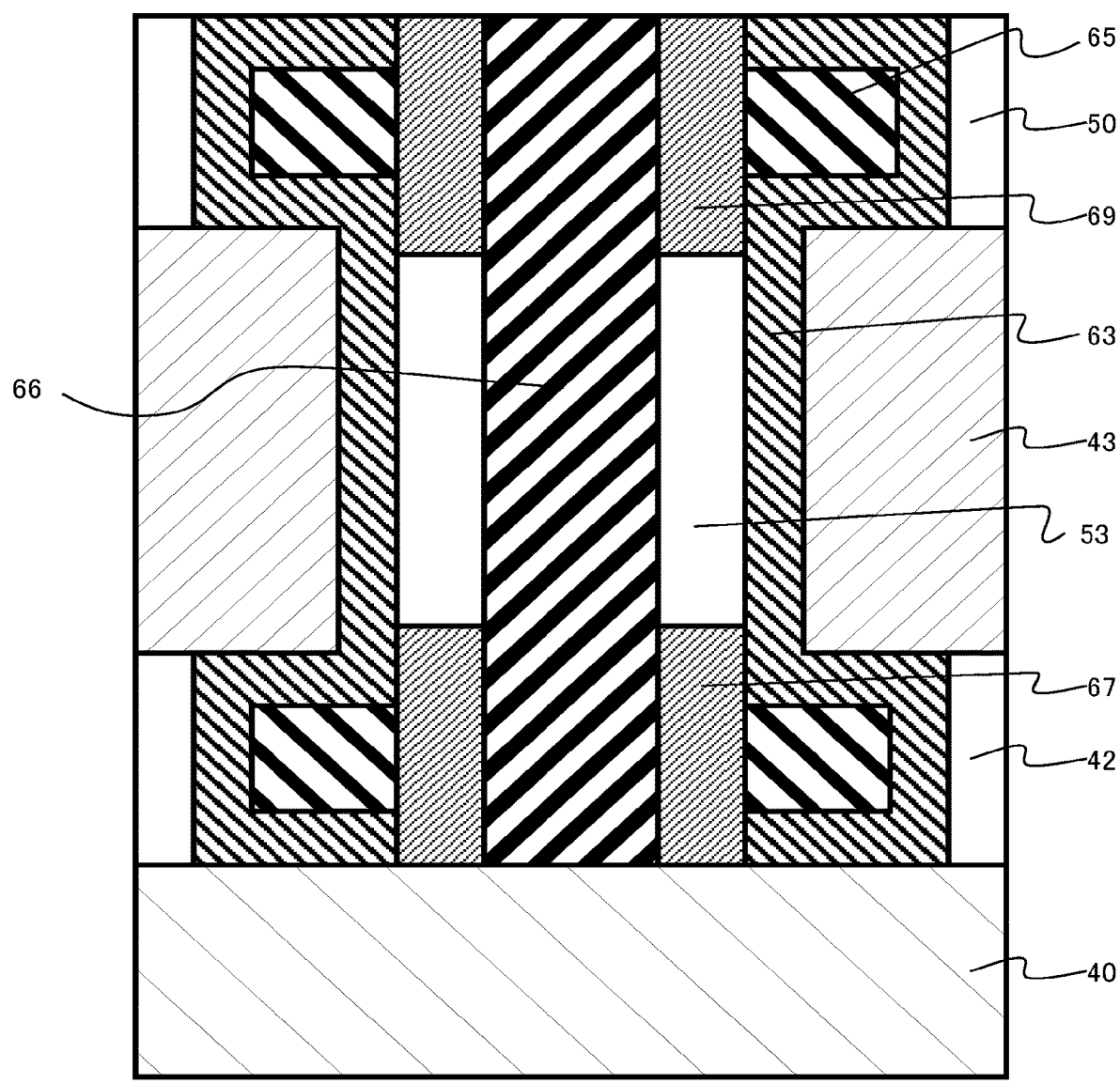
FIG. 51 is a schematic sectional view illustrating the semiconductor-device manufacturing method of the third embodiment.

Subsequently, portions of the fourth silicon oxide film 66 on the second silicon oxide film 50 and on the upper portion of the third silicon oxide film 63 are removed (FIG. 51). The portions of the fourth silicon oxide film 66 are removed by a CMP process, for example.

Figure 52:
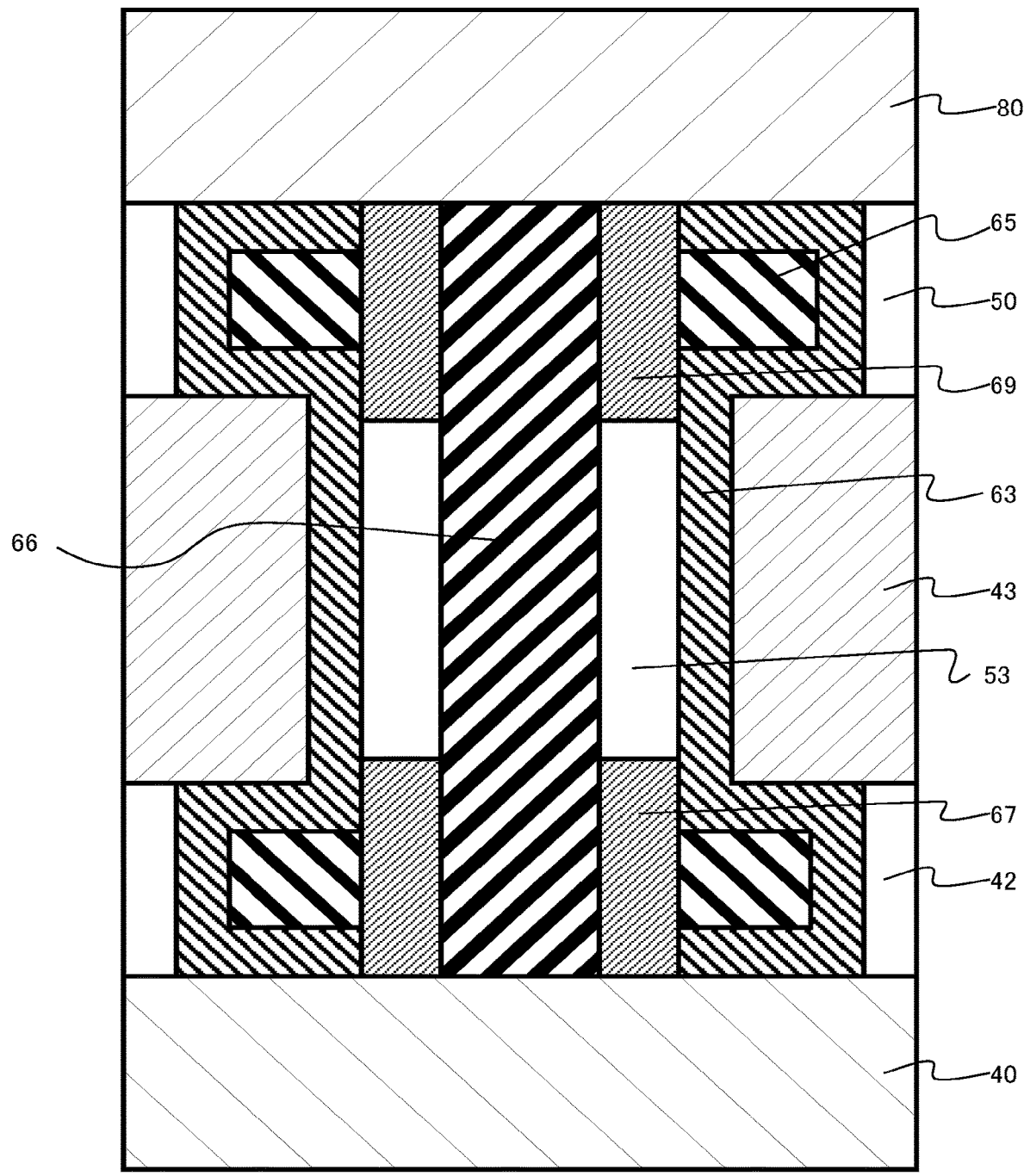
FIG. 52 is a schematic sectional view illustrating the semiconductor-device manufacturing method of the third embodiment.

Subsequently, a third tungsten film 81 is formed on the second silicon oxide film 50, the third silicon oxide film 63, the second low-oxygen-concentration region 69, and the fourth silicon oxide film 66 (FIG. 52). The third tungsten film 81 is formed by a CVD process, for example. The third tungsten film 81 serves as the drain electrode 12.

By the above-described manufacturing method, the transistor 300 illustrated in FIG. 37 is formed.

In the transistor 300 of the third embodiment, the core insulating region 24 is provided inside the channel region 18. This can reduce the thickness of the channel region 18. Therefore, it is easy to reduce an off-leakage current.

Further, each of the source region 14 and the drain region 16 of the transistor 300 of the third embodiment is an oxide semiconductor with low resistance. For this reason, it is easy to reduce contact resistance between the source electrode 10 and the source region 14. For the same reason, it is easy to reduce contact resistance between the drain electrode 12 and the drain region 16. Therefore, it is easy to reduce on-resistance.

The transistor 300 of the third embodiment can reduce an off-leakage current and can reduce on-resistance as compared to the transistor 900 of the comparative example in the first embodiment.

Moreover, the transistor 300 of the third embodiment includes the first high-dielectric-constant insulating layer 25 and the second high-dielectric-constant insulating layer 27 each having a high dielectric constant, on opposite sides of the gate electrode 20. This increases the strength of a fringing field generated from a side face of the gate electrode 20 toward the source region 14 and the drain region 16. Thus, the carrier concentration of the source region 14 and the drain region 16 is increased, thereby reducing the resistance of the source region 14 and the drain region 16. Therefore, the on-resistance of the transistor 300 is reduced.

It is preferable that the first distance d3 along the third direction between the source region 14 and the drain region 16 between which the channel region 18 is sandwiched is smaller than the length d2 of the gate electrode 20 along the third direction. In other words, it is preferable that the source region 14 and the gate electrode 20 overlap each other and the drain region 16 and the gate electrode 20 overlap each other. As a result of this, offsets between the source region 14 and the gate electrode 20 and between the drain region 16 and the gate electrode 20 due to variation in process, for example, are unlikely to occur. Therefore, a transistor with stable on-resistance is achieved.

Figure 53:
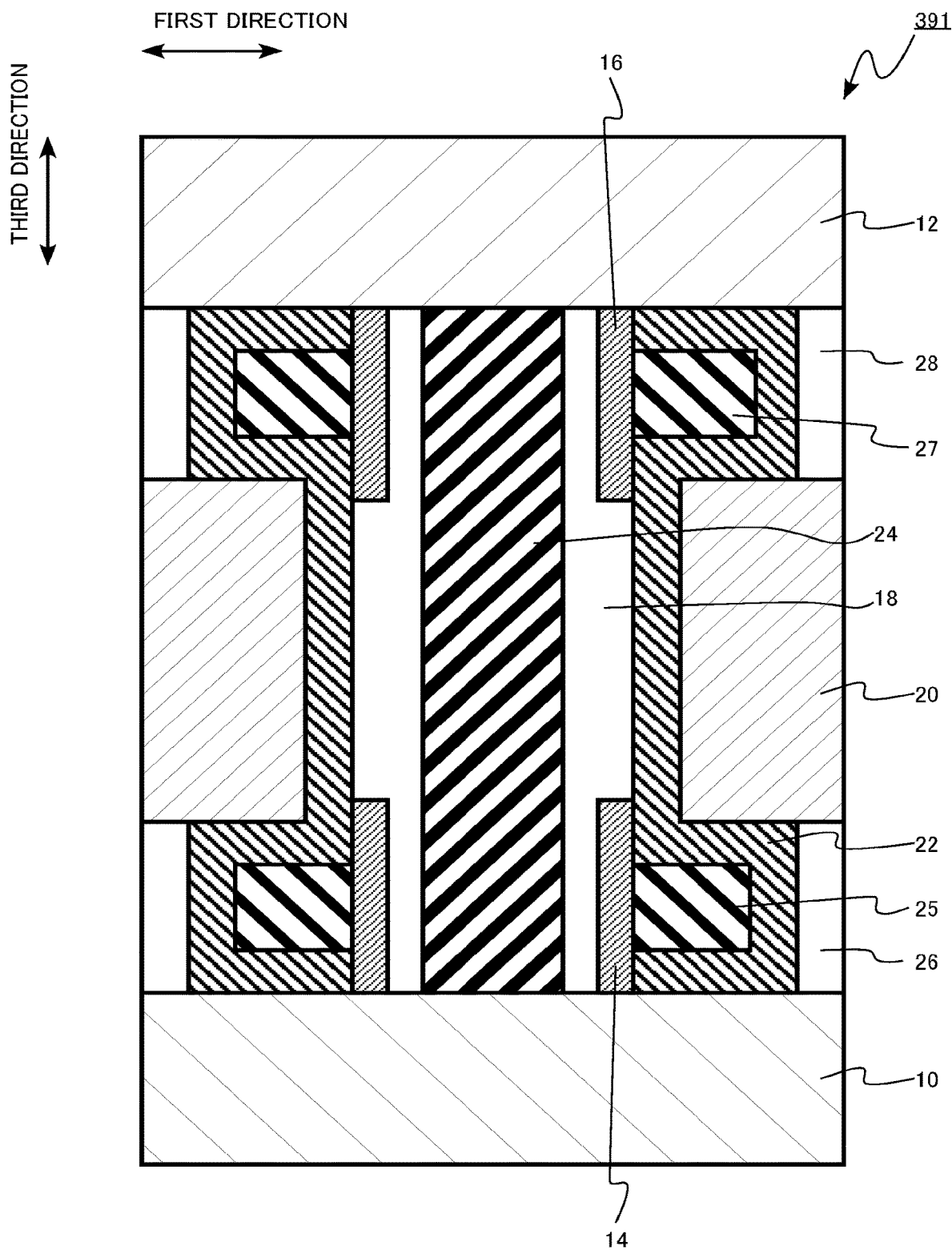
FIG. 53 is a schematic sectional view of a semiconductor device of a first modification of the third embodiment.

FIG. 53 is a schematic sectional view of a semiconductor device of a first modification of the third embodiment. The semiconductor device of the first modification is a transistor 391.

The transistor 391 is different from the transistor 300 of the third embodiment in that the source region 14 is spaced apart from the core insulating region 24 and the drain region 16 is spaced apart from the core insulating region 24.

The thickness of each of the source region 14 and the drain region 16 along the first direction in the transistor 391 of the first modification is smaller than the thickness of each of the source region 14 and the drain region 16 along the first direction in the transistor 300 of the third embodiment. Therefore, an off-leakage current is further reduced.

Figure 54:
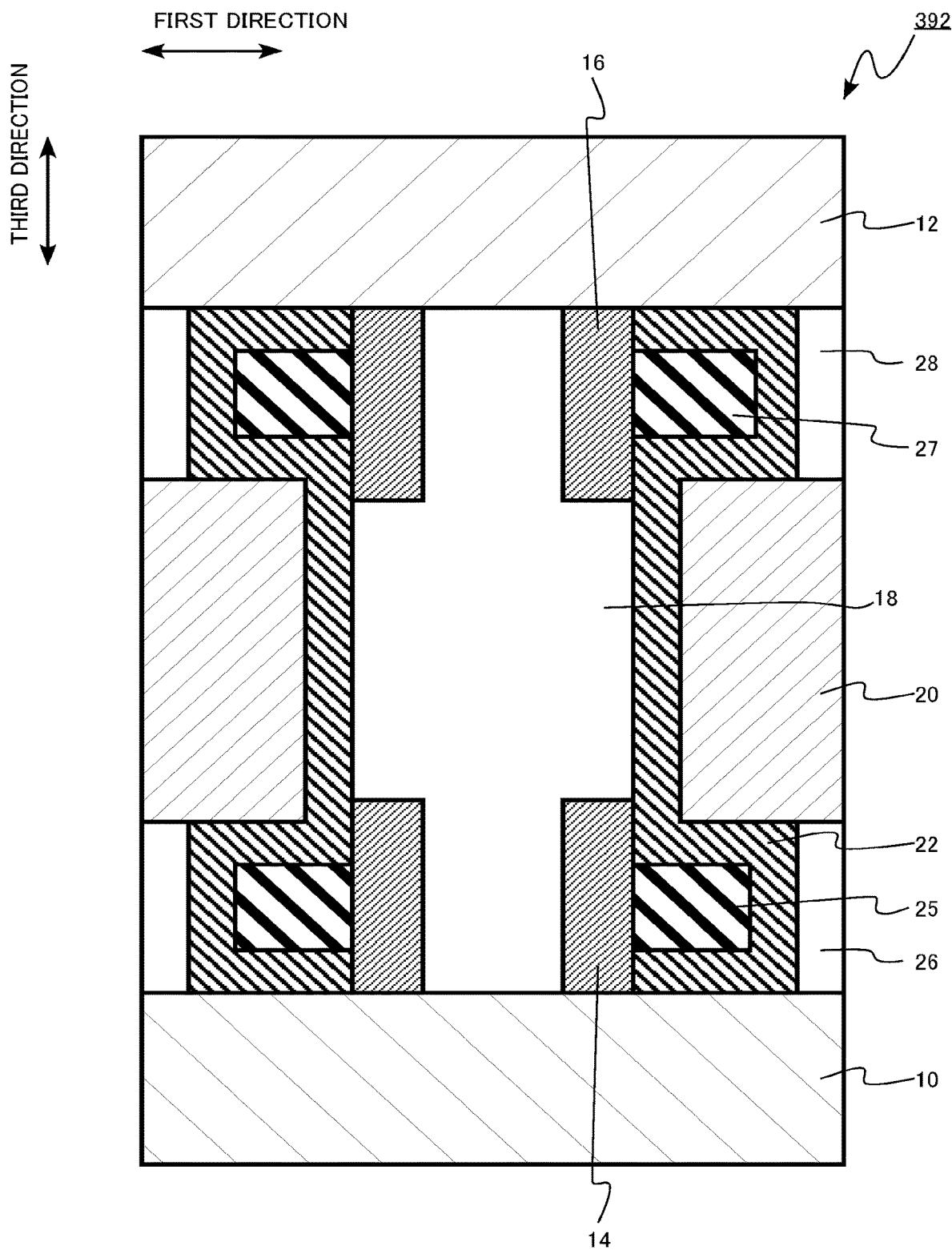
FIG. 54 is a schematic sectional view of a semiconductor device of a second modification of the third embodiment.

FIG. 54 is a schematic sectional view of a semiconductor device of a second modification of the third embodiment. The semiconductor device of the second modification is a transistor 392.

The transistor 392 is different from the transistor 300 of the third embodiment in that the core insulating region 24 is not included. The thickness of each of the source region 14 and the drain region 16 along the first direction in the transistor 392 is smaller than the thickness of each of the source region 14 and the drain region 16 along the first direction in the transistor 900 of the comparative example in the first embodiment. Therefore, an off-leakage current is reduced.

Figure 55:
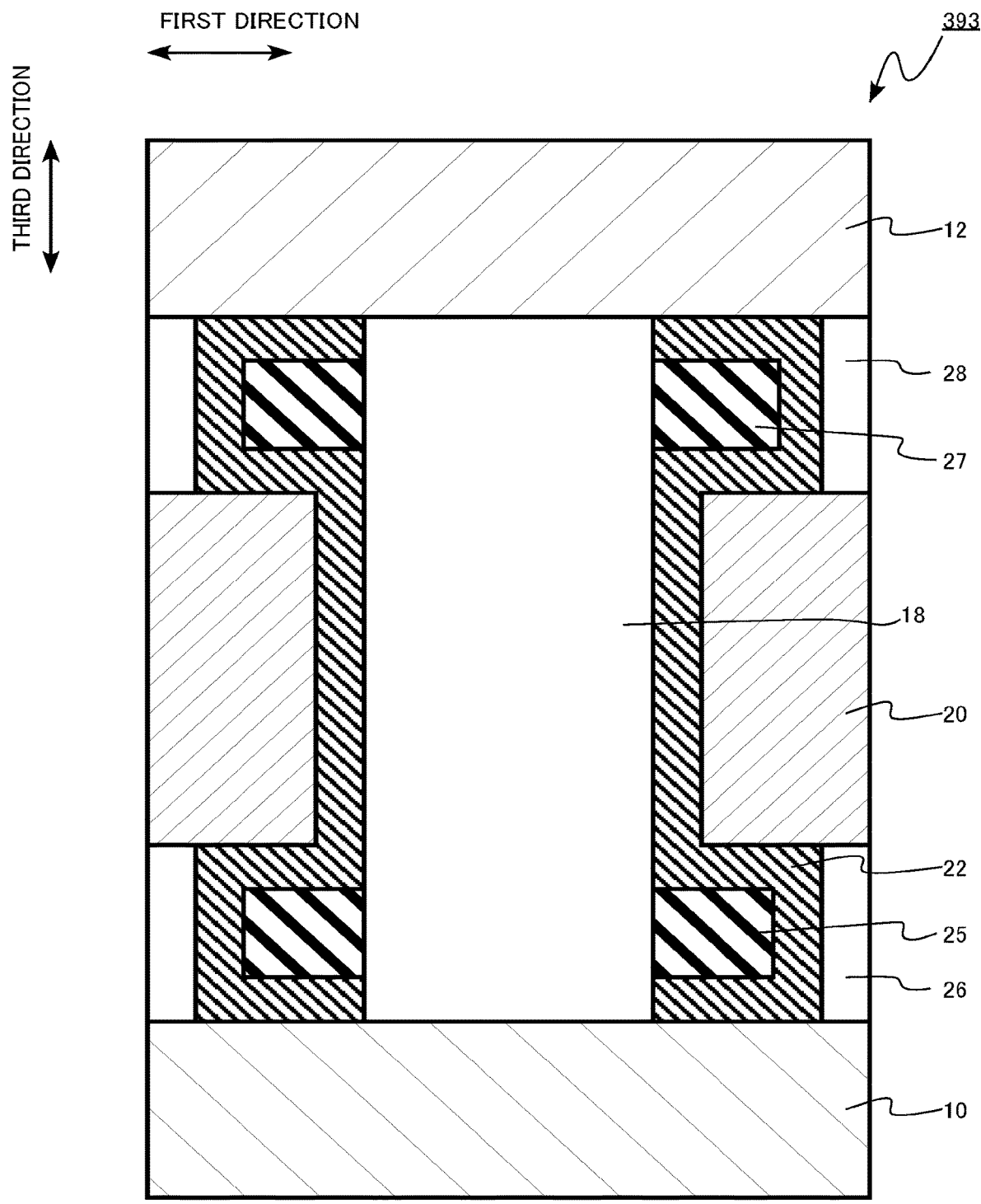
FIG. 55 is a schematic sectional view of a semiconductor device of a third modification of the third embodiment.

FIG. 55 is a schematic sectional view of a semiconductor device of a third modification of the third embodiment. The semiconductor device of the third modification is a transistor 393.

The transistor 393 is different from the transistor 300 of the third embodiment in that the core insulating region 24, the source region 14, and the drain region 16 are not included. The transistor 393 does not include the source region 14 and the drain region 16. Therefore, an off-leakage current is reduced as compared to that in the transistor 900 of the comparative example in the first embodiment.

As described above, according to the third embodiment, a transistor that can reduce an off-leakage current and can reduce on-resistance can be achieved.

Fourth Embodiment

A semiconductor memory device of a fourth embodiment includes a first wire extending along a first direction, a second wire extending along a second direction crossing the first direction, and a memory cell. The memory cell includes a first electrode electrically connected to the first wire, a second electrode, a first metallic region provided between the first electrode and the second electrode, the first metallic region including at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn), a second metallic region provided between the first metallic region and the second electrode, the second metallic region including the at least one metallic element, a semiconductor region provided between the first metallic region and the second metallic region, the semiconductor region including the at least one metallic element and oxygen (O), an insulating region provided between the first metallic region and the second metallic region, the insulating region being surrounded by the semiconductor region, a gate electrode surrounding the semiconductor region, the gate electrode being electrically connected to the second wire, a gate insulating layer provided between the semiconductor region and the gate electrode, and a capacitor electrically connected to the second electrode. The memory cell includes a capacitor electrically connected to the second electrode of the semiconductor device of the first embodiment. Hereinafter, description that would be a duplication of the description in the first embodiment will be partly omitted.

The semiconductor memory device of the fourth embodiment is a semiconductor memory 400. The semiconductor memory device of the fourth embodiment is a dynamic random access memory (DRAM). The semiconductor memory 400 uses the transistor 100 of the first embodiment as a switching transistor of a memory cell of a DRAM.

Figure 56:
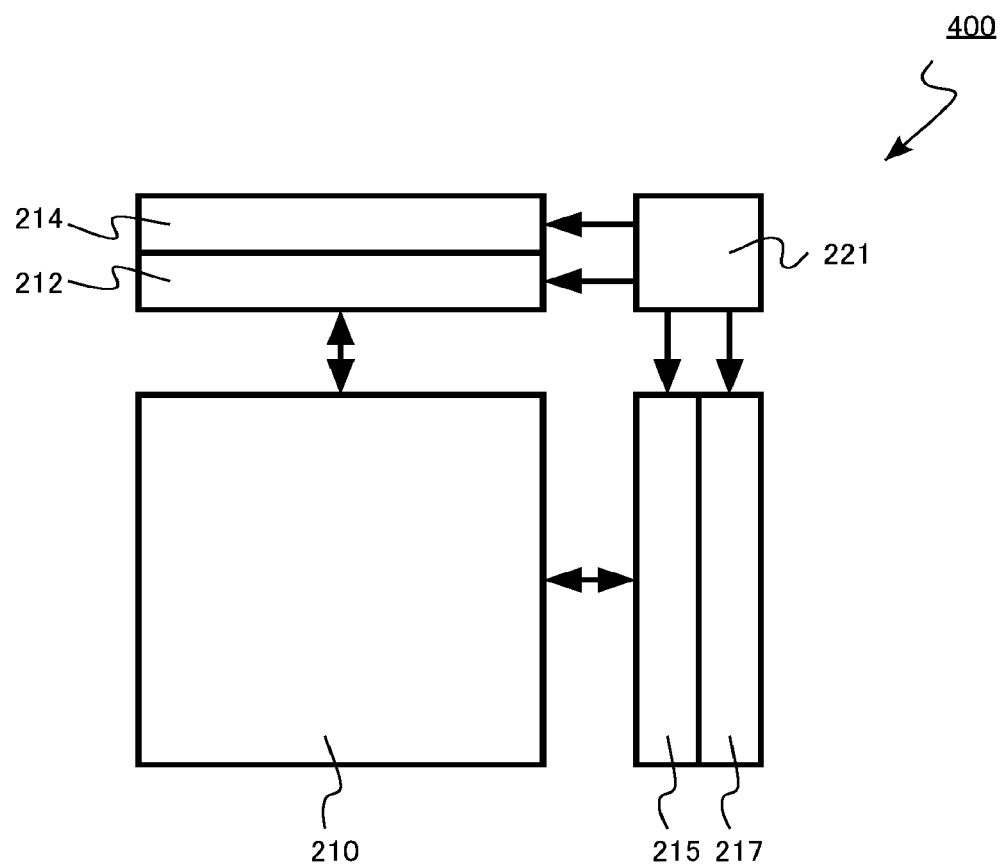
FIG. 56 is a block diagram of a semiconductor memory device of a fourth embodiment.

FIG. 56 is a block diagram of the semiconductor memory device of the fourth embodiment.

As illustrated in FIG. 56, the semiconductor memory 400 includes a memory cell array 210, a word-line driver circuit 212, a row decoder circuit 214, a sense amplifier circuit 215, a column decoder circuit 217, and a control circuit 221.

Figure 57:
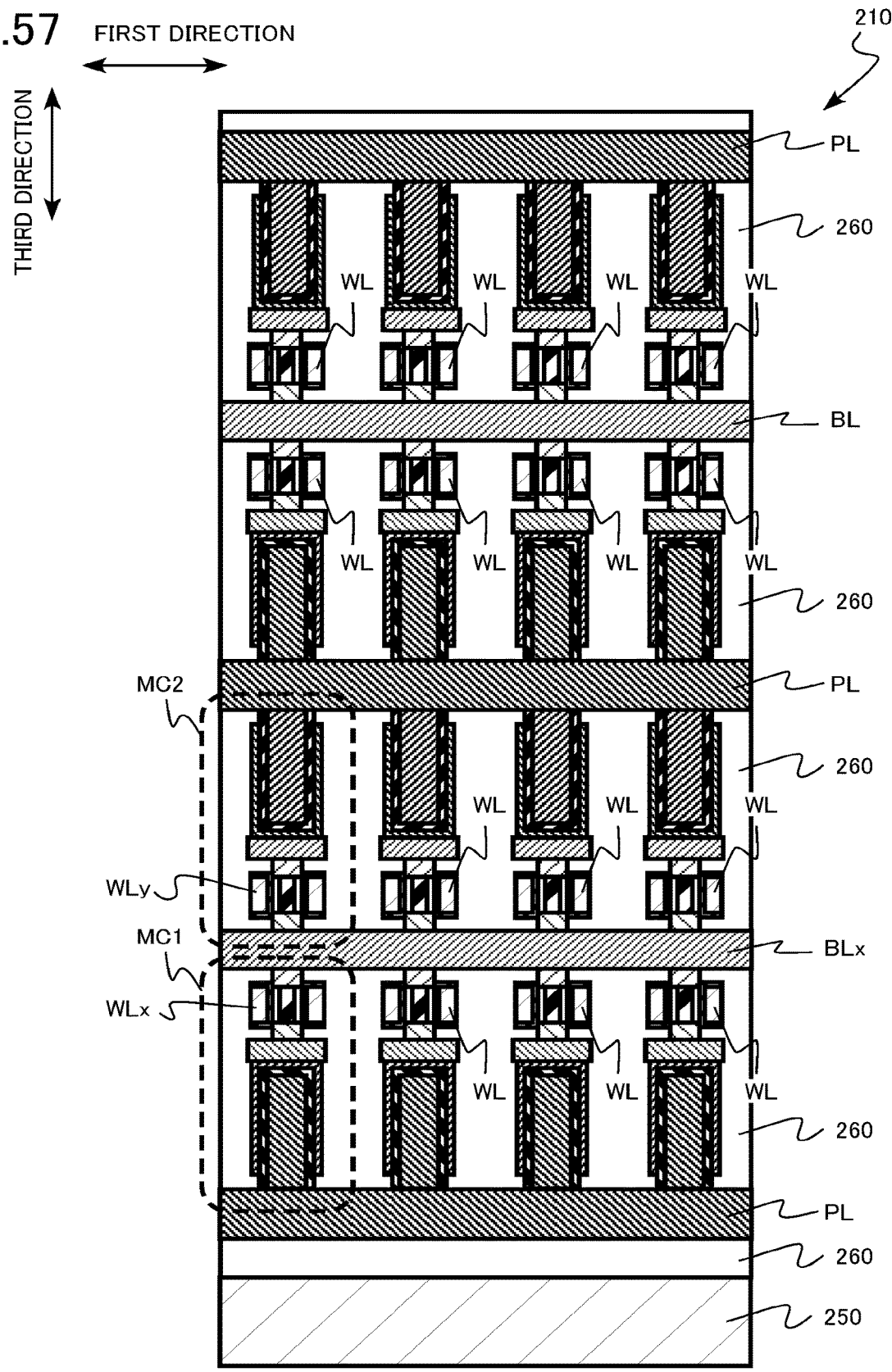
FIG. 57 is a schematic sectional view of a memory cell array of the semiconductor memory device of the fourth embodiment.
Figure 58:
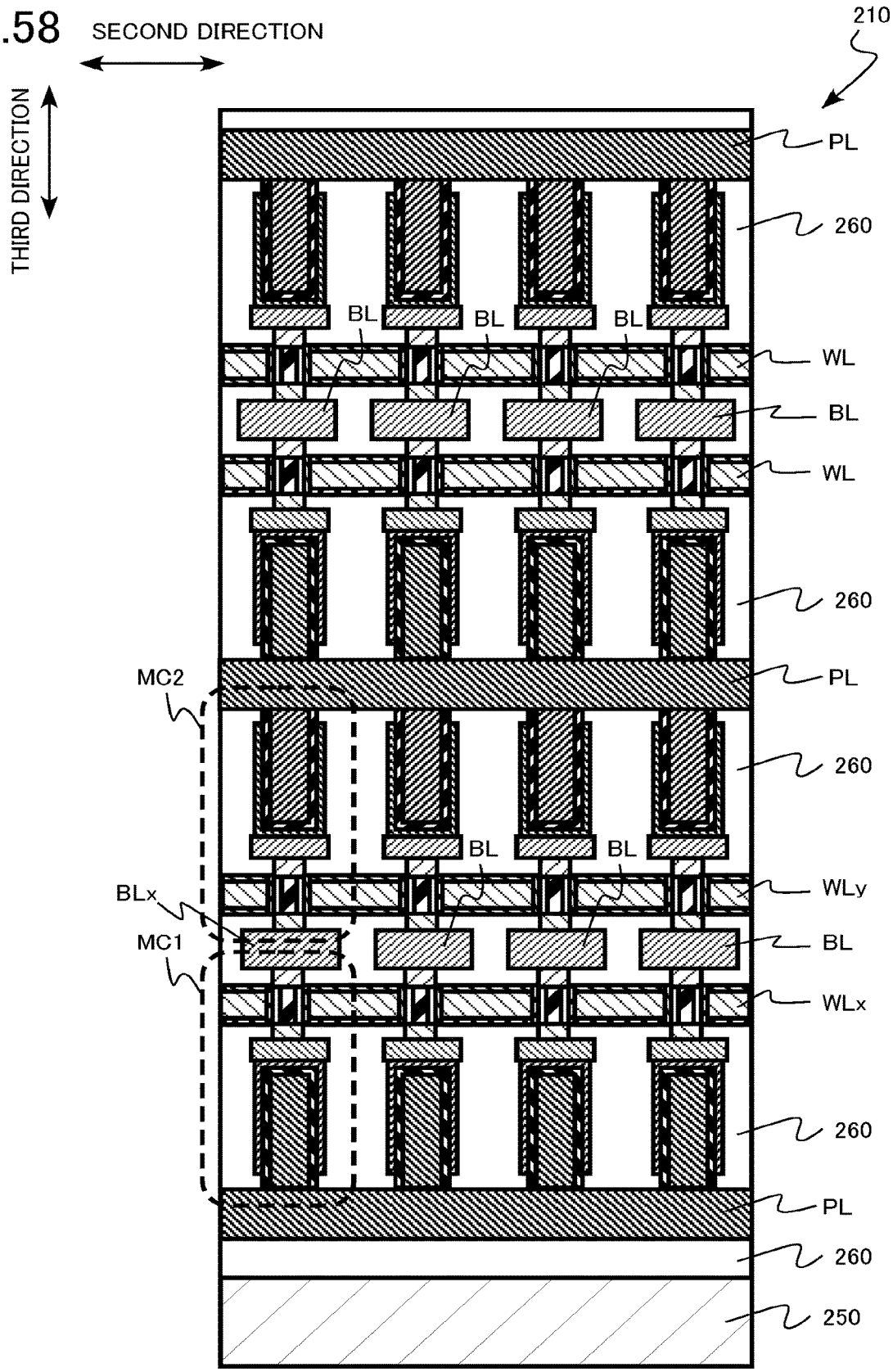
FIG. 58 is a schematic sectional view of the memory cell array of the semiconductor memory device of the fourth embodiment.

FIGS. 57 and 58 are schematic sectional views of the memory cell array of the semiconductor memory device of the fourth embodiment. FIG. 57 is a view of a sectional plane including a first direction and a third direction, and FIG. 58 is a view of a sectional plane including a second direction and the third direction. The first direction and the second direction cross each other. The first direction and the second direction are perpendicular to each other, for example. The third direction is perpendicular to the first direction and the second direction. The third direction is perpendicular to a substrate, for example.

The memory cell array 210 of the fourth embodiment includes a three-dimensional structure in which memory cells are three-dimensionally disposed. Each of the areas surrounded by broken lines in FIGS. 57 and 58 represents one memory cell.

The memory cell array 210 includes a silicon substrate 250.

The memory cell array 210 includes a plurality of bit lines BL and a plurality of word lines WL, for example, above the silicon substrate 250. The bit lines BL extend along the first direction. The word lines WL extend along the second direction.

The bit lines BL and the word lines WL cross each other at right angles, for example. The memory cells are disposed in an area where the bit lines BL and the word lines WL cross each other. The memory cells include a first memory cell MC1 and a second memory cell MC2. Each of the first memory cell MC1 and the second memory cell MC2 is one example of the memory cell.

One of the bit lines BL connected to the first memory cell MC1 and the second memory cell MC2 is a bit line BLx. The bit line BLx is one example of the first wire. One of the word lines WL connected to the first memory cell MC1 is a word line WLx. The word line WLx is one example of the second wire.

One of the word lines WL connected to the second memory cell MC2 is a word line WLy. The word line WLx is provided on one side of the bit line BLx. The word line WLy is provided on the other side of the bit line BLx.

The memory cell array 210 includes a plurality of plate electrode lines PL. Each of the plate electrode lines PL is connected to a plate electrode 72 of each memory cell.

The memory cell array 210 includes an interlayer insulating layer 260 for electrical isolation of wires and electrodes.

The plurality of word lines WL is electrically connected to the row decoder circuit 214. The plurality of bit lines BL is electrically connected to the sense amplifier circuit 215.

The row decoder circuit 214 has a function of selecting one of the word lines WL in accordance with a row address signal that has been input. The word-line driver circuit 212 has a function of applying a predetermined voltage to the word line WL selected by the row decoder circuit 214.

The column decoder circuit 217 has a function of selecting one of the bit lines BL in accordance with a column address signal that has been input. The sense amplifier circuit 215 has a function of applying a predetermined voltage to the bit line BL selected by the column decoder circuit 217. The sense amplifier circuit 215 further has a function of detecting and amplifying the potential of the bit line BL.

The control circuit 221 has a function of controlling the word-line driver circuit 212, the row decoder circuit 214, the sense amplifier circuit 215, the column decoder circuit 217, and the other circuits not illustrated in the drawings.

The circuits such as the word-line driver circuit 212, the row decoder circuit 214, the sense amplifier circuit 215, the column decoder circuit 217, and the control circuit 221 are formed of transistors or wiring layers not illustrated in the drawings, for example. The transistors are formed using the silicon substrate 250, for example.

Each of the bit lines BL and the word lines WL is a metal, for example. Each of the bit lines BL and the word lines WL is titanium nitride, tungsten, or a stacked structure of titanium nitride and tungsten, for example.

Figure 59:
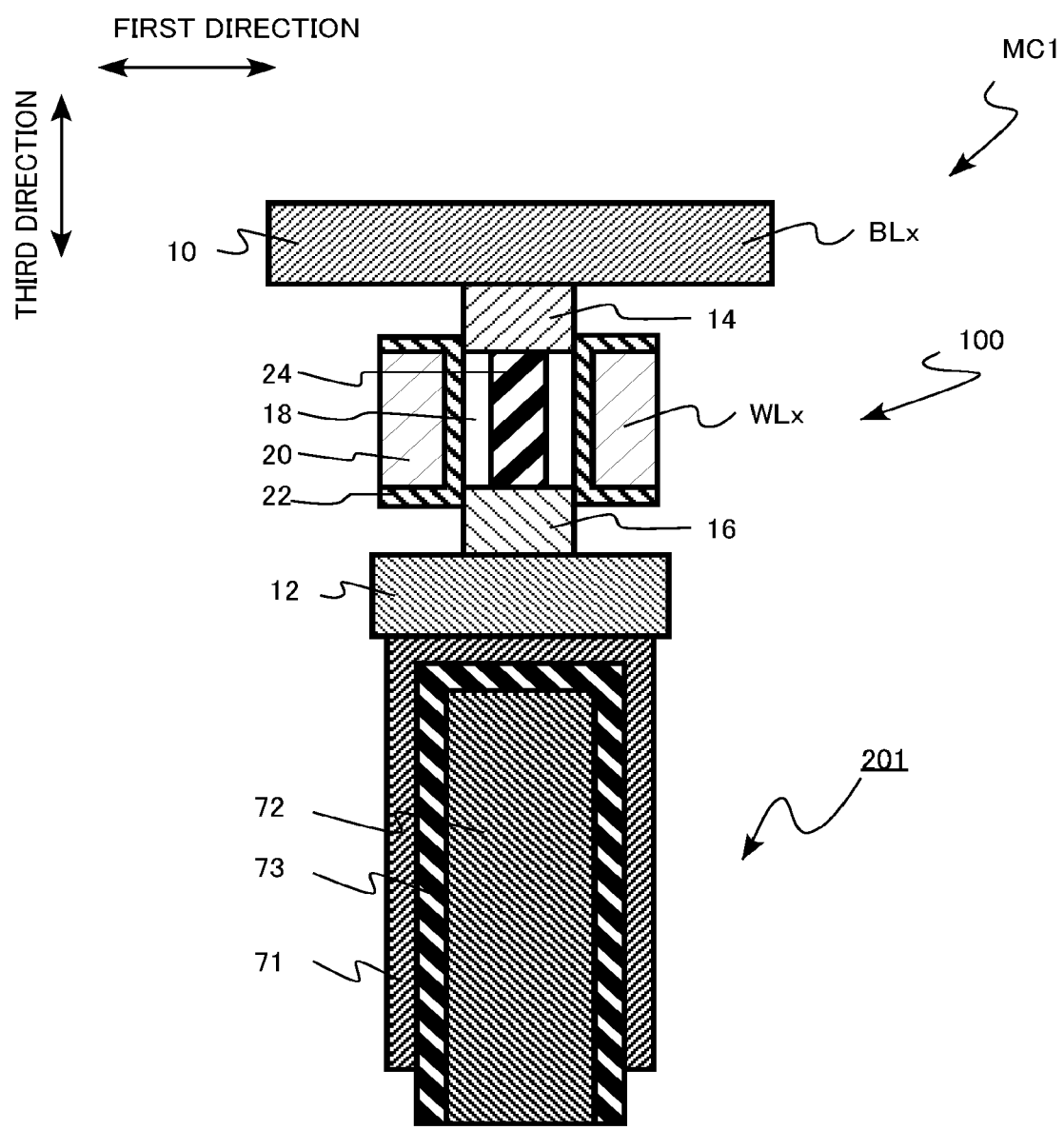
FIG. 59 is a schematic sectional view of a first memory cell of the semiconductor memory device of the fourth embodiment.
Figure 60:
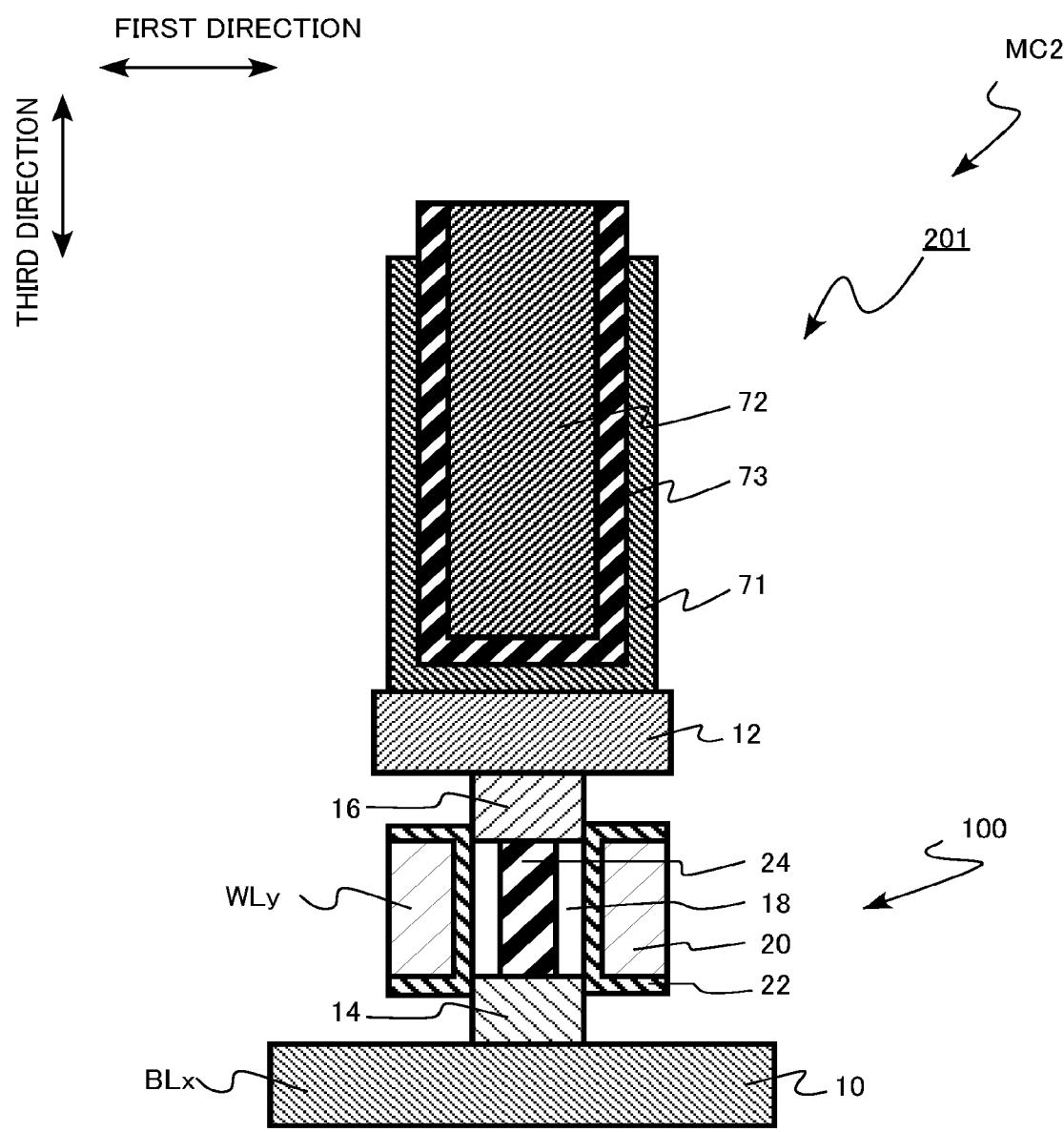
FIG. 60 is a schematic sectional view of a second memory cell of the semiconductor memory device of the fourth embodiment.

FIG. 59 is a schematic sectional view of the first memory cell of the semiconductor memory device of the fourth embodiment. FIG. 60 is a schematic sectional view of the second memory cell of the semiconductor memory device of the fourth embodiment.

The first memory cell MC1 is provided between the silicon substrate 250 and the bit line BLx. The bit line BLx is provided between the silicon substrate 250 and the second memory cell MC2.

The first memory cell MC1 is provided below the bit line BLx. The second memory cell MC2 is provided above the bit line BLx.

The first memory cell MC1 is provided on one side of the bit line BLx. The second memory cell MC2 is provided on the other side of the bit line BLx.

The second memory cell MC2 has a vertically-inverted structure of the first memory cell MC1. Each of the first memory cell MC1 and the second memory cell MC2 includes a transistor 100 and a capacitor 201.

The transistor 100 includes a source electrode 10, a drain electrode 12, a source region 14, a drain region 16, a channel region 18, a gate electrode 20, a gate insulating layer 22, and a core insulating region 24.

The source electrode 10 is one example of the first electrode. The drain electrode 12 is one example of the second electrode. The source region 14 is one example of the first metallic region. The drain region 16 is one example of the second metallic region. The channel region 18 is one example of the semiconductor region. The core insulating region 24 is one example of the insulating region.

The transistor 100 has a configuration similar to that of the transistor 100 of the first embodiment.

The capacitor 201 includes a cell electrode 71, a plate electrode 72, and a capacitor insulating film 73. The cell electrode 71 and the plate electrode 72 are titanium nitride, for example. Meanwhile, the capacitor insulating film 73 has a stacked structure of zirconium oxide, aluminum oxide, and zirconium oxide, for example.

The cell electrode 71 of the capacitor 201 is connected to the drain electrode 12. The plate electrode 72 is connected to the plate electrode line PL.

The source electrode 10 is connected to the bit line BL. The gate electrode 20 is connected to the word line WL.

Note that FIGS. 57 to 60 illustrate a case where the bit line BL and the source electrode 10, as well as the word line WL and the gate electrode 20, are formed of the same material simultaneously, as an example. The bit line BL and the source electrode 10, as well as the word line WL and the gate electrode 20, may be formed of different materials separately from each other.

The gate electrode 20 of the first memory cell MC1 is electrically connected to the word line WLx. Meanwhile, the gate electrode 20 of the second memory cell MC2 is electrically connected to the word line WLy.

According to the fourth embodiment, a semiconductor memory with an improved memory property is achieved by using the transistor 100 of the first embodiment as a switching transistor of a DRAM.

Fifth Embodiment

A semiconductor memory device of a fifth embodiment includes a first wire extending along a first direction, a second wire extending along a second direction crossing the first direction, and a memory cell. The memory cell includes a first electrode electrically connected to the first wire, a second electrode, a first oxide semiconductor region provided between the first electrode and the second electrode, a second oxide semiconductor region provided between the first oxide semiconductor region and the second electrode, a third oxide semiconductor region provided between the first oxide semiconductor region and the second oxide semiconductor region, the third oxide semiconductor region having electrical resistance higher than those of the first oxide semiconductor region and the second oxide semiconductor region, and the third oxide semiconductor region including a first portion and a second portion surrounded by the first portion in which a first distance between the first oxide semiconductor region and the second oxide semiconductor region between which the first portion is sandwiched is smaller than a second distance between the first oxide semiconductor region and the second oxide semiconductor region between which the second portion is sandwiched, a gate electrode surrounding the third oxide semiconductor region, the gate electrode being electrically connected to the second wire, a gate insulating layer provided between the third oxide semiconductor region and the gate electrode, and a capacitor electrically connected to the second electrode. The memory cell includes a capacitor electrically connected to the second electrode of the semiconductor device of the second embodiment. Hereinafter, description that would be a duplication of the description in the second embodiment and the third embodiment will be partly omitted.

The semiconductor memory device of the fifth embodiment is a semiconductor memory. The semiconductor memory device of the fifth embodiment is a DRAM. The semiconductor memory uses the transistor 200 of the second embodiment as a switching transistor of a memory cell of a DRAM. The semiconductor memory device of the fifth embodiment is a semiconductor memory in which the transistor 100 of the semiconductor memory 400 of the fourth embodiment is replaced by the transistor 200 of the second embodiment.

Figure 61:
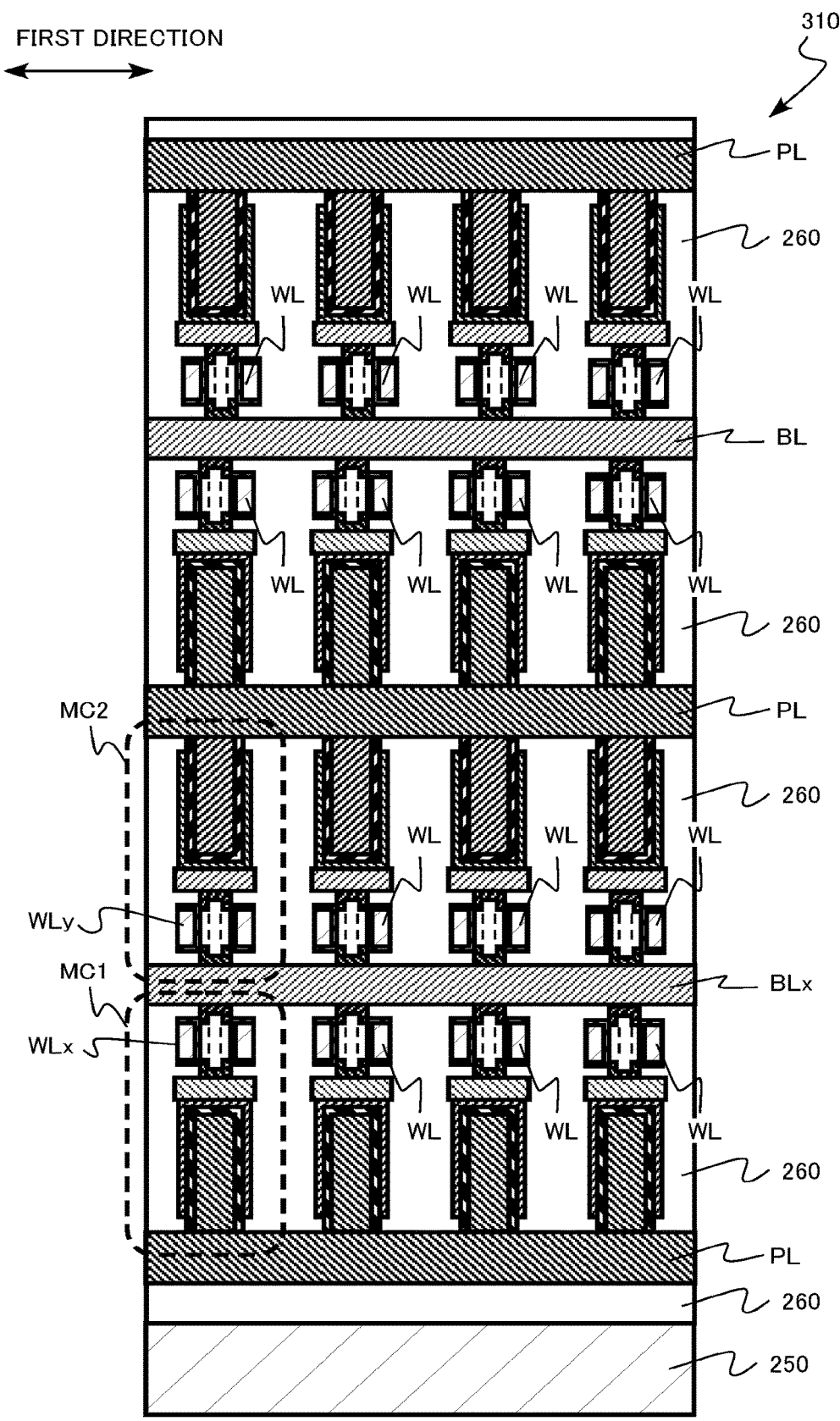
FIG. 61 is a schematic sectional view of a memory cell array of a semiconductor memory device of a fifth embodiment.
Figure 62:
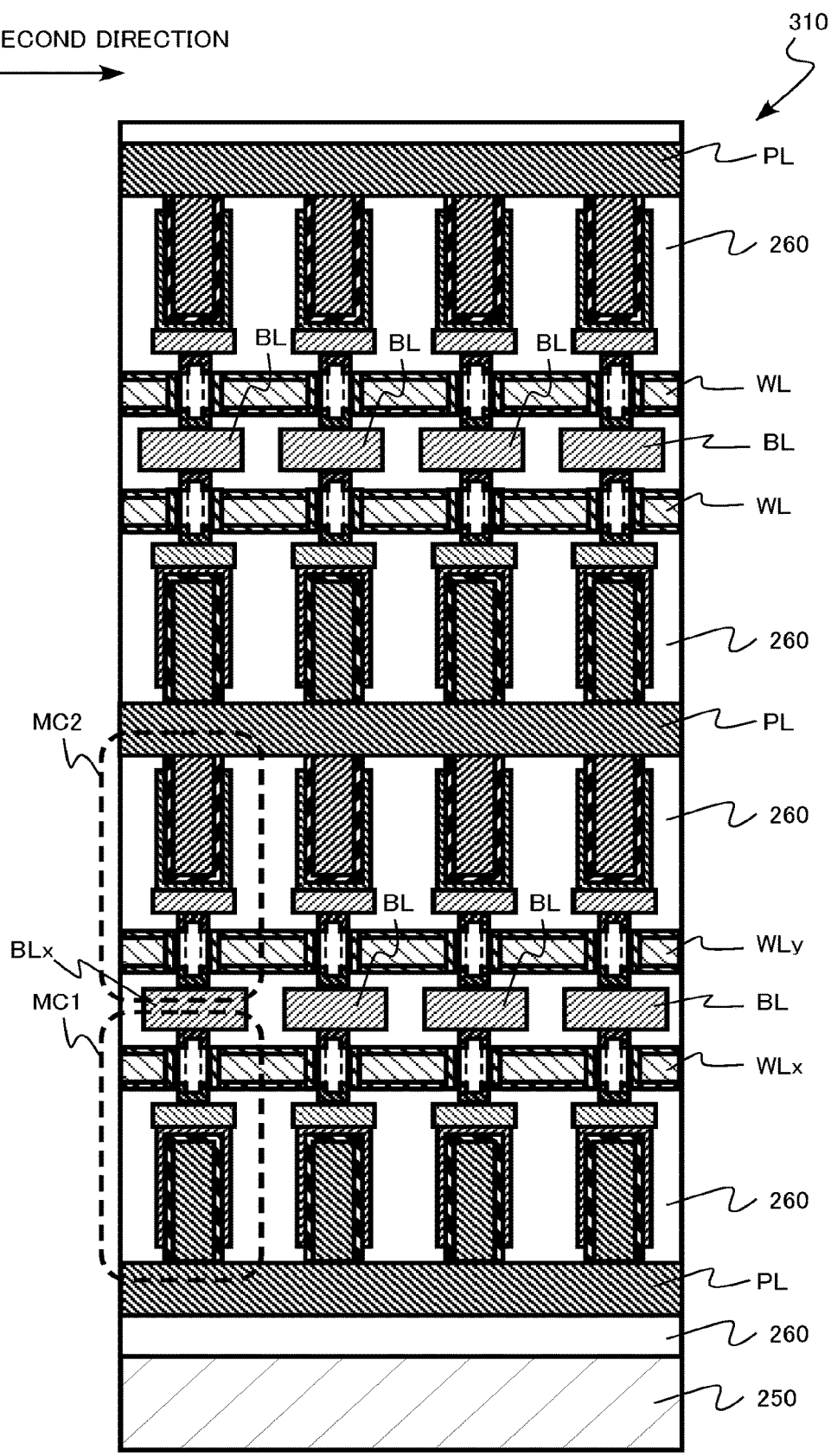
FIG. 62 is a schematic sectional view of the memory cell array of the semiconductor memory device of the fifth embodiment.

FIGS. 61 and 62 are schematic sectional views of a memory cell array of the semiconductor memory device of the fifth embodiment. FIG. 61 is a view of a sectional plane including a first direction and a third direction, and FIG. 62 is a view of a sectional plane including a second direction and the third direction. The first direction and the second direction cross each other. The first direction and the second direction are perpendicular to each other, for example. The third direction is perpendicular to the first direction and the second direction. The third direction is perpendicular to a substrate, for example.

A memory cell array 310 of the fifth embodiment includes a three-dimensional structure in which memory cells are three-dimensionally disposed. Each of the areas surrounded by broken lines in FIGS. 61 and 62 represents one memory cell.

Figure 63:
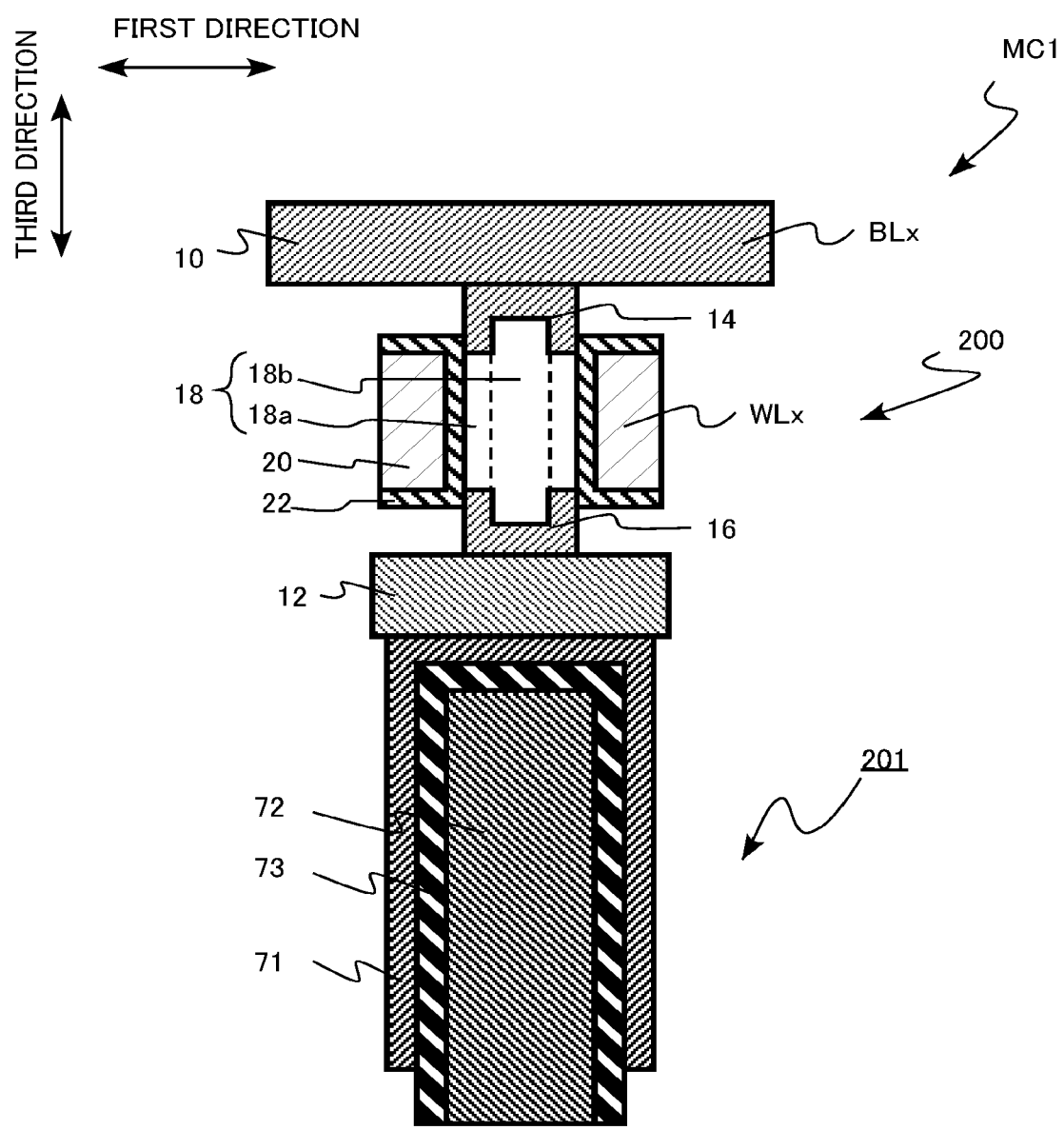
FIG. 63 is a schematic sectional view of a first memory cell of the semiconductor memory device of the fifth embodiment.
Figure 64:
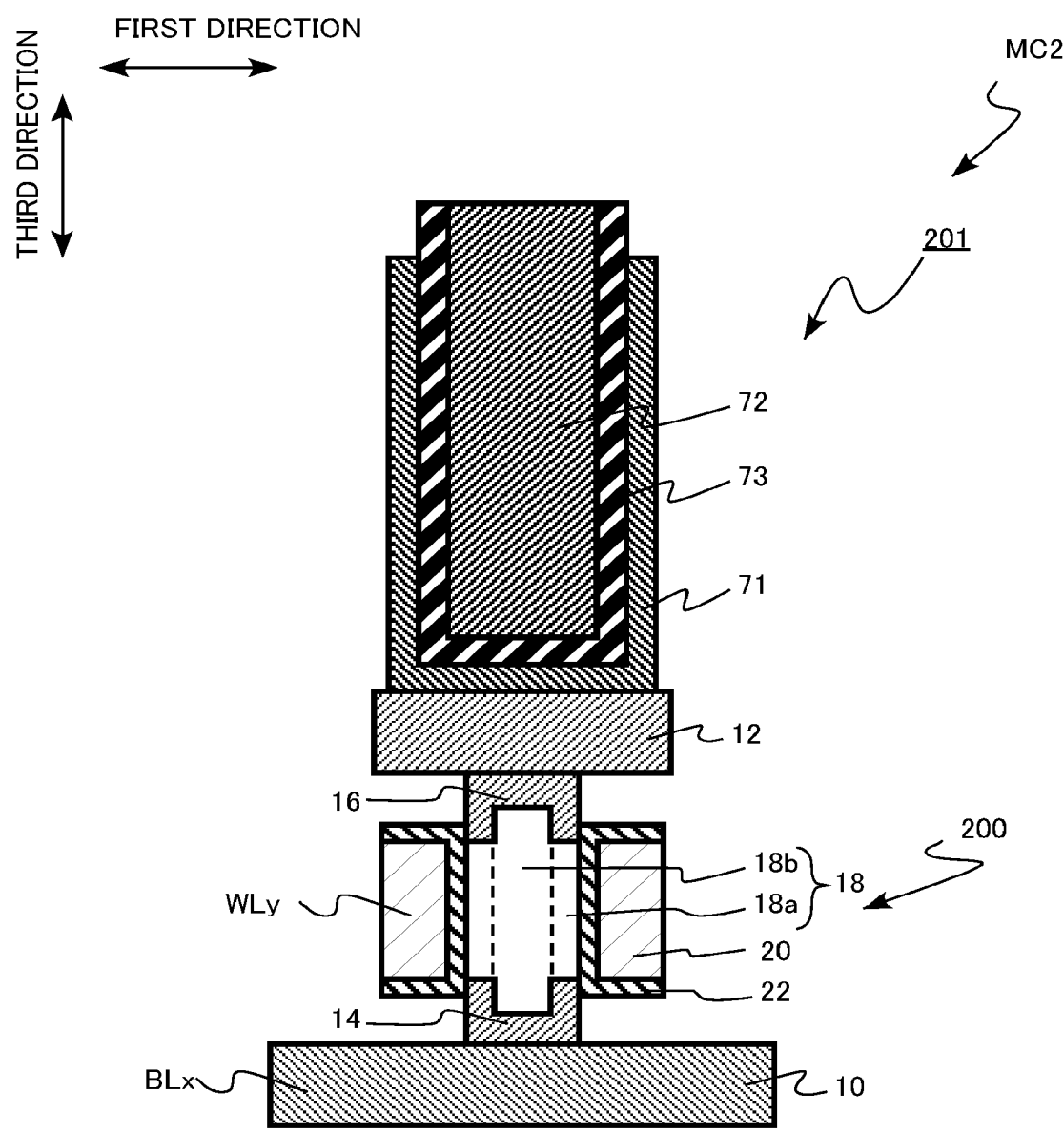
FIG. 64 is a schematic sectional view of a second memory cell of the semiconductor memory device of the fifth embodiment.

FIG. 63 is a schematic sectional view of a first memory cell of the semiconductor memory device of the fifth embodiment. FIG. 64 is a schematic sectional view of a second memory cell of the semiconductor memory device of the fifth embodiment.

The first memory cell MC1 is provided between a silicon substrate 250 and a bit line BLx. The bit line BLx is provided between the silicon substrate 250 and the second memory cell MC2.

The first memory cell MC1 is provided below the bit line BLx. The second memory cell MC2 is provided above the bit line BLx.

The first memory cell MC1 is provided on one side of the bit line BLx. The second memory cell MC2 is provided on the other side of the bit line BLx.

The second memory cell MC2 has a vertically-inverted structure of the first memory cell MC1. Each of the first memory cell MC1 and the second memory cell MC2 includes a transistor 200 and a capacitor 201.

The transistor 200 includes a source electrode 10, a drain electrode 12, a source region 14, a drain region 16, a channel region 18, a gate electrode 20, a gate insulating layer 22, a first interlayer insulating layer 26, and a second interlayer insulating layer 28. The channel region 18 includes a surface portion 18a and a core portion 18b.

The source electrode 10 is one example of the first electrode. The drain electrode 12 is one example of the second electrode. The source region 14 is one example of the first oxide semiconductor region. The drain region 16 is one example of the second oxide semiconductor region. The channel region 18 is one example of the third oxide semiconductor region. The surface portion 18a is one example of the first portion. The core portion 18b is one example of the second portion.

The transistor 200 has a configuration similar to that of the transistor 200 of the second embodiment.

The capacitor 201 includes a cell electrode 71, a plate electrode 72, and a capacitor insulating film 73. The cell electrode 71 and the plate electrode 72 are titanium nitride, for example. Meanwhile, the capacitor insulating film 73 has a stacked structure of zirconium oxide, aluminum oxide, and zirconium oxide, for example.

The cell electrode 71 of the capacitor 201 is connected to the drain electrode 12. The plate electrode 72 is connected to a plate electrode line PL.

The source electrode 10 is connected to the bit line BL. The gate electrode 20 is connected to the word line WL.

Note that FIGS. 61 to 64 illustrate a case where the bit line BL and the source electrode 10, as well as the word line WL and the gate electrode 20, are formed of the same material simultaneously, as an example. The bit line BL and the source electrode 10, as well as the word line WL and the gate electrode 20, may be formed of different materials separately from each other.

The gate electrode 20 of the first memory cell MC1 is electrically connected to the word line WLx. Meanwhile, the gate electrode 20 of the second memory cell MC2 is electrically connected to the word line WLy.

According to the fifth embodiment, a semiconductor memory with an improved memory property is achieved by using the transistor 200 of the second embodiment as a switching transistor of a DRAM.

Sixth Embodiment

A semiconductor memory device of a sixth embodiment includes a first wire extending along a first direction, a second wire extending along a second direction crossing the first direction, and a memory cell. The memory cell includes a first electrode electrically connected to the first wire, a second electrode, a ring-shaped first oxide semiconductor region provided between the first electrode and the second electrode, a ring-shaped second oxide semiconductor region provided between the first oxide semiconductor region and the second electrode, a third oxide semiconductor region at least partly provided between the first oxide semiconductor region and the second oxide semiconductor region, the third oxide semiconductor region having electrical resistance higher than those of the first oxide semiconductor region and the second oxide semiconductor region, a gate electrode surrounding the third oxide semiconductor region, a gate insulating layer provided between the third oxide semiconductor region and the gate electrode, a first insulating layer provided between the first electrode and the gate electrode, the first insulating layer including a first dielectric having a dielectric constant higher than that of silicon oxide, a second insulating layer provided between the second electrode and the gate electrode, the second insulating layer including a second dielectric having a dielectric constant higher than that of silicon oxide, and a capacitor electrically connected to the second electrode. The memory cell includes a capacitor electrically connected to the second electrode of the semiconductor device of the third embodiment. Hereinafter, description that would be a duplication of the description in the third embodiment and the fourth embodiment will be partly omitted.

The semiconductor memory device of the sixth embodiment is a semiconductor memory. The semiconductor memory device of the sixth embodiment is a DRAM. The semiconductor memory uses the transistor 300 of the third embodiment as a switching transistor of a memory cell of a DRAM. The semiconductor memory device of the sixth embodiment is a semiconductor memory in which the transistor 100 of the semiconductor memory 400 of the fourth embodiment is replaced by the transistor 300 of the third embodiment.

Figure 65:
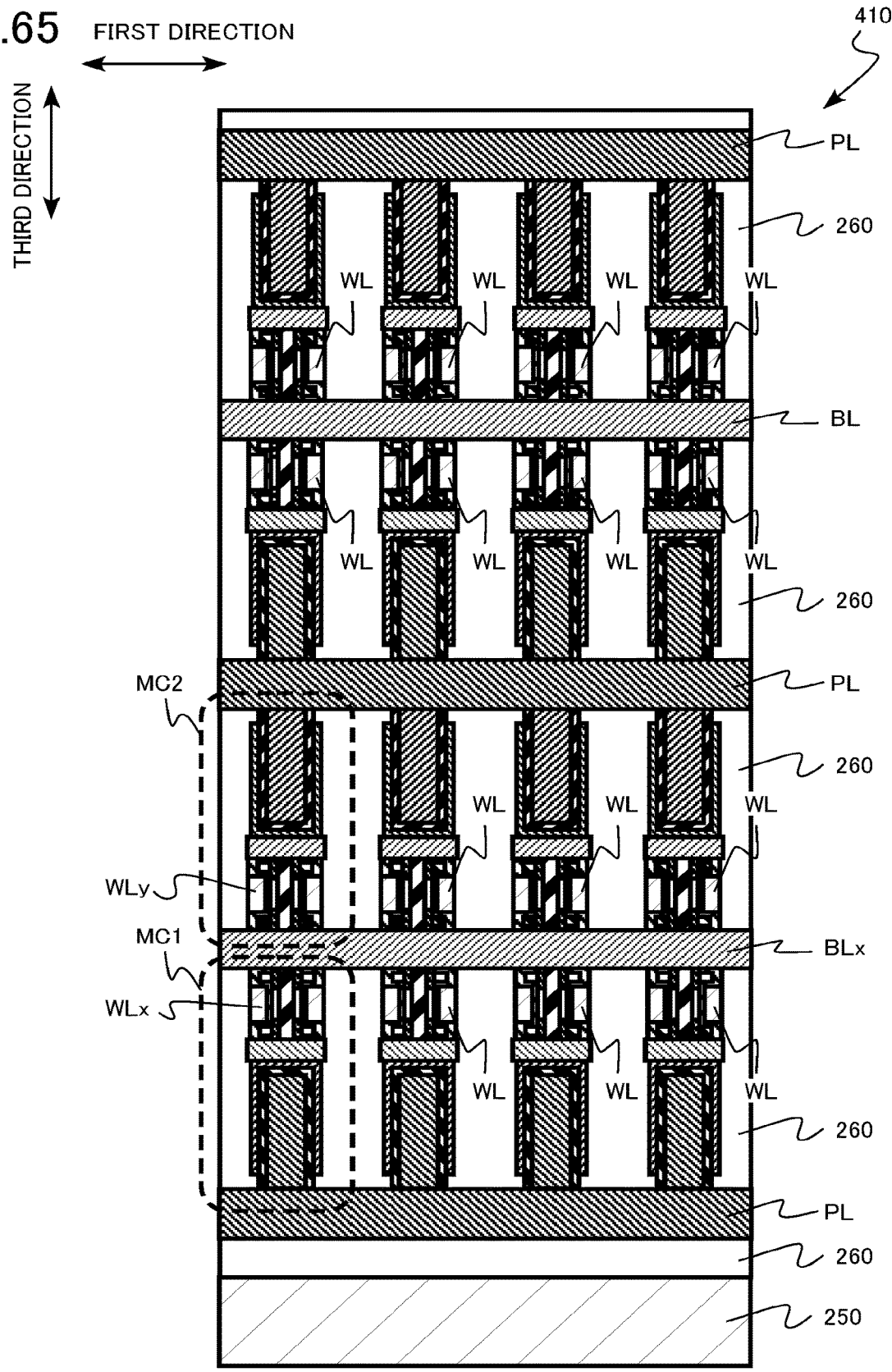
FIG. 65 is a schematic sectional view of a memory cell array of a semiconductor memory device of a sixth embodiment.
Figure 66:
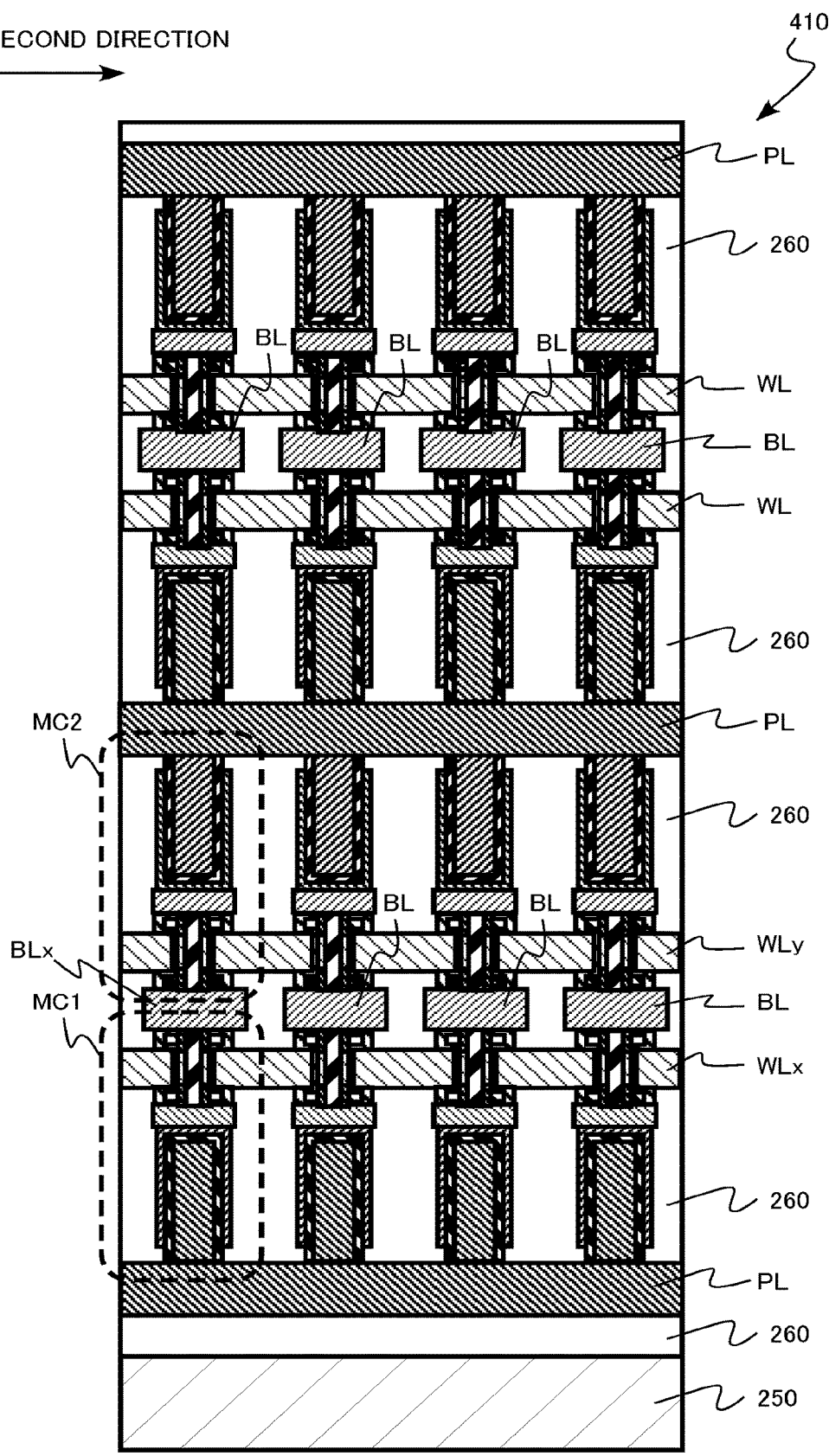
FIG. 66 is a schematic sectional view of the memory cell array of the semiconductor memory device of the sixth embodiment.

FIGS. 65 and 66 are schematic sectional views of a memory cell array of the semiconductor memory device of the sixth embodiment. FIG. 65 is a view of a sectional plane including a first direction and a third direction, and FIG. 66 is a view of a sectional plane including a second direction and the third direction. The first direction and the second direction cross each other. The first direction and the second direction are perpendicular to each other, for example. The third direction is perpendicular to the first direction and the second direction. The third direction is perpendicular to a substrate, for example.

A memory cell array 410 of the sixth embodiment includes a three-dimensional structure in which memory cells are three-dimensionally disposed. Each of the areas surrounded by broken lines in FIGS. 65 and 66 represents one memory cell.

Figure 67:
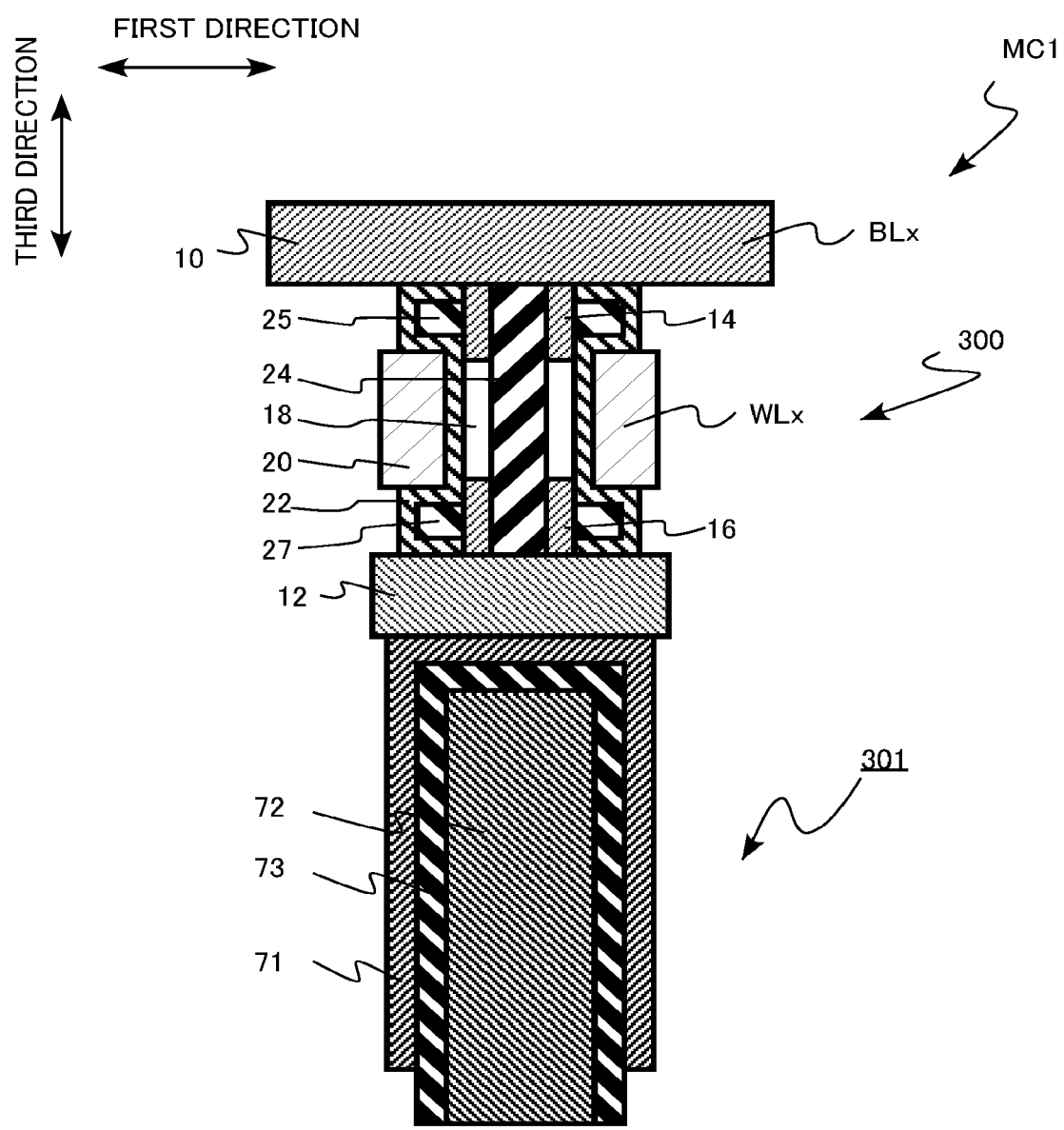
FIG. 67 is a schematic sectional view of a first memory cell of the semiconductor memory device of the sixth embodiment.
Figure 68:
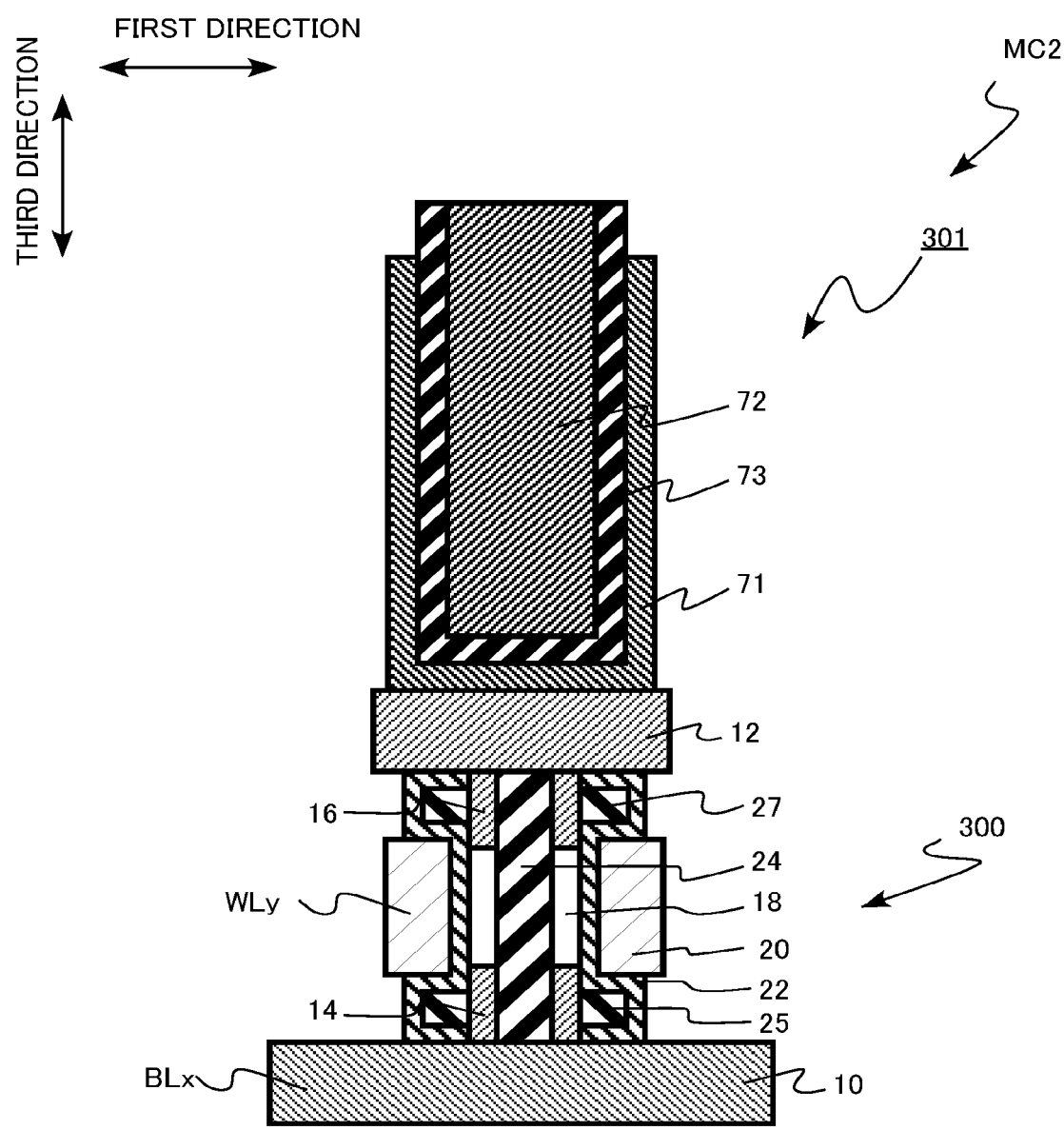
FIG. 68 is a schematic sectional view of a second memory cell of the semiconductor memory device of the sixth embodiment.

FIG. 67 is a schematic sectional view of a first memory cell of the semiconductor memory device of the sixth embodiment. FIG. 68 is a schematic sectional view of a second memory cell of the semiconductor memory device of the sixth embodiment.

The first memory cell MC1 is provided between a silicon substrate 250 and a bit line BLx. The bit line BLx is provided between the silicon substrate 250 and the second memory cell MC2.

The first memory cell MC1 is provided below the bit line BLx. The second memory cell MC2 is provided above the bit line BLx.

The first memory cell MC1 is provided on one side of the bit line BLx. The second memory cell MC2 is provided on the other side of the bit line BLx.

The second memory cell MC2 has a vertically-inverted structure of the first memory cell MC1. Each of the first memory cell MC1 and the second memory cell MC2 includes a transistor 300 and a capacitor 301.

The transistor 300 includes a source electrode 10, a drain electrode 12, a source region 14, a drain region 16, a channel region 18, a gate electrode 20, a gate insulating layer 22, a core insulating region 24, a first high-dielectric-constant insulating layer 25, a second high-dielectric-constant insulating layer 27, a first interlayer insulating layer 26, and a second interlayer insulating layer 28.

The source electrode 10 is one example of the first electrode. The drain electrode 12 is one example of the second electrode. The source region 14 is one example of the first oxide semiconductor region. The drain region 16 is one example of the second oxide semiconductor region. The channel region 18 is one example of the third oxide semiconductor region. The core insulating region 24 is one example of an insulating region. The first high-dielectric-constant insulating layer 25 is one example of the first insulating layer. The second high-dielectric-constant insulating layer 27 is one example of the second insulating layer.

The transistor 300 has a configuration similar to that of the transistor 300 of the third embodiment.

The capacitor 301 includes a cell electrode 71, a plate electrode 72, and a capacitor insulating film 73. The cell electrode 71 and the plate electrode 72 are titanium nitride, for example. Meanwhile, the capacitor insulating film 73 has a stacked structure of zirconium oxide, aluminum oxide, and zirconium oxide, for example.

The cell electrode 71 of the capacitor 301 is connected to the drain electrode 12. The plate electrode 72 is connected to a plate electrode line PL.

The source electrode 10 is connected to the bit line BL. The gate electrode 20 is connected to the word line WL.

Note that FIGS. 65 to 68 illustrate a case where the bit line BL and the source electrode 10, as well as the word line WL and the gate electrode 20, are formed of the same material simultaneously, as an example. The bit line BL and the source electrode 10, as well as the word line WL and the gate electrode 20, may be formed of different materials separately from each other.

The gate electrode 20 of the first memory cell MC1 is electrically connected to the word line WLx. Meanwhile, the gate electrode 20 of the second memory cell MC2 is electrically connected to the word line WLy.

According to the sixth embodiment, a semiconductor memory with an improved memory property is achieved by using the transistor 300 of the third embodiment as a switching transistor of a DRAM.

While certain embodiments have been described, these embodiments have been presented by way of example only, and are not intended to limit the scope of the inventions. Indeed, the semiconductor device and the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first electrode;
   a second electrode;
   a first metallic region provided between the first electrode and the second electrode, the first metallic region including at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn);
   a second metallic region provided between the first metallic region and the second electrode, the second metallic region including the at least one metallic element;
   a semiconductor region provided between the first metallic region and the second metallic region, the semiconductor region including the at least one metallic element and oxygen (O);
   an insulating region provided between the first metallic region and the second metallic region, the insulating region being surrounded by the semiconductor region;
   a gate electrode surrounding the semiconductor region; and
   a gate insulating layer provided between the semiconductor region and the gate electrode.

2. The semiconductor device according to claim 1, wherein the insulating region and the first electrode are spaced apart from each other, and the insulating region and the second electrode are spaced apart from each other.

3. The semiconductor device according to claim 1, wherein a distance between the first metallic region and the second metallic region is smaller than a length of the gate electrode along a direction toward the second electrode from the first electrode.

4. The semiconductor device according to claim 1, wherein a distance between the first metallic region and the second metallic region is larger than a length of the gate electrode along a direction toward the second electrode from the first electrode.

5. The semiconductor device according to claim 1, wherein the at least one metallic element includes indium (In), gallium (Ga), and zinc (Zn).

6. A semiconductor device comprising:
a first electrode;
a second electrode;
a first oxide semiconductor region provided between the first electrode and the second electrode;
a second oxide semiconductor region provided between the first oxide semiconductor region and the second electrode;
a third oxide semiconductor region provided between the first oxide semiconductor region and the second oxide semiconductor region, the third oxide semiconductor region having electrical resistance higher than electrical resistances of the first oxide semiconductor region and the second oxide semiconductor region, and the third oxide semiconductor region including a first portion and a second portion surrounded by the first portion, a first distance between the first oxide semiconductor region and the second oxide semiconductor region between which the first portion is sandwiched is smaller than a second distance between the first oxide semiconductor region and the second oxide semiconductor region between which the second portion is sandwiched;
a gate electrode surrounding the third oxide semiconductor region; and
a gate insulating layer provided between the third oxide semiconductor region and the gate electrode.

7. The semiconductor device according to claim 6, wherein the third oxide semiconductor region and the first electrode are spaced apart from each other, and the third oxide semiconductor region and the second electrode are spaced apart from each other.

8. The semiconductor device according to claim 6, wherein the second distance is equal to or larger than 1.2 times the first distance.

9. The semiconductor device according to claim 6, wherein the first distance is smaller than a length of the gate electrode along a direction toward the second electrode from the first electrode.

10. The semiconductor device according to claim 6, wherein the second distance is larger than a length of the gate electrode along a direction toward the second electrode from the first electrode.

11. The semiconductor device according to claim 6, wherein the first oxide semiconductor region and the second oxide semiconductor region include at least one predetermined element selected from the group consisting of indium (In), silicon (Si), and tin (Sn).

12. The semiconductor device according to claim 6, wherein the first oxide semiconductor region, the second oxide semiconductor region, and the third semiconductor region include indium (In), gallium (Ga), and zinc (Zn).

13. A semiconductor device comprising:
a first electrode;
a second electrode;
a ring-shaped first oxide semiconductor region provided between the first electrode and the second electrode;
a ring-shaped second oxide semiconductor region provided between the first oxide semiconductor region and the second electrode;
a third oxide semiconductor region, at least a part of the third oxide semiconductor region provided between the first oxide semiconductor region and the second oxide semiconductor region, the third oxide semiconductor region having electrical resistance higher than electrical resistances of the first oxide semiconductor region and the second oxide semiconductor region;
a gate electrode surrounding the third oxide semiconductor region;
a gate insulating layer provided between the third oxide semiconductor region and the gate electrode;
a first insulating layer provided between the first electrode and the gate electrode, the first insulating layer including a first dielectric having a dielectric constant higher than a dielectric constant of silicon oxide; and
a second insulating layer provided between the second electrode and the gate electrode, the second insulating layer including a second dielectric having a dielectric constant higher than the dielectric constant of silicon oxide.

14. The semiconductor device according to claim 13, further comprising an insulating region provided between the first electrode and the second electrode, the insulating region being surrounded by the first oxide semiconductor region, the second oxide semiconductor region, and the third oxide semiconductor region.

15. The semiconductor device according to claim 14, wherein the first oxide semiconductor region is in contact with the insulating region, and the second oxide semiconductor region is in contact with the insulating region.

16. The semiconductor device according to claim 13, wherein the gate insulating layer is sandwiched between the gate electrode and the first insulating layer, and the gate insulating layer is sandwiched between the gate electrode and the second insulating layer.

17. The semiconductor device according to claim 13, wherein the first oxide semiconductor region, the second oxide semiconductor region, and the third oxide semiconductor region include indium (In), gallium (Ga), and zinc (Zn).

18. A semiconductor memory device comprising:
a first wire extending along a first direction;
a second wire extending along a second direction crossing the first direction; and
a memory cell, wherein
the memory cell includes:
a first electrode electrically connected to the first wire;
a second electrode;
a first metallic region provided between the first electrode and the second electrode, the first metallic region including at least one metallic element selected from the group consisting of indium (In), gallium (Ga), zinc (Zn), aluminum (Al), magnesium (Mg), manganese (Mn), titanium (Ti), tungsten (W), molybdenum (Mo), and tin (Sn);

a second metallic region provided between the first metallic region and the second electrode, the second metallic region including the at least one metallic element;

a semiconductor region provided between the first metallic region and the second metallic region, the semiconductor region including the at least one metallic element and oxygen (O);

an insulating region provided between the first metallic region and the second metallic region, the insulating region being surrounded by the semiconductor region;

a gate electrode surrounding the semiconductor region, the gate electrode being electrically connected to the second wire;

a gate insulating layer provided between the semiconductor region and the gate electrode; and a capacitor electrically connected to the second electrode.

19. The semiconductor memory device according to claim 18, wherein the insulating region and the first electrode are spaced apart from each other, and the insulating region and the second electrode are spaced apart from each other.

20. The semiconductor memory device according to claim 18, wherein the at least one metallic element includes indium (In), gallium (Ga), and zinc (Zn).

* * * * *